US010717148B2

(12) United States Patent
Nicewonger

(10) Patent No.: US 10,717,148 B2
(45) Date of Patent: Jul. 21, 2020

(54) FLUID TRANSFER OF SUCTION FORCE BETWEEN DRAWBACK APPARATUSES

(71) Applicant: Proteus Industries Inc., Mountain View, CA (US)

(72) Inventor: Mark Nicewonger, Mountain View, CA (US)

(73) Assignee: Proteus Industries Inc., Mountain View, CA (US)

(*) Notice: Subject to any disclaimer, the term of this patent is extended or adjusted under 35 U.S.C. 154(b) by 654 days.

(21) Appl. No.: 15/480,307

(22) Filed: Apr. 5, 2017

(65) Prior Publication Data

US 2017/0203382 A1 Jul. 20, 2017

Related U.S. Application Data

(63) Continuation of application No. 14/849,247, filed on Sep. 9, 2015, now Pat. No. 10,307,857, and a
(Continued)

(51) Int. Cl.
*B23K 11/30* (2006.01)
*F17D 3/01* (2006.01)
(Continued)

(52) U.S. Cl.
CPC ......... *B23K 11/3054* (2013.01); *B23K 11/115* (2013.01); *B23K 11/3018* (2013.01);
(Continued)

(58) Field of Classification Search
CPC . F04B 43/02; F04B 53/14; F15B 3/00; B23K 11/3072; B23K 11/3018;
(Continued)

(56) References Cited

U.S. PATENT DOCUMENTS 2,388,587 A 11/1945 Wilson
2,512,705 A * 6/1950 Anderson .............. B23K 9/285
219/75
(Continued)

FOREIGN PATENT DOCUMENTS

CN 1509218 6/2004
CN 102794555 11/2012
(Continued)

OTHER PUBLICATIONS

International Application No. PCT/US2015/049234, International Search Report and Written Opinion dated Feb. 2, 2016.
(Continued)

*Primary Examiner* — Anatoly Vortman
(74) *Attorney, Agent, or Firm* — Sheppard, Mullin, Richter & Hampton LLP

(57) ABSTRACT

A first electrode coolant path is configured to cool a first welding electrode by liquid coolant flowing from a supply path through the first electrode coolant path to a return path. A second electrode coolant path is configured to cool a second welding electrode by liquid coolant flowing from the supply path through the second electrode coolant path to the return path. Three or more valves are configured to stop or reduce liquid coolant flow through the first or second electrode coolant path and configured to stop or reduce liquid coolant backflow from the return path when the first or second welding electrode is at least partially detached. At least one valve is coupled in the first or second electrode coolant path. A drawback apparatus generates a suction force to draw liquid coolant away from a gap formed when the first or second welding electrode is at least partially detached.

9 Claims, 34 Drawing Sheets

Related U.S. Application Data continuation of application No. 14/849,307, filed on Sep. 9, 2015, now Pat. No. 10,022,815.

(60) Provisional application No. 62/048,168, filed on Sep. 9, 2014.

(51) Int. Cl.
| | |
|---|---|
| *B23K 11/11* | (2006.01) |
| *F16K 23/00* | (2006.01) |
| *F16K 37/00* | (2006.01) |
| *H05K 7/20* | (2006.01) |
| *F04B 43/02* | (2006.01) |
| *F04B 53/14* | (2006.01) |
| *F16K 7/12* | (2006.01) |
| *F16K 31/16* | (2006.01) |
| *F15B 3/00* | (2006.01) |

(52) U.S. Cl.
CPC .......... *B23K 11/3072* (2013.01); *F04B 43/02* (2013.01); *F04B 53/14* (2013.01); *F15B 3/00* (2013.01); *F16K 7/12* (2013.01); *F16K 23/00* (2013.01); *F16K 31/16* (2013.01); *F16K 37/005* (2013.01); *F17D 3/01* (2013.01); *H05K 7/20* (2013.01); *H05K 7/20218* (2013.01); *H05K 7/20272* (2013.01)

(58) Field of Classification Search
CPC ..... B23K 11/3054; B23K 11/115; F16K 7/12; F16K 31/16; F16K 37/005; F16K 23/00; F17D 3/01; H05K 7/20; H05K 7/20218; H05K 7/20272
USPC .......................................................... 361/699
See application file for complete search history.

(56) References Cited

U.S. PATENT DOCUMENTS

| | | | |
|---|---|---|---|
| 2,535,187 A * | 12/1950 | Anderson | H01B 9/001 |
| | | | 174/15.7 |
| 2,980,788 A | 4/1961 | Hunter et al. | |
| 3,435,175 A * | 3/1969 | Shaffer | B23H 1/10 |
| | | | 219/69.14 |
| 3,898,403 A | 8/1975 | Grayson et al. | |
| 4,142,707 A | 3/1979 | Bjorklund | |
| 4,160,152 A * | 7/1979 | Wightman | H05B 3/68 |
| | | | 219/430 |
| 4,393,292 A | 7/1983 | Inoue | |
| 4,597,719 A | 7/1986 | Tano | |
| 4,650,152 A * | 3/1987 | Doutt | B23K 11/3018 |
| | | | 137/466 |
| 5,154,589 A | 10/1992 | Ruhl et al. | |
| 5,182,435 A | 1/1993 | Wang | |
| 5,226,471 A * | 7/1993 | Stefani | H05K 7/20281 |
| | | | 165/103 |
| 5,362,371 A | 11/1994 | Candor | |
| 5,378,868 A | 1/1995 | Burkhardt | |
| 5,719,367 A | 2/1998 | Young | |
| 5,857,661 A | 1/1999 | Amada et al. | |
| 5,950,667 A * | 9/1999 | Nicewonger | B23K 11/36 |
| | | | 137/459 |
| 5,971,296 A | 10/1999 | Fukano et al. | |
| 5,988,524 A | 11/1999 | Odajima et al. | |
| 6,000,629 A | 12/1999 | Tamura et al. | |
| 6,026,682 A | 2/2000 | McCormick | |
| 6,026,838 A * | 2/2000 | Nicewonger | B23K 11/36 |
| | | | 137/2 |
| 6,029,903 A | 2/2000 | Fukano et al. | |
| 6,082,629 A | 7/2000 | Lee et al. | |
| 6,176,438 B1 | 1/2001 | Sato et al. | |
| 6,199,582 B1 | 3/2001 | Matsuzawa et al. | |
| 6,200,100 B1 | 3/2001 | Yang et al. | |
| 6,332,924 B1 | 12/2001 | Shim et al. | |
| 6,348,098 B1 | 2/2002 | McLoughlin et al. | |
| 6,359,249 B1 | 3/2002 | Brown | |
| 6,573,470 B1 | 6/2003 | Brown et al. | |
| 6,612,505 B2 | 9/2003 | Shyu | |
| 6,848,625 B2 | 2/2005 | Takekuma et al. | |
| 6,932,318 B2 | 8/2005 | Igarashi | |
| 7,107,128 B2 | 9/2006 | Laverdiere et al. | |
| 7,143,956 B2 | 12/2006 | Fukano | |
| 7,172,096 B2 | 2/2007 | O'Dougherty | |
| 7,543,596 B2 | 6/2009 | Laverdiere et al. | |
| 7,686,588 B2 | 3/2010 | Okumura | |
| 9,006,610 B2 * | 4/2015 | Hung | B23K 9/167 |
| | | | 219/137.62 |
| 2002/0164512 A1 * | 11/2002 | Grasso | H01M 8/04029 |
| | | | 429/437 |
| 2003/0178504 A1 | 9/2003 | Fukano et al. | |
| 2004/0007686 A1 | 1/2004 | Kingsford et al. | |
| 2004/0195534 A1 | 10/2004 | Ijichi et al. | |
| 2004/0208031 A1 | 10/2004 | Miwa | |
| 2007/0199556 A1 | 8/2007 | Murai et al. | |
| 2010/0038567 A1 | 2/2010 | Inoue | |
| 2010/0230626 A1 | 9/2010 | Inoue | |
| 2011/0114571 A1 | 5/2011 | Cannavino | |
| 2013/0037528 A1 | 2/2013 | Ogake | |
| 2015/0041441 A1 | 2/2015 | Klangos | |
| 2016/0067811 A1 | 3/2016 | Jiang | |
| 2016/0074973 A1 * | 3/2016 | Kachline | B23K 9/323 |
| | | | 219/74 |

FOREIGN PATENT DOCUMENTS

| | | |
|---|---|---|
| DE | 10101787 | 7/2002 |
| EP | 1669154 | 6/2006 |
| WO | 2013007909 | 1/2013 |

OTHER PUBLICATIONS

Emerald Group Publishing Limited, "WeldSaver protects automated welding systems when weld tips are lost," Industrial Robot: An International Journal, vol. 25 Iss. 3, 1998.

European Patent Application No. 15840308.9, Search Report dated May 4, 2018.

\* cited by examiner

FLUID TRANSFER OF SUCTION FORCE BETWEEN DRAWBACK APPARATUSES

CROSS-REFERENCE TO RELATED APPLICATIONS

The present application is a continuation of U.S. patent application Ser. No. 14/849,247, filed Sep. 9, 2015 and entitled "Systems and Methods for Coolant Drawback," and is a continuation of U.S. patent application Ser. No. 14/849,307, filed Sep. 9, 2015 and entitled "Drawback Valve Systems and Methods for Coolant Drawback," both of which claim priority to U.S. Provisional Patent Application Ser. No. 62/048,168, filed Sep. 9, 2014 and entitled "Water Drawback," all of which are hereby incorporated by reference herein.

BACKGROUND

1. Technical Field

The present invention(s) relate generally to liquid cooling systems. More particularly, the invention(s) relate to systems and methods for cooling welding electrodes and reducing coolant loss.

2. Description of Related Art

Resistance welding (e.g., spot welding) machines require cooling systems to operate effectively. Typically, water cooling systems are used to cool the machine, or, more specifically, the welding electrodes. However, the welding electrodes are designed to be removed from the welding machine (e.g., during a failure or for a scheduled maintenance) which can cause substantial liquid spillage. Such spillage may be harmful to the welding equipment, hazardous to operations personnel, and/or potentially dangerous in an environment of high electrical current.

Although current systems may reduce spillage to some degree by simply shutting off liquid flow at the source when a welding electrode is lost or removed, this is not optimal because spillage can still occur from liquid already circulating in the cooling system.

SUMMARY

Some embodiments described herein reduce or eliminate liquid loss (e.g., spillage) in liquid cooling systems which may operate in high electrical current environments. Various embodiments described herein discuss drawback of liquid coolant from fluid paths of the liquid cooling system For example, in some embodiments, the system may drawback liquid coolant from the fluid paths in preparation for a scheduled system maintenance or repair, and/or it may draw back liquid coolant in response to a failure of one or more system components (e.g., welding electrodes).

In some embodiments, a liquid cooling system for cooling welding electrodes is discussed herein. The system may include a first electrode path configured to cool a first welding electrode by liquid coolant circulating through the first electrode path. A second welding electrode may be included for cooperating with the first welding electrode. A first valve element may be configured to stop or reduce flow of liquid coolant through the first electrode path when the first welding electrode at least partially detaches. A first drawback element coupled to the first electrode path may be configured to drawback liquid coolant away from a gap in the first electrode path that is formed when the first welding electrode at least partially detaches. The first drawback element may include at least a piston and a chamber, the piston configured to drawback the liquid coolant away from the gap and into the chamber.

A second electrode path may include the second welding electrode and be configured to cool the second welding electrode by liquid coolant circulating through the second electrode path. A second valve may be configured to stop or reduce flow of the liquid coolant circulating through the second electrode path when the second welding electrode at least partially detaches. A second drawback element may be coupled to the second electrode path and configured to drawback the liquid coolant away from a gap in the second electrode path that is formed when the second welding electrode at least partially detaches.

The liquid coolant circulating through the first electrode path may be supplied from a same coolant source as the liquid coolant circulating through the second electrode path. Likewise, the coolant from both the first and second electrode paths may be returned to a shared coolant return. In other embodiments, the liquid coolant circulating through the first electrode path may be supplied from a different coolant source than the liquid coolant circulating through the second electrode path, and likewise may be returned to a different coolant return.

In some embodiments, a third valve may be configured to stop or reduce backflow of the liquid coolant from the coolant return circulating through the first electrode path when the first welding electrode at least partially detaches. A third drawback element may be coupled to the first electrode path and configured to drawback the liquid coolant away from the gap in the first electrode path. The third drawback element may be configured to drawback the liquid coolant in a different direction away from the gap in the first electrode path than the first drawback element.

In various embodiments, a fourth valve may be configured to stop or reduce flow of the liquid coolant from the coolant return circulating through the second electrode path when the second welding electrode at least partially detaches. A fourth drawback element may be coupled to the second electrode path and configured to drawback the liquid coolant away from the gap in the second electrode path. The fourth drawback element may be configured to drawback the liquid coolant in a different direction away from the gap in the second electrode path than the second drawback element.

The third drawback element may be disposed at an opposite side of the gap in the first electrode path relative to the first drawback element. The fourth drawback element may be disposed at an opposite side of the gap in the second electrode path relative to the second drawback element.

An exemplary method may be provided for cooling welding electrodes. The method may include cooling a first welding electrode by circulating liquid coolant through a first electrode path in fluid coupling with the first welding electrode. The flow of liquid coolant through the first liquid path may be reduced or stopped when the first electrode at least partially detaches, and the liquid coolant may be drawn back from a gap in the first electrode path that is formed when the first welding electrode at least partially detaches.

Some embodiments describe cooling a second welding electrode by circulating liquid coolant through a second electrode path in fluid coupling with the second welding electrode, stopping or reducing flow of the liquid coolant through the second liquid path when the second electrode at least partially detaches, and drawing back the liquid coolant from a gap in the second electrode path that is formed when the second welding electrode at least partially detaches.

The method may include supplying the liquid coolant circulating in the first electrode path from a same source as the liquid coolant circulating in the second electrode path, and likewise returning coolant from both paths to a common coolant return. In various embodiments, the method may include supplying the liquid coolant circulating in the first electrode path with a different source as the liquid coolant circulating in the second electrode path, and likewise returning coolant to different coolant returns. The method may include drawing back the liquid coolant in a different direction away from the gap in the first electrode path.

DETAILED DESCRIPTION

Figure 1:
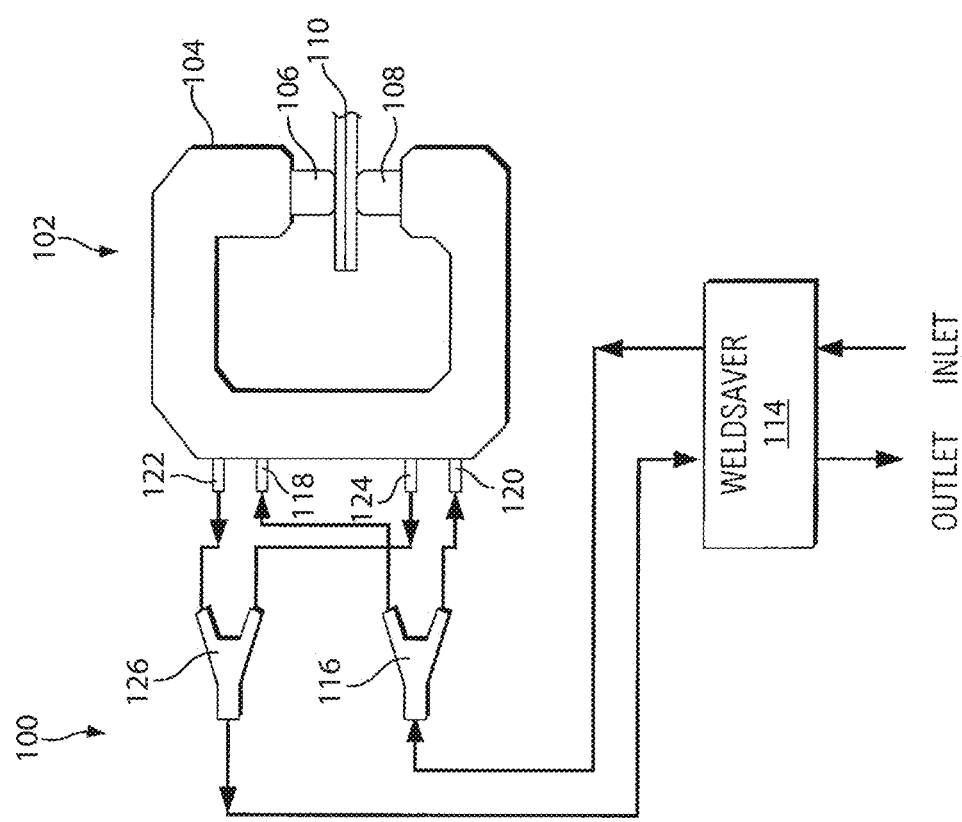
FIG. 1 is a diagram of a fluid flow system for cooling one or more components of a welding machine according to some embodiments.

FIG. 1 is a diagram of a fluid flow system 100 for cooling one or more components of a welding machine according to some embodiments. The system 100 is illustrated as being a resistance welding system, although embodiments described herein are not limited to any particular system or application. At least some of the embodiments described herein may be advantageously utilized in any fluid flow system in which it is desired to liquid cool component(s) and/or drawback fluid from one or more flow paths (or "passageways").

The system 100 includes a resistance welding machine 102 having a hollow frame 104 which supports two vertically opposed welding electrodes 106 and 108 made of copper or other suitable material. The electrodes 106 and 108 may also be known as welding tips or caps. In operation, a work piece 110, typically consisting of two or more metal sheets, can be clamped between the electrodes 106 and 108 and an electrical voltage can be applied across the electrodes 106 and 108. This can cause a large electric current to flow from one of the electrodes 106 or 108 to the other through the work piece 110, raising a temperature of the work piece 110 to a level which can result in localized melting and fusion of the individual sheets of the work piece 110 together.

Additionally, the high electric current passing through the electrodes 106 and 108 may cause them to melt if cooling means are not provided. For this reason, cooling fluid flow paths (e.g., paths 212, 214 discussed below) can be provided which can extend from an inlet leading to a source of pressurized cooling fluid (e.g., water or other suitable fluid) through the apparatus 114 to fluid flow passageways in the frame 104. Fluid can flow from the apparatus 114 through an inlet Y-connector 116 to upper and lower fluid inlets 118 and 120 of the frame 104. Fluid can exit the frame 104 through upper and lower outlets 122 and 124 and an outlet Y-connector 126 and flows through the apparatus 114 to a fluid outlet and reservoir. In some embodiments, the apparatus 114 for the measurement and control of cooling fluid can be of the type commercially available from Proteus Industries, Inc. of Mountain View, Calif. under the trade name WELD SAVER™.

It will be noted that the arrangement of FIG. 1, as well as the following figures, are by way of examples and not meant to limit the scope of embodiments described herein. Other typical configurations include, for example, a series connection of upper and lower flow paths, in which case there are no Y-connectors. In addition, other devices such as transformers, power supplies and high current cables which need to be cooled may be inserted into the system 100.

Figure 2A:
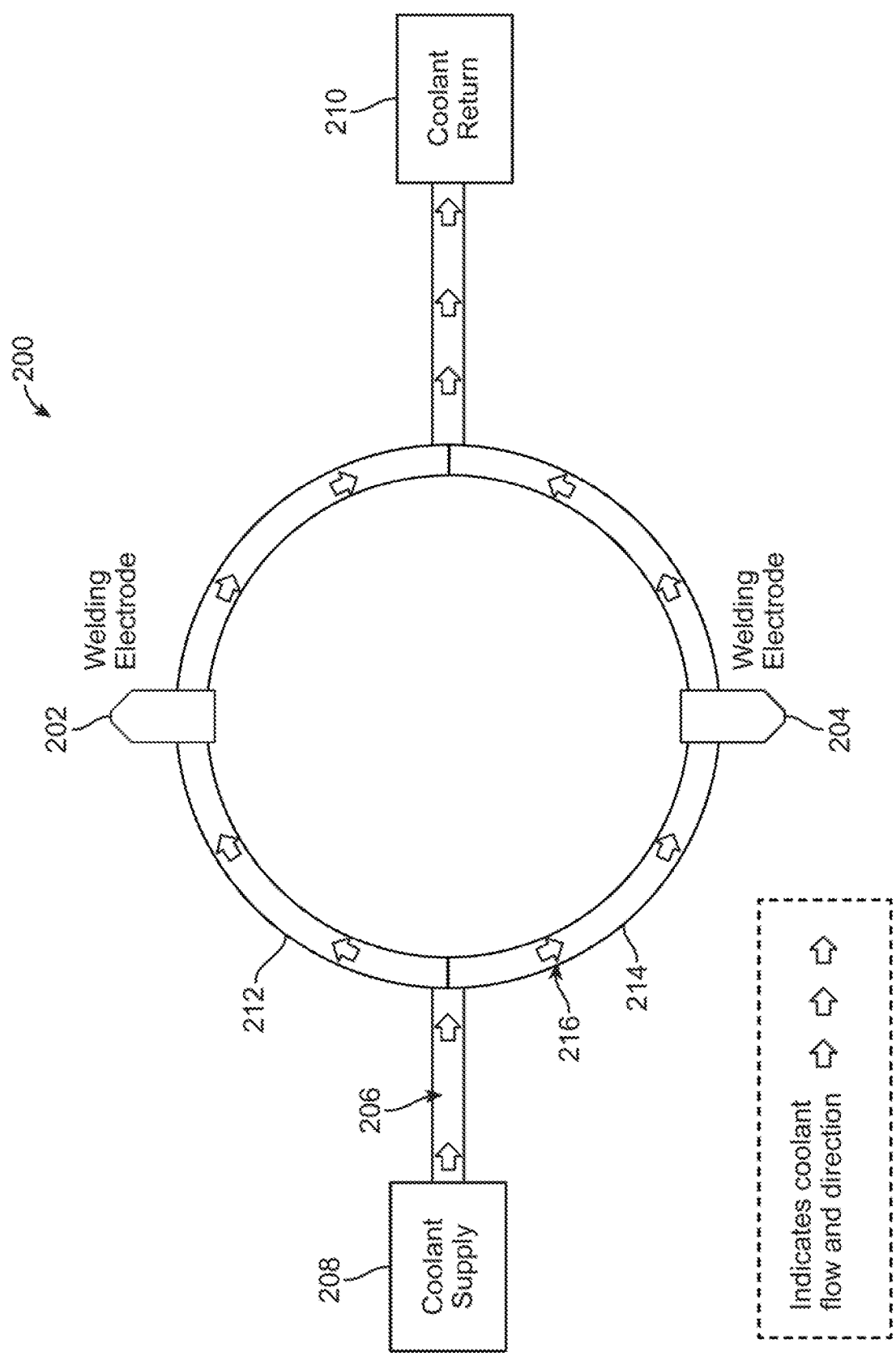
FIG. 2A is a diagram of a fluid flow system for cooling welding electrodes according to some embodiments.

FIG. 2A is a diagram of a fluid flow system 200 for cooling welding electrodes 202, 204 according to some embodiments. Such a system 200 can be used, for example, to cool electrodes of a resistance welding apparatus (e.g., welding machine 102). In the illustrated embodiment, more specifically, liquid coolant 206 (e.g., water) can flow from a supply source 208 (e.g., one or more pumps, reservoirs, etc.) through welding electrodes 202, 204, e.g., of the type described above, via one or more fluid passageways. In the illustrated embodiment, the passageways form a loop which can be logically divided into fluid paths 212, 214. The liquid coolant 206 can be returned to the coolant source 208 or otherwise discharged via coolant return 210.

As shown, liquid coolant 206 can flow through paths 212, 214, as indicated by arrows 216, thereby cooling the electrodes 202, 204, e.g., to a temperature at which the electrodes 202, 204 will not melt or their function be otherwise damaged by heat. Although two electrodes 202, 204 and two corresponding fluid paths 212, 214 are shown here, other embodiments may have a greater or lesser number of such electrodes and/or fluid paths. In some embodiments, the paths 212, 214 may comprise flexible and/or rigid tubing.

The illustrated electrodes 202, 204 may be detachably connected, e.g., to the frame 104, by a press fitting or the like. One or both electrodes may detach from the welding machine. An electrode can detach for a variety of reasons, such as scheduled maintenance, damage to the electrode, or fusion of one or more of the electrodes to the work in progress. The latter may be especially prevalent when welding galvanized parts.

If either electrode 202, 204 detaches, a large quantity of fluid 206 may spurt out of the fluid paths 212, 214 (unless one or more embodiments as described herein are implemented). For example, if either electrode 202, 204 detaches, fluid 206 may spray out of the resulting gap due to supply pressure, back pressure and/or gravity in the paths 212, 214. Spillage of fluid 206, especially in an environment of high electrical current, as mentioned above, may be unsafe, wasteful, and may impact the work environment or damage equipment. Various embodiments described herein may reduce or eliminate fluid leakage.

Figure 2B:
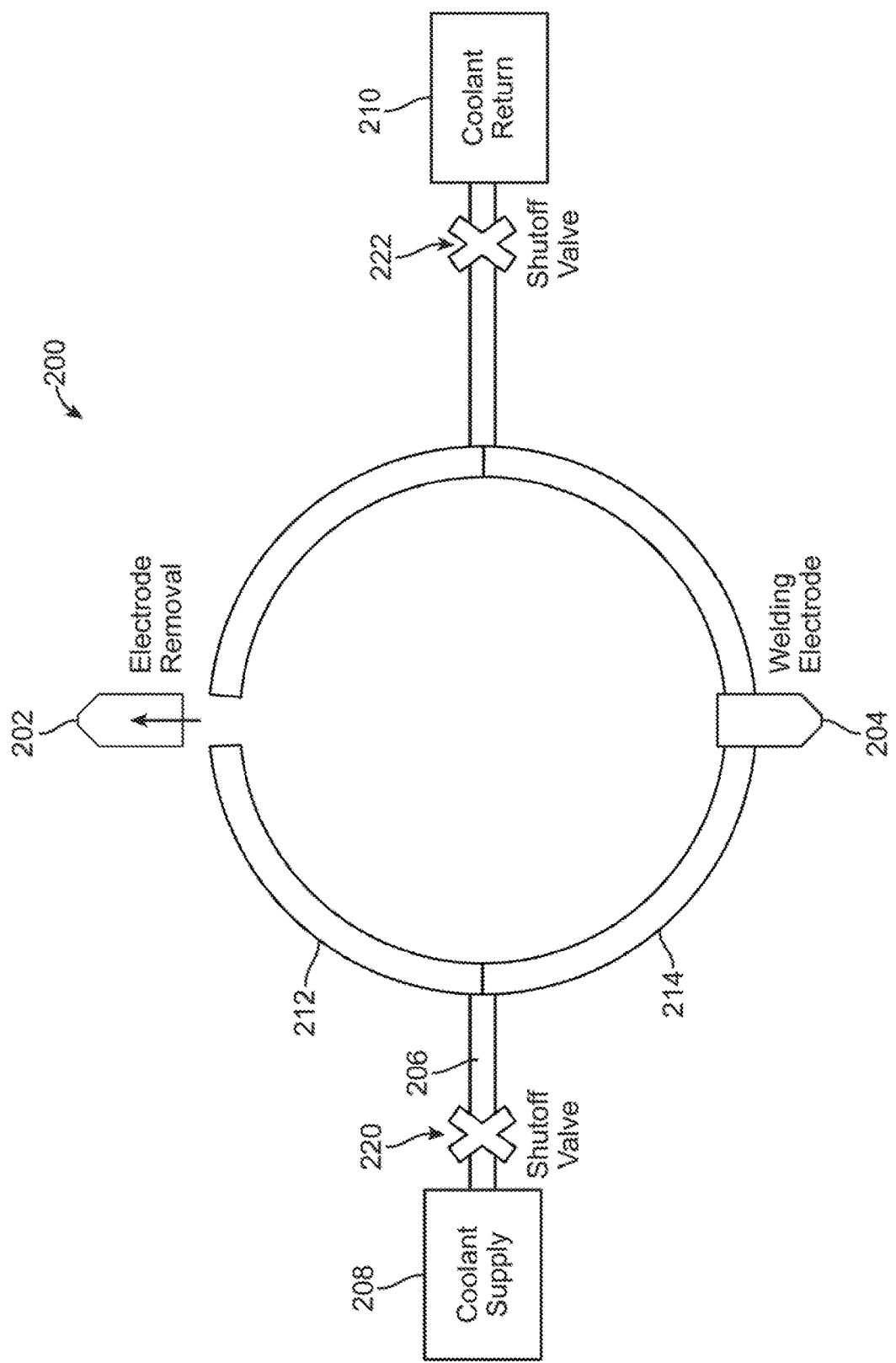
FIG. 2B is a diagram illustrating fluid shutoff valves for the fluid flow system according to some embodiments.

FIG. 2B is a diagram illustrating fluid shutoff valves 220, 222 for the fluid flow system 200 according to some embodiments. In some embodiments, flow of coolant 206 may be reduced or stopped, either in anticipation of electrode 202, 204 detachment, e.g., for maintenance, or in response to an unintentional detachment of an electrode 202, 204, e.g., during a failure. More specifically, shutoff valve 220 can be used to reduce or stop coolant flow from the supply 208, and shutoff valve 222 can be used to prevent backflow from the return 210. For example, valve 220 can be a solenoid or pneumatically actuated valve, and the valve 222 can be a non-return check valve, although in other embodiments it may be otherwise.

Figure 2C:
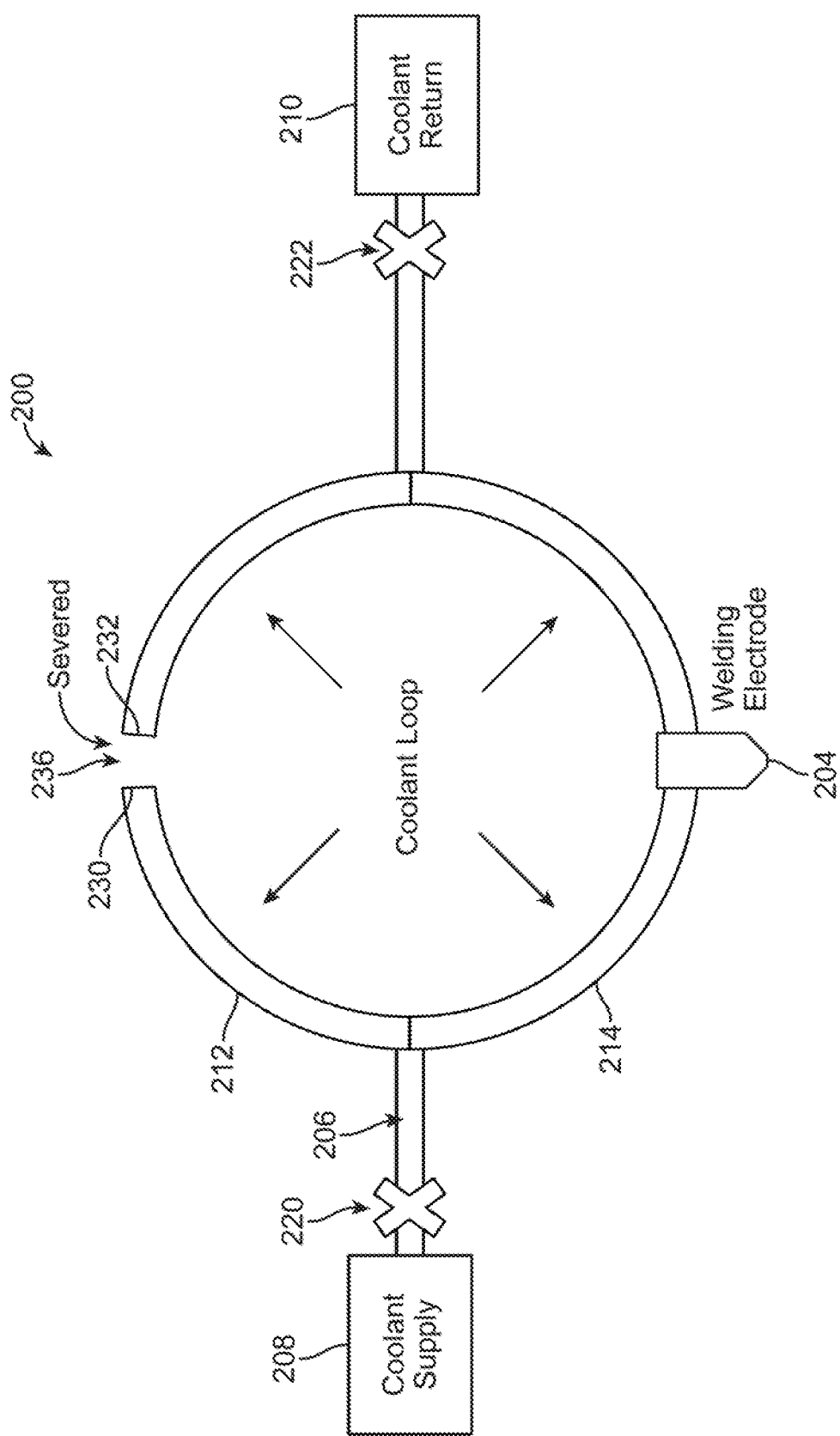
FIG. 2C is a diagram illustrating detachment of a welding electrode in conjunction with the fluid shutoff of the fluid flow system according to some embodiments.

FIG. 2C is a diagram illustrating detachment of the welding electrode 202 in conjunction with the fluid shutoff of the fluid flow system 200 according to some embodiments. Detachment of electrode 202 in conjunction with shutoff of the coolant supply 208 and return 210 can create a severed loop, open at two ends 230, 232, and filled with coolant 206. With both ends 230, 232 open to atmosphere, a gap 236 is formed and coolant 206 may readily escape.

In some embodiments, upon detachment of a welding electrode, e.g., welding electrode 202, the shut off valves 220 and/or 222 may be actuated thereby shutting off flow of fluid through fluid pathways 212 and 214. By shutting off the flow of fluid, fluid loss caused by the detached welding electrode 202 may be reduced.

It will be appreciated that the shut off values 220 and/or 222 may detect detachment or be commanded to actuate in any number of ways. For example, the shut off valves 220 and/or 222 may shut off fluid flow upon detection of a change in pressure or other fluid flow conditions. In another example, the shut off valves 220 and/or 222 may be in communication with a sensor that detects if the welding electrode 202 becomes detached, e.g., through electrical communication with the welding electrode 202. The sensor may send commands to one or both shut off valves 220 and 222 to shut off flow of fluid. In a further example, the shut off valves 220 and 222 may be commanded to shut off the flow of fluid by a robotic automation system or worker at the fluid flow system 200, e.g., electronically in a manner similar to the sensor or mechanically. In yet another example, the shut off valves 220 and/or 222 may shut off if the flow of fluid stops in either fluid pathway 212 or 214.

Figure 3A:
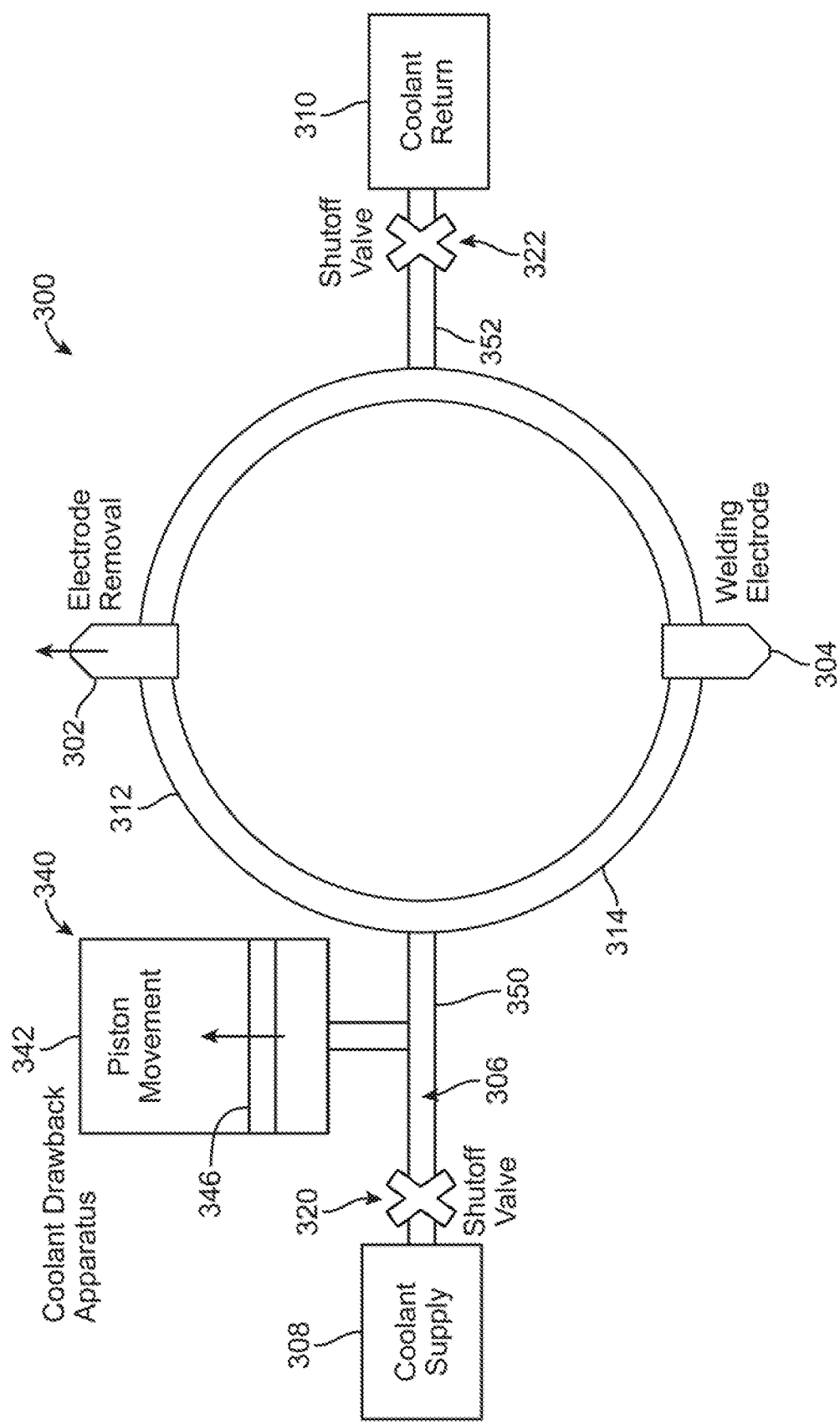
FIG. 3A is a diagram of a fluid flow system for cooling welding electrodes including a fluid drawback apparatus according to some embodiments.

FIG. 3A is a diagram of a fluid flow system 300 for cooling welding electrodes 302, 304 including a fluid drawback apparatus 340 according to some embodiments. As shown, the system 300 includes welding electrodes 302 and 304, coolant supply 308, fluid passageway 312, 314, coolant return 310, shutoff valves 320, 322 and drawback apparatus 340. It will be appreciated that the features of system 300 may be the same or different from the corresponding features discussed herein (e.g., welding electrodes 202, 204, shutoff valves 220, 222, welding electrodes 502, 504, and the like).

The illustrated drawback apparatus 340 includes a drawback chamber (e.g., a cylinder) 342 and a drawback piston 346 disposed therein. Movement of the piston 346 can create a suction force that may draw coolant 306 from the passageway 312, 314 into the cylinder 342 when, for example, either electrode 302 or 304 is at least partially detached. Further description of the drawback apparatus 340 in various configurations can be found below. It will be appreciated that the drawback apparatus 340 may be coupled to the supply line 350 as illustrated, or to the return line 352.

In one example, the drawback apparatus 340 may draw coolant 306 from passageway 312 and/or 314 if electrode 302 and/or electrode 304 are detached. The drawback of the coolant 306 by the drawback apparatus 340 may draw the fluid 306 away from any breaks or gaps in the passageway 312 and/or 314. In some embodiments, the drawback apparatus 340 may draw fluid, e.g., coolant 306, at the same time or approximately when the shutoff valves 320 and/or 322 shut off fluid flow. For example, the drawback apparatus 340 may create a suction for drawing back coolant 306 immediately preceding the removal of either electrode 302, 304 for routine or scheduled maintenance.

Figure 3B:
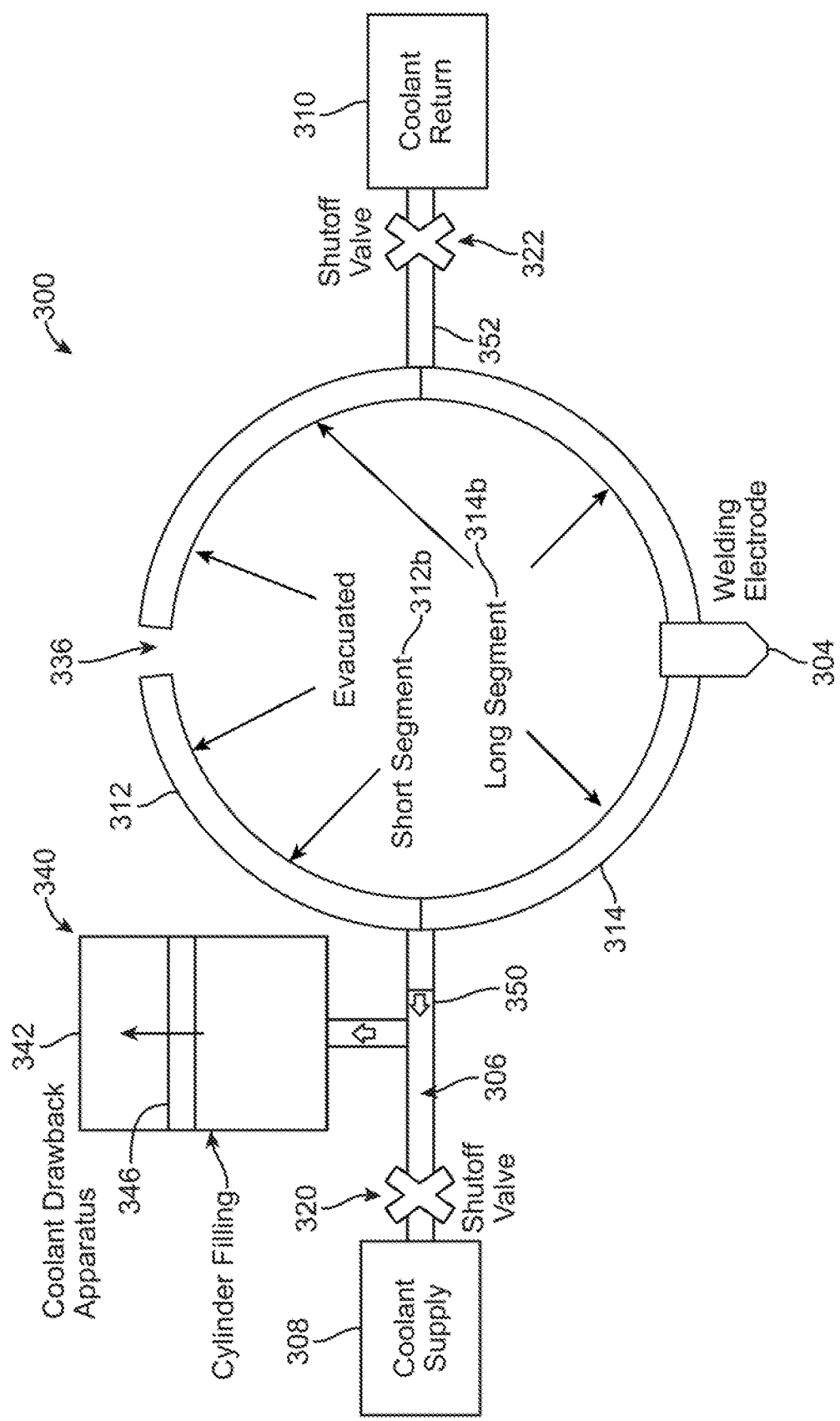
FIG. 3B is a diagram of the fluid drawback apparatus evacuating (or "drawing back") fluid according to some embodiments.

FIG. 3B is a diagram of the fluid drawback apparatus 340 evacuating (or "drawing back") coolant 306 according to some embodiments. The drawback apparatus 340 can be employed to drawback coolant 306 from the fluid passageway 312 to prevent or reduce coolant 306 escape from a gap 336 that is formed when the welding electrode 302 detaches (see FIG. 3A). The gap 336 can be an air gap, or other vent to atmosphere. Although the electrode 302 is shown fully detached, it will be appreciated that the drawback apparatus 340 can be employed when any gap is formed, e.g., when the electrode 302 partially detaches or when the pathways 312 and/or 314 are broken.

As shown, the drawback apparatus 340 is placed on fluid supply line (or "path" or "segment") 350 in order to intersect the passageway at a point which divides the passageway 312 into a short segment 312b on one side of the gap 336 and the passageway 314 plus a part of the passageway 312 into a long segment 314b on the opposite side of the gap 336. It will be appreciated that "segments" can also be referred to as "paths."

In other embodiments, the drawback apparatus 340 can be placed on fluid return line (or "path" or "segment") 352 in addition to, or instead of, on the supply line 350. In the illustrated embodiment, the drawback apparatus 340 can have a liquid volume capacity sufficient to evacuate all of the coolant 206 from the passageways(s) 312, 314. For example, the volume capacity can be 250 cc. Drawing back the coolant 306 by the coolant drawback apparatus 340 draws coolant 306 away from the gap 336 thereby preventing or reducing coolant 306 loss. In some embodiments, evacuating the short segment 312b can create a vent to atmosphere on the long segment 314b, thereby preventing or reducing any further coolant 306 removal. In various embodiments, the coolant drawback apparatus 340 draws coolant 306 back after the shut off valves 320 and 322 362 have shut off flow of coolant 306.

Figure 3C:
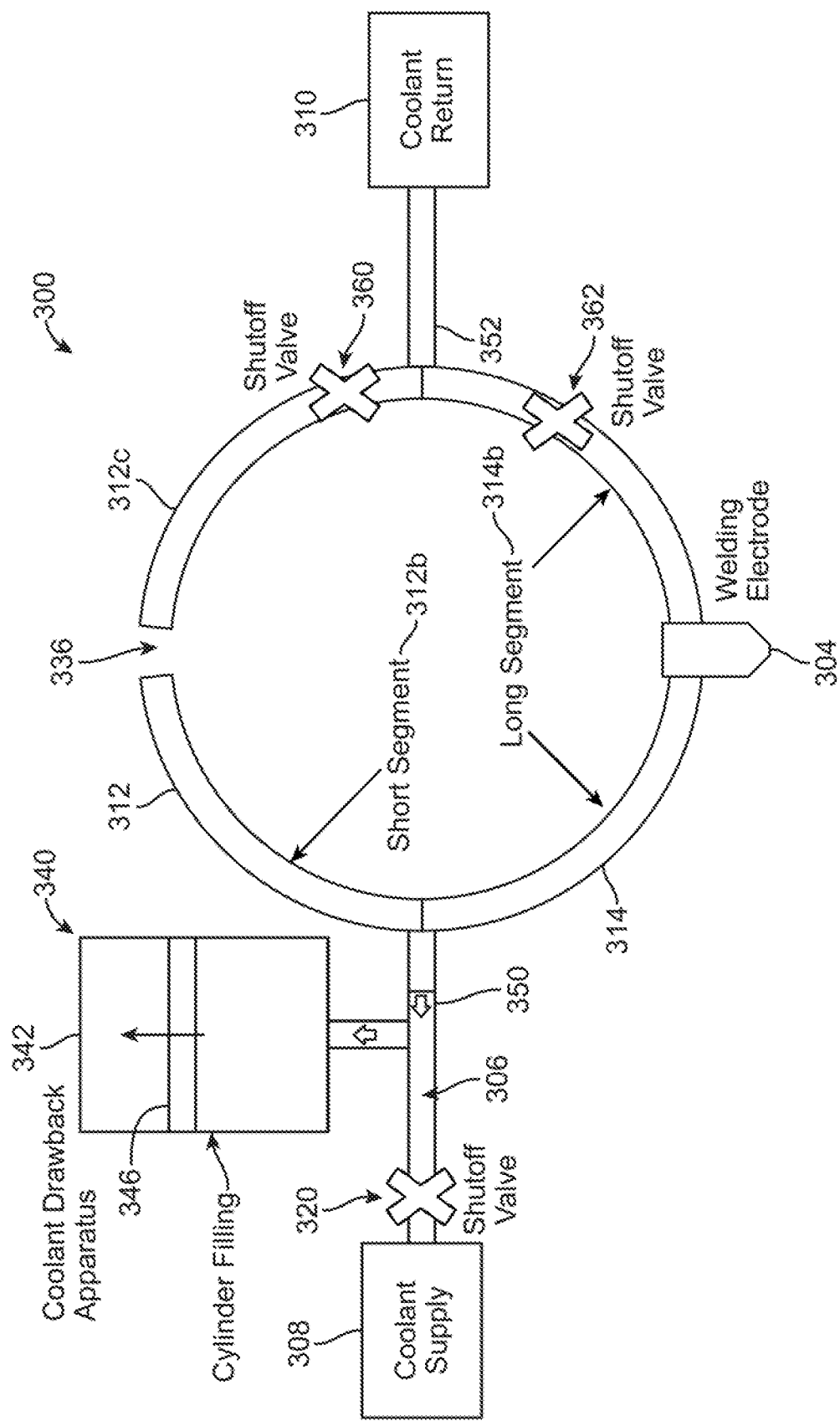
FIG. 3C is a diagram of the fluid flow system including the fluid drawback apparatus and additional shutoff valve(s) positioned along the fluid passageway(s) according to some embodiments.

In some embodiments, as illustrated in FIG. 3C, the system 300 may include one or more additional shutoff valves 360 and/or 362 (e.g., non-return check valves) positioned along the fluid passageways 312, 314. For example, valve 360 may be positioned at an outlet of passageway 312 and valve 362 may be positioned at an outlet of passageway 314. Depending upon their placement and number, valves 360 and/or 362 may eliminate the necessity of valves 320 and/or 322, e.g., as shown by omission of valve 322. The valves 360, 362, may be shut off automatically (e.g., by an actuator, computer, or the like) or manually (e.g., by an operator) at the same or approximately same time as the valves 320, 322. Such a configuration may, for example, reduce and/or prevent liquid spillage from passageways 312, 314 when the electrodes 302, 304 are at least partially detached, by blocking the possible vent to atmosphere on the long segment 314b. This may leave a segment 312c without coolant drawback from the gap 336 when electrode 302 is detached as shown, but, in some embodiments, the typically small geometries of the passageways adjacent to the electrodes may allow for surface tension of the coolant to prevent substantial spillage. It will appreciated that although two additional valves 360, 362 are shown here, in other embodiments, a greater or lesser number of such valves may be used, and/or positioned elsewhere on passageways 312, 314.

Figure 4:
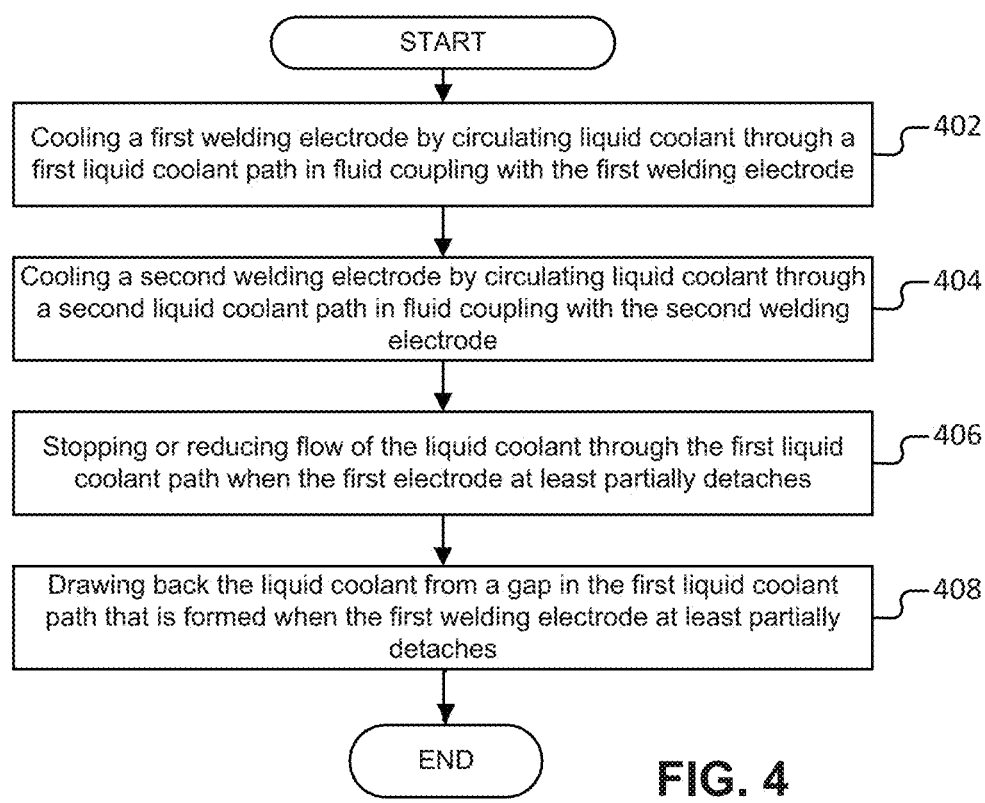
FIG. 4 is a flowchart illustrating an example operation of a fluid drawback apparatus (e.g., as shown is FIGS. 3A and 3B) according to some embodiments.

FIG. 4 is a flowchart illustrating an example operation of a fluid drawback apparatus (e.g., drawback apparatus 340 as shown in FIGS. 3A and 3B) according to some embodiments. It will be appreciated that although the steps 402-408 below are described in a specific order, the steps 402-408 may also be performed in a different order. Each of the steps 402-408 may also be performed sequentially, or serially, and/or in parallel with one or more of the other steps 402-408. For example, step 402 can be performed simultaneously or nearly simultaneously (i.e., in parallel or nearly in parallel) with step 404. In some embodiments, operation of the drawback apparatus may include a greater or lesser number of such steps.

In step 402, a first welding electrode (e.g., welding electrode 302) is cooled by circulating liquid coolant (e.g., coolant 306) through a first liquid coolant path (e.g., path 312) in fluid coupling with the first welding electrode. More specifically, a coolant supply (e.g., supply 308) may supply liquid coolant to the first liquid coolant path via a supply line (e.g., supply line 350). Since the first welding electrode is included in the first coolant path, the first electrode is cooled by the circulating liquid.

In step 404, a second welding electrode (e.g., welding electrode 304) is cooled by circulating liquid coolant (e.g., liquid coolant 306) through a second liquid coolant path (e.g., path 314) in fluid coupling with the second welding electrode. More specifically, a coolant supply (e.g., supply 308) can supply liquid coolant to the second liquid coolant path via a supply line (e.g., supply line 350). Since the second welding electrode is included in the second coolant path, the second electrode is cooled by the circulating liquid.

Although in the illustrated embodiment the first and second paths are supplied coolant by the same source (e.g., supply 308), in other embodiments they may be supplied by different sources (e.g., supply 308 and a separate supply source). For example, each path may be separate from each other and/or each path may include one or more separate coolant supplies.

In step 406, flow of liquid coolant through the first liquid coolant path is stopped or reduced when the first electrode at least partially detaches. A shutoff valve (e.g., valve 320) positioned on the supply line can be manually (e.g., by a human operator) or automatically triggered (e.g., by an actuator, computer, or the like), either in anticipation of, or response to the electrode at least partially detaching. As discussed above, the electrode can detach for a variety of reasons including, but not limited to, a scheduled maintenance or a failure, e.g., melting and/or fusion of the electrode to the work in progress (e.g., work piece 110).

In step 408, the liquid coolant is drawn back from a gap (e.g., gap 336) in the first liquid coolant path that is formed when the first welding electrode at least partially detaches.

For example, a drawback apparatus (e.g., drawback apparatus 340) can create a suction (e.g., via movement of piston 346) that draws the coolant away from the gap and into a chamber (e.g., chamber 342). The coolant may be drawn back from the gap on either or both sides of the path to the gap.

Figure 5A:
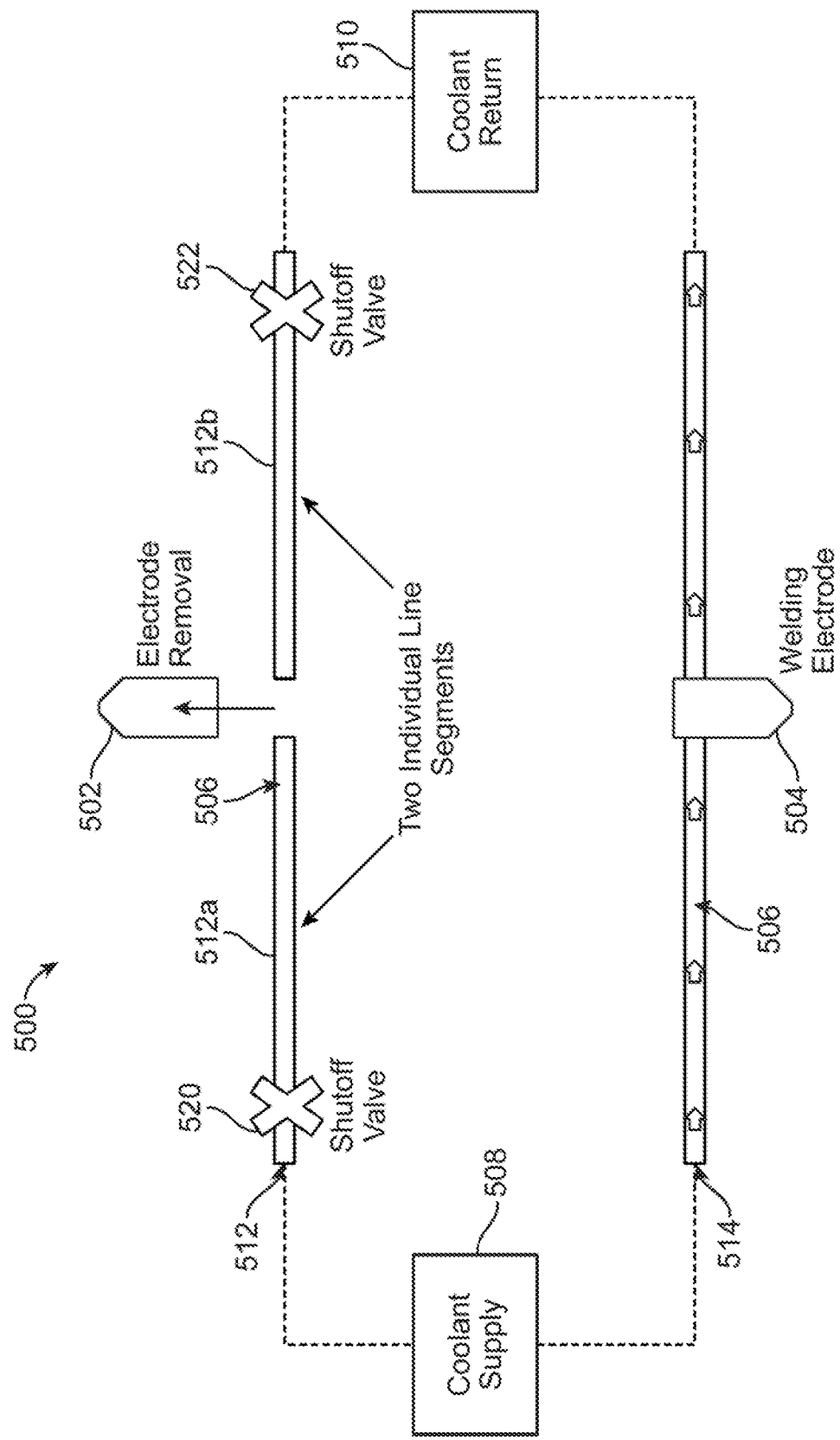
FIG. 5A is a diagram of a fluid flow system for cooling welding electrodes including independent fluid shutoff for multiple fluid path segments according to some embodiments.

FIG. 5A is a diagram of a fluid flow system 500 for cooling welding electrodes 502, 504 including independent fluid shutoff for individual fluid path segments 512a-b of a fluid path 512 according to some embodiments. Isolating electrode 502 with independent shutoff valves 520, 522 may eliminate the problem of a severed loop with both ends vented to atmosphere when electrode 502 is at least partially detached. Instead, individual path segments 512a-b (or "line segments") may be formed, each open at only one end. In the illustrated embodiment, the valves 520, 522 can each be a solenoid or pneumatically actuated valves, a non-return check valve, or otherwise.

It will be appreciated that the features of system 500 may be the same or different from the corresponding features discussed herein (e.g., welding electrodes 202, 204, shutoff valves 220, 222, welding electrodes 702, 704, or the like). It will be further appreciated that although FIG. 5A is described here with respect to fluid path 512, the discussion herein can also apply to one or more other fluid paths, e.g., fluid path 514.

In some embodiments, shutoff valves 520 and 522 may isolate segment 512a-b from the rest of the system 500 thereby shutting off fluid from the coolant supply 508 and the coolant return 510. The shutoff valves 520 and/or 522 may be controlled (e.g., electrically) or be mechanical. The shutoff valves 520 and/or 522 may be actuated or triggered to shut off fluid flow to and/or from the segment 512a-b when the electrode 502 is removed and/or in anticipation of removal. In some embodiments, there may be a limited leakage of coolant out the gap formed by full or partial removal of the electrode 502. In some embodiments, loss of coolant out the gap is limited because of air pressure from the atmosphere and/or surface tension of the coolant in the segment 512a-b.

Figure 5B:
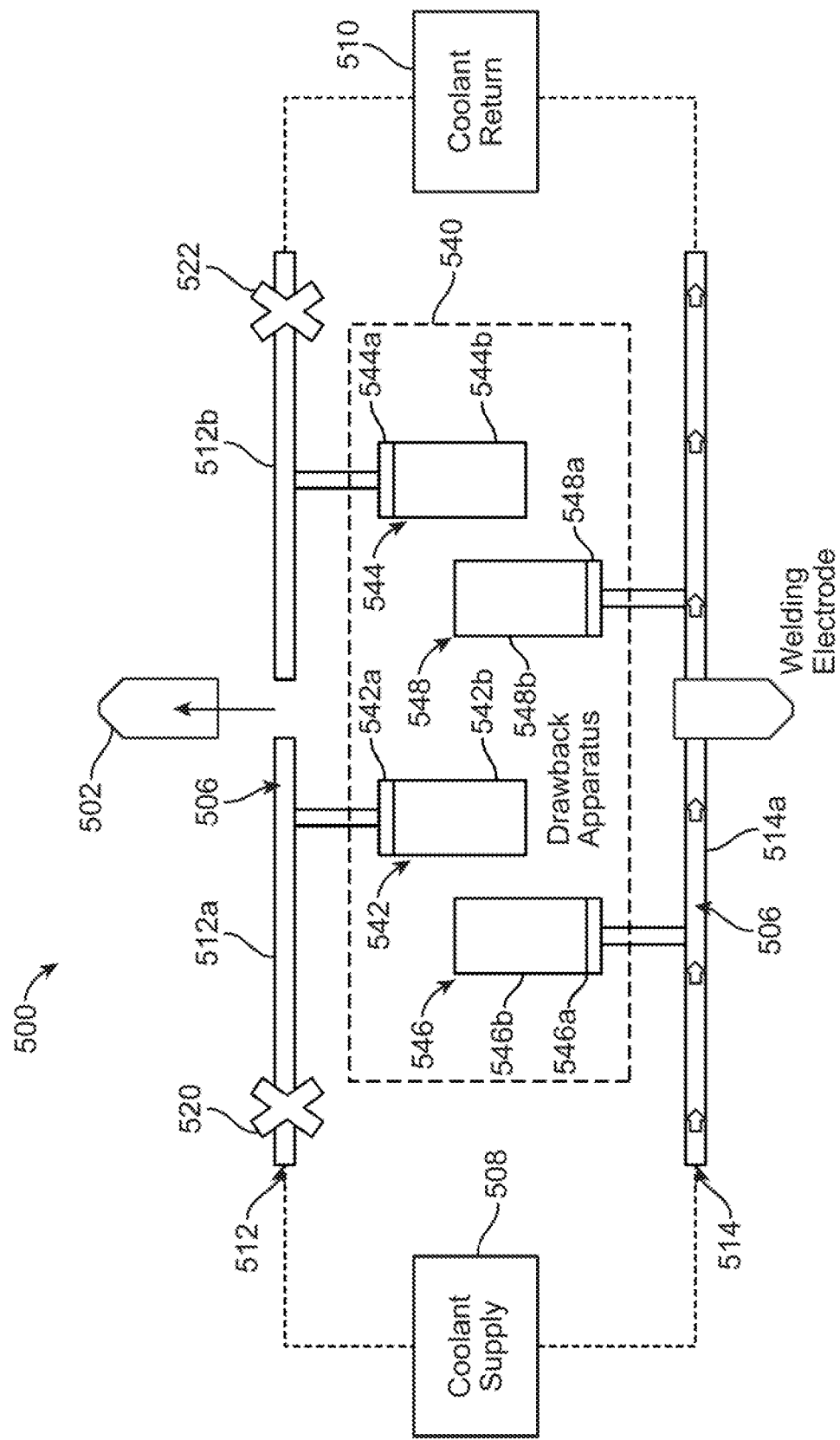
FIG. 5B is a diagram illustrating a drawback apparatus providing independent fluid removal for the path segments according to some embodiments.

FIG. 5B is a diagram illustrating a drawback apparatus 540 for providing independent fluid 506 removal (or "drawback") for each of the path segments 512a-b according to some embodiments. As shown, the drawback apparatus 540 includes four drawback elements 542-548, each positioned on a portion (or "segment") of fluid path 512 or 514. More specifically, drawback element 542 is positioned on portion 512a; drawback element 544 is positioned on portion 512b; drawback element 546 is positioned on portion 514a; and drawback element 548 is positioned on portion 514b.

In the illustrated embodiment, each of the drawback elements 542-548 may have the same configuration and/or operation as the drawback apparatus 340 discussed above. Thus, for example, each of the drawback elements 542-548 may include a piston 542a-548a disposed within a chamber 542b-548b. In the other embodiments, they can each have a different configuration and/or operation, e.g., such as the configuration and/or operation of drawback valve 800 or 1000, discussed herein.

Figure 5C:
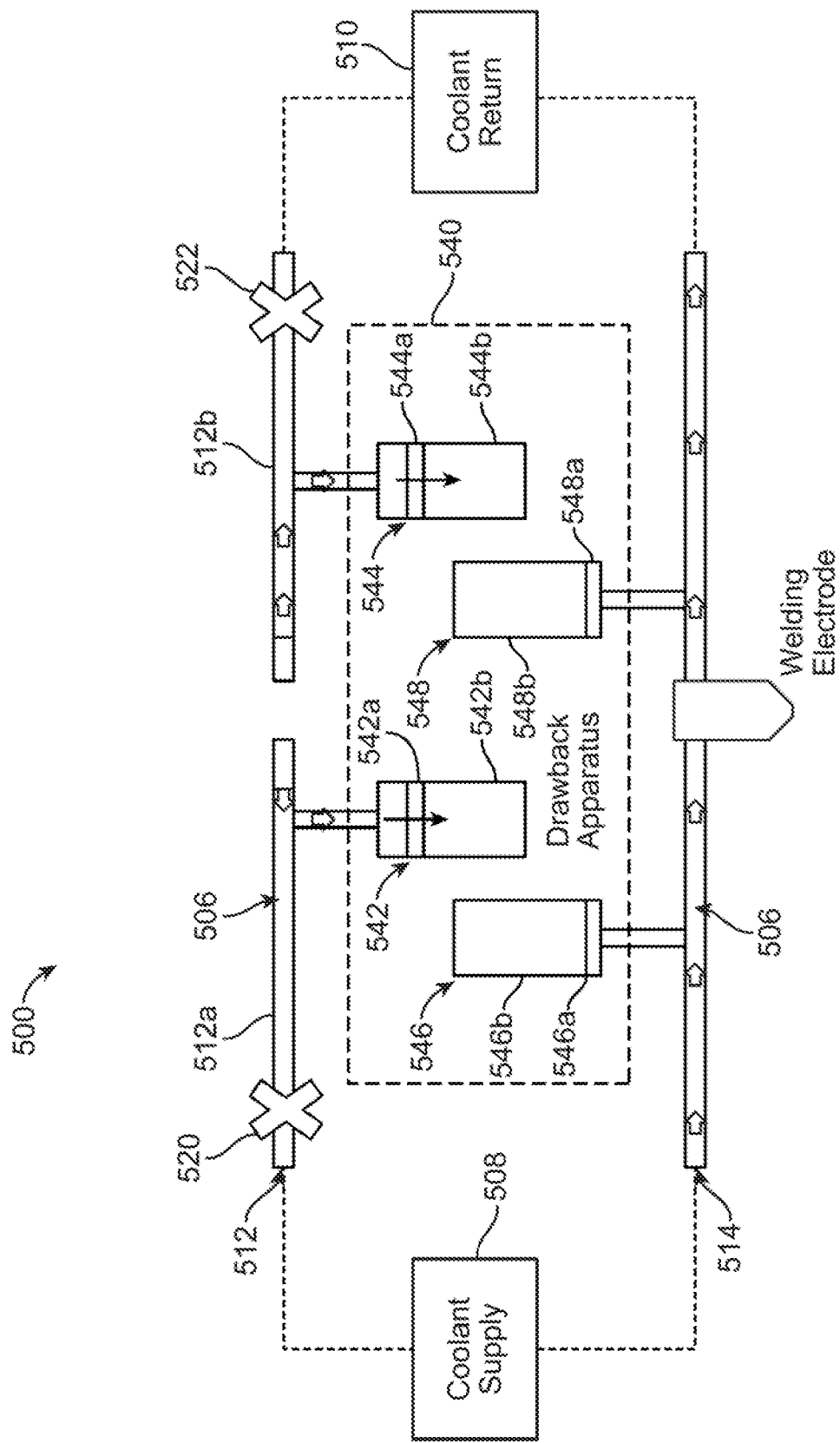
FIG. 5C is a diagram illustrating a drawback fluid flow when a welding electrode is detached from the fluid flow system according to some embodiments.

FIG. 5C is a diagram illustrating a drawback fluid flow when a welding electrode 502 is detached, or partially detached, from the fluid flow system 500 according to some embodiments. Generally, for coolant passageways (e.g., fluid path 512) of sufficiently small cross-sectional area, surface tension largely reduces the amount of coolant that may escape from each isolated path (e.g., path 512a-b), and thus the volume capacity of the drawback apparatus 540 may be limited. For example, the total combined volume of four independent drawbacks elements 542-548 may be substantially less than the previous single drawback apparatus 340.

In some embodiments, when an electrode is detached and a gap formed along path 512, the shutoff valves 520 and 522 may engage to stop flow of coolant along the segment 512a-b. One or both drawback elements 542 and 544 may drawback fluid from the segment 512a-b. Since the shutoff valves 520 and 522 do not allow for coolant to be brought to segment 512a-b, the coolant may be drawn away from the gap, e.g., drawback element 542 may draw coolant back from the gap along segment 512a and drawback element 544 may draw coolant back from the gap along segment 512b.

Coolant may continue to flow along path 514 even if shutoff valves 520 and 522 have engaged. In one example, the coolant along path 514 continues to flow to reduce temperature of the other electrode.

Figure 5D:
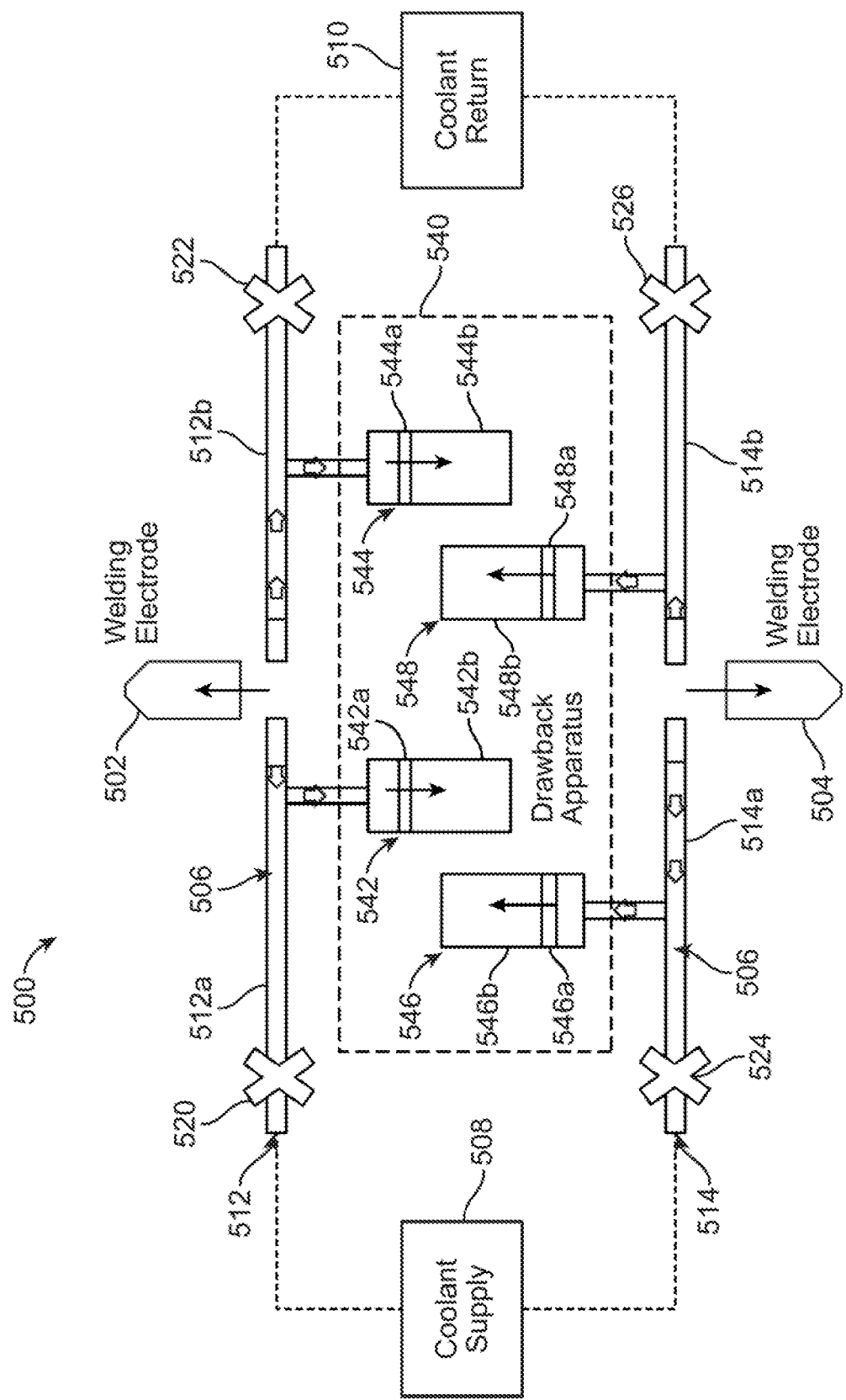
FIG. 5D is a diagram illustrating a drawback fluid flow when both welding electrodes are detached from the fluid flow system according to some embodiments.

Although no shutoff valves are shown along path 514, it will be appreciated that there may be no shutoff valves or one or more shutoff valves, e.g., forming a segment of path 514. FIG. 5D is an illustration of this example.

FIG. 5D is a diagram illustrating a drawback fluid flow when both welding electrodes 502,504 are at least partially detached from the fluid flow system 500 according to some embodiments. By including independent shutoff valves 520-526 and drawback elements 542-548 for each path segment 512a-b and 514a-b, both electrodes 502, 504 can be detached at once, even simultaneously (or near simultaneously), with no or reduced coolant loss.

The drawback apparatus 540 or, more specifically, each of the drawback elements 542-548, may drawback coolant 506 away from the gaps 533, 534 formed when the welding electrodes 502, 504 at least partially detach. The arrows 550-553 indicate directions away from the gaps 533, 534 the coolant can be drawn.

Figure 6:
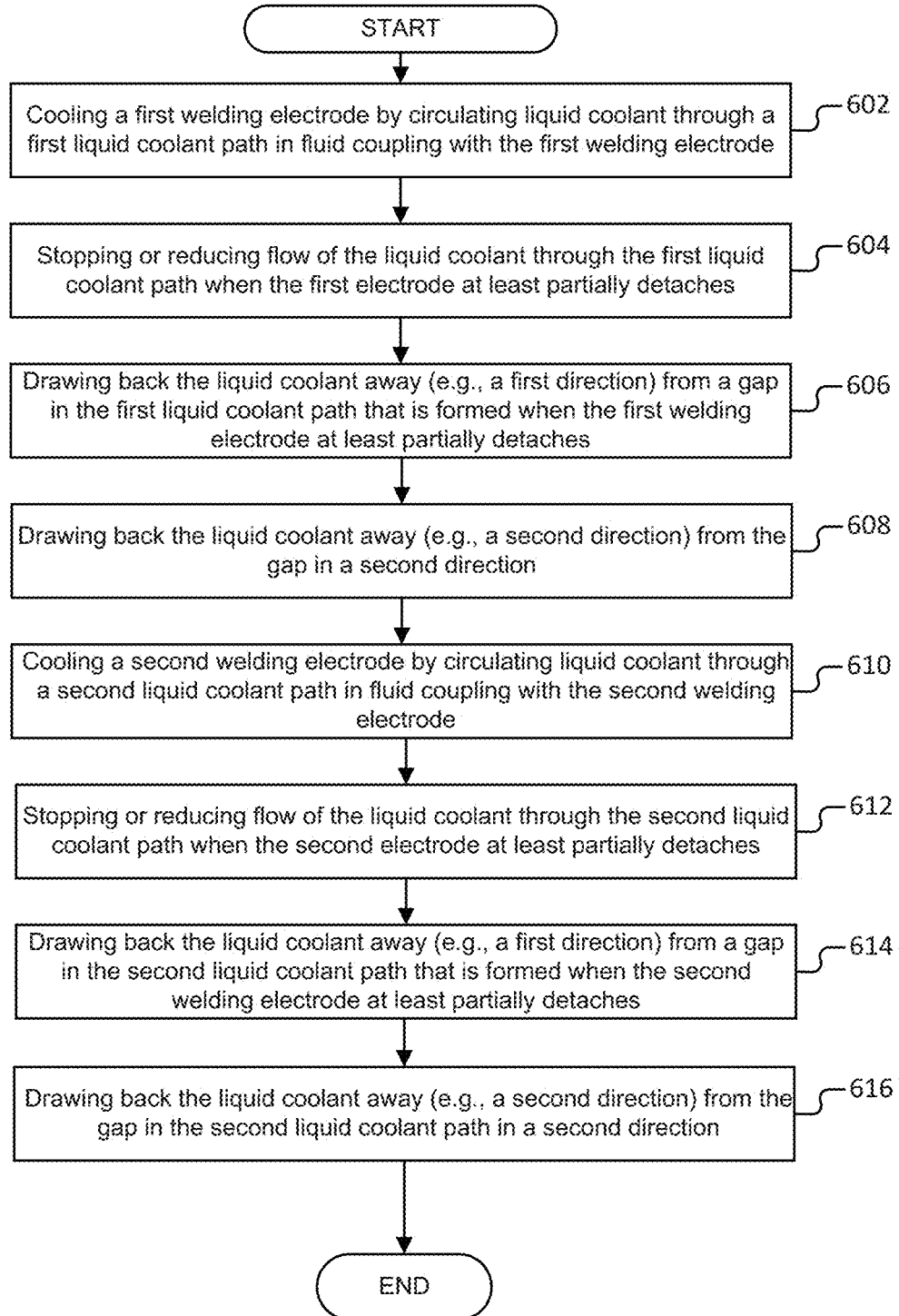
FIG. 6 is a flowchart illustrating an operation of a fluid drawback apparatus (e.g., as shown is FIGS. 5A-D) according to some embodiments.

FIG. 6 is a flowchart illustrating an example operation of a fluid drawback apparatus (e.g., drawback apparatus 540) according to some embodiments. It will be appreciated that although the steps 602-616 below are described in a specific order, the steps 602-616 may also be performed in a different order. Each of the steps 602-616 may also be performed sequentially, or serially, and/or in parallel with one or more of the other steps 602-616. For example, steps 602-608 can be performed simultaneously (i.e., in parallel) with steps 610-616. In some embodiments, operation of the drawback apparatus may include a greater or lesser number of such steps.

In step 602, a first welding electrode (e.g., electrode 502) is cooled by liquid coolant (coolant 506) circulating through a first liquid coolant path (e.g., path 512) in fluid coupling with the first welding electrode. In some embodiments, a coolant supply (e.g., supply 508) may supply the liquid coolant to the first path. The liquid coolant may be water, but as discussed above, it can be any fluid (e.g., combination of chemicals and/or liquids). The circulating liquid coolant may cool the first welding electrode to a temperature to reduce or prevent a failure, e.g., melting, fusing to a work piece (e.g., work piece 110), or the like.

In step 604, flow of the liquid coolant through the first liquid coolant path is stopped or reduced when the first welding electrode at least partially detaches. For example, when the first welding electrode at least partially detaches, e.g., in response to a failure or maintenance, the shutoff valves (e.g., valves 520, 522) may stop or reduce flow of the liquid coolant to and/or through the first fluid path (or portions thereof, e.g., portion 514a-b). As discussed above, activation of the shutoff valves may occur manually (e.g., by an operator) or automatically (e.g., by one or more actuators, a computer, etc.).

In step 606, the liquid coolant is drawn back (e.g., by one or more drawback apparatuses 540) in a first direction away from a gap formed in the first liquid coolant path when the first welding electrode at least partially detaches. For example, a first drawback element (e.g., drawback element 542) may draw the coolant away from the gap and into the first element. Movement of a drawback piston (e.g., piston 542a) may create a suction that draws coolant away from the gap and into a drawback chamber (e.g., chamber 542b).

In step 608, liquid coolant is drawn back in a second direction away from the gap formed in the first liquid coolant path when the first welding electrode at least partially detaches. For example, a second drawback element (e.g., drawback element 544) may draw the coolant away from the gap and into the second drawback element. Movement of a drawback piston (e.g., piston 544a) can create a suction that draws coolant away from the gap and into a drawback chamber (e.g., chamber 544b). Steps 606 and 608 may occur simultaneously or nearly simultaneously.

In step 610, a second welding electrode (e.g., electrode 504) is cooled by the liquid coolant circulating through a second liquid coolant path (e.g., path 514) in fluid coupling with the second welding electrode. In some embodiments, the coolant supply can supply the liquid coolant to the second path. The circulating liquid coolant may cool the second welding electrode to a temperature to reduce or prevent a failure, e.g., melting, fusing to a work piece (e.g., work piece 110), or the like.

In step 612, flow of the liquid coolant through the second liquid coolant path is stopped or reduced when the second welding electrode at least partially detaches. For example, when the second welding electrode at least partially detaches, e.g., in response to a failure or maintenance, the shutoff valves (e.g., valves 524,526) may stop or reduce flow of the liquid coolant. The valves 524,526 may stop or reduce flow of coolant to and/or through the second path (or portions thereof, e.g., portion 514a-b). As discussed above, activation of the shutoff valves may occur manually (e.g., by an operator) or automatically (e.g., by a computer, actuator(s), etc.).

In step 614, the liquid coolant is drawn back in a first direction away from a gap formed in the second liquid coolant path when the second welding electrode at least partially detaches. For example, a third drawback element (e.g., drawback element 546) may draw the coolant away from the gap and into the third element. Movement of a drawback piston (e.g., piston 546a) may create a suction that draws coolant away from the gap and into a drawback chamber (e.g., chamber 546b).

In step 616, liquid coolant is drawn back in a second direction away from the gap formed in the second liquid coolant path when the second welding electrode at least partially detaches. For example, a fourth drawback element (e.g., drawback element 544) may draw the coolant away from the gap and into the fourth element. Movement of a drawback piston (e.g., piston 548a) may create a suction that draws coolant away from the gap and into a drawback chamber (e.g., chamber 548b).

It will be appreciated that although the same liquid coolant (e.g., coolant 506) flows through both the first and second liquid coolant paths in the illustrated embodiment, different liquid coolant (e.g., liquid coolant supplied from different sources and/or liquid coolant of different types) may flow through each of the first and second liquid coolant paths in other embodiments.

Figure 7A:
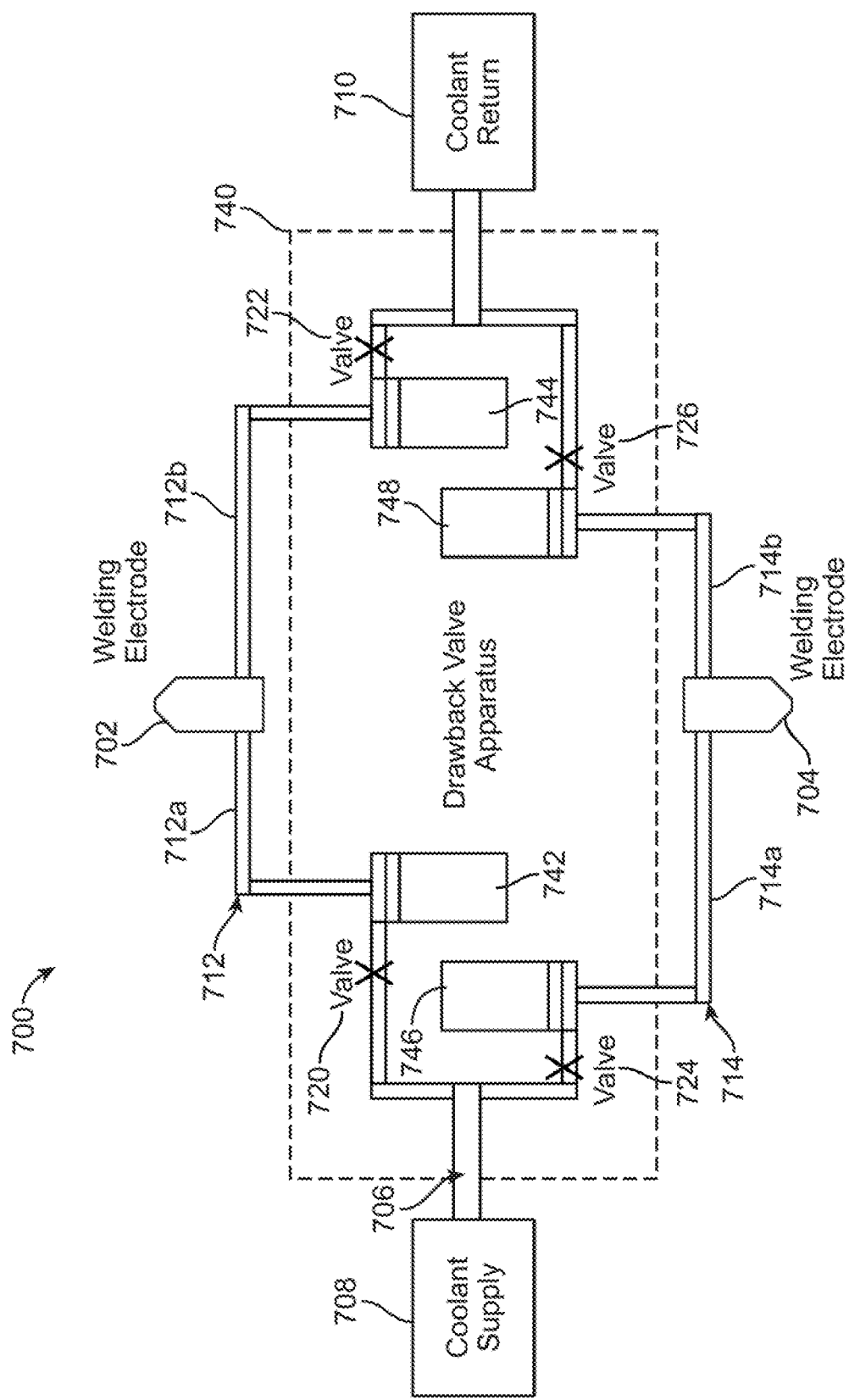
FIG. 7A is a diagram of a fluid flow system for cooling welding electrodes including a drawback valve apparatus according to some embodiments.

FIG. 7A is a diagram of a fluid flow system 700 for cooling welding electrodes 702, 704 including a drawback valve apparatus 740 according to some embodiments. As shown, valves for each electrode can be included within a drawback apparatus (e.g., drawback apparatus 540) to create the drawback valve apparatus 740.

It will be appreciated that the features of system 700 may be the same or different from the corresponding features discussed above (e.g., welding electrodes 202, 204, shutoff valves 220, 222, or the like). Accordingly, the drawback elements 742-748 may have a same or similar configuration and/or operation as the drawback elements 542-548 described above. Likewise, the valves 720-724 may also have a same or similar configuration and/or operation as the valves 520-524 described above, although in other embodiments, the valves 720-724 may be included within the drawback elements 740-746.

In FIG. 7A, coolant supply 708 provides coolant 706 along paths 712 and 714 to cool welding electrodes 702 and 704, respectively. The coolant 706 is then received by coolant return 710 (where the coolant 706, in some embodiments, may be recirculated). The system 700 may include shutoff valves 720 and 722 that may shut off flow of the coolant 706 along the path 712 (e.g., if a gap or a break occurs in the path 712, or preceding the planned removal of an electrode 702). Similarly, the system 700 may include shutoff valves 724 and 726 that may shut off flow of the coolant 706 along the path 714. Drawback elements 742 and 744 may draw coolant 706 into the drawback elements 742 and 744, respectively, if a gap or break forms in the path 712. Similarly, drawback elements 746 and 748 may draw coolant 706 into the drawback elements 746 and 748, respectively, if there is a gap or break in the path 714.

In the example depicted in FIG. 7A, both paths 712 and 714 receive coolant 706 from the coolant supply 708 along, at least partially, the same path (i.e., the paths form a loop including a partially shared path from the coolant supply 708). Similarly, both paths 712 and 714 provide coolant 706 to the coolant return 710 along, at least partially, the same path.

In various embodiments, the drawback element 742 will be disposed between a shutoff valve (e.g., shutoff valve 720) and the electrode 702. Similarly, the drawback element 744 may be disposed between a shutoff valve (e.g., shutoff valve 722) and the electrode 702. The drawback element 746 may be disposed between a shutoff valve (e.g., shutoff valve 724) and the electrode 704. The drawback element 748 may be disposed between a shutoff valve (e.g., shutoff valve 726) and electrode 704.

In various embodiments, upon detection of a break or gap in or along the path 712 (e.g., caused by a breach of the system and/or detachment of a welding electrode 702), the shutoff valve 720 and the shutoff valve 722 may activate to block flow of coolant 706 from the coolant supply 708 and block backflow of coolant 706 from the coolant return 710, respectively.

The drawback element 742 may not activate until the shutoff valve 720 has shut off flow of the coolant 706. In some embodiments, the drawback element 742 will not activate until both the shutoff valves 720 and 722 have shut off flow of the coolant 706. Once active, the drawback element 742 may draw fluid away from the gap or break by pulling coolant 706 into a reservoir (e.g., a chamber within the drawback element 744).

Similarly, the drawback element 744 may not activate until the shutoff valve 722 has shut off flow of the coolant 706. In some embodiments, the drawback element 744 will not activate until both the shutoff valves 720 and 722 have shut off flow of the coolant 706. Once active, the drawback element 744 may draw fluid away from the gap or break by pulling coolant 706 into a reservoir (e.g., a chamber within the drawback element 744).

Once the gap or break is corrected, the shutoff valves 720 and 722 may be opened to allow flow of coolant 706. In some embodiments, the drawback elements 742 and/or 744 may push the coolant 706 from their respective reservoirs back into the paths.

It will be appreciated that one or more shutoff valves may be optional. For example, the coolant supply 708 may be configured to shut itself off if a break or gap in the path of the system 700 is detected. The coolant supply 708 may shut itself off such that little or no coolant 706 may leak into the paths from the coolant supply 708 even if the drawback elements 742, 744, 746, and/or 748 draw coolant 706 away from the paths (e.g., in the case of a break or gap). Similarly, the coolant return 710 may shut itself off such that little or no coolant 706 may leak into the paths from the coolant return 710 even if the drawback elements 742, 744, 746, and/or 748 draw coolant 706 away from the paths.

Figure 7B:
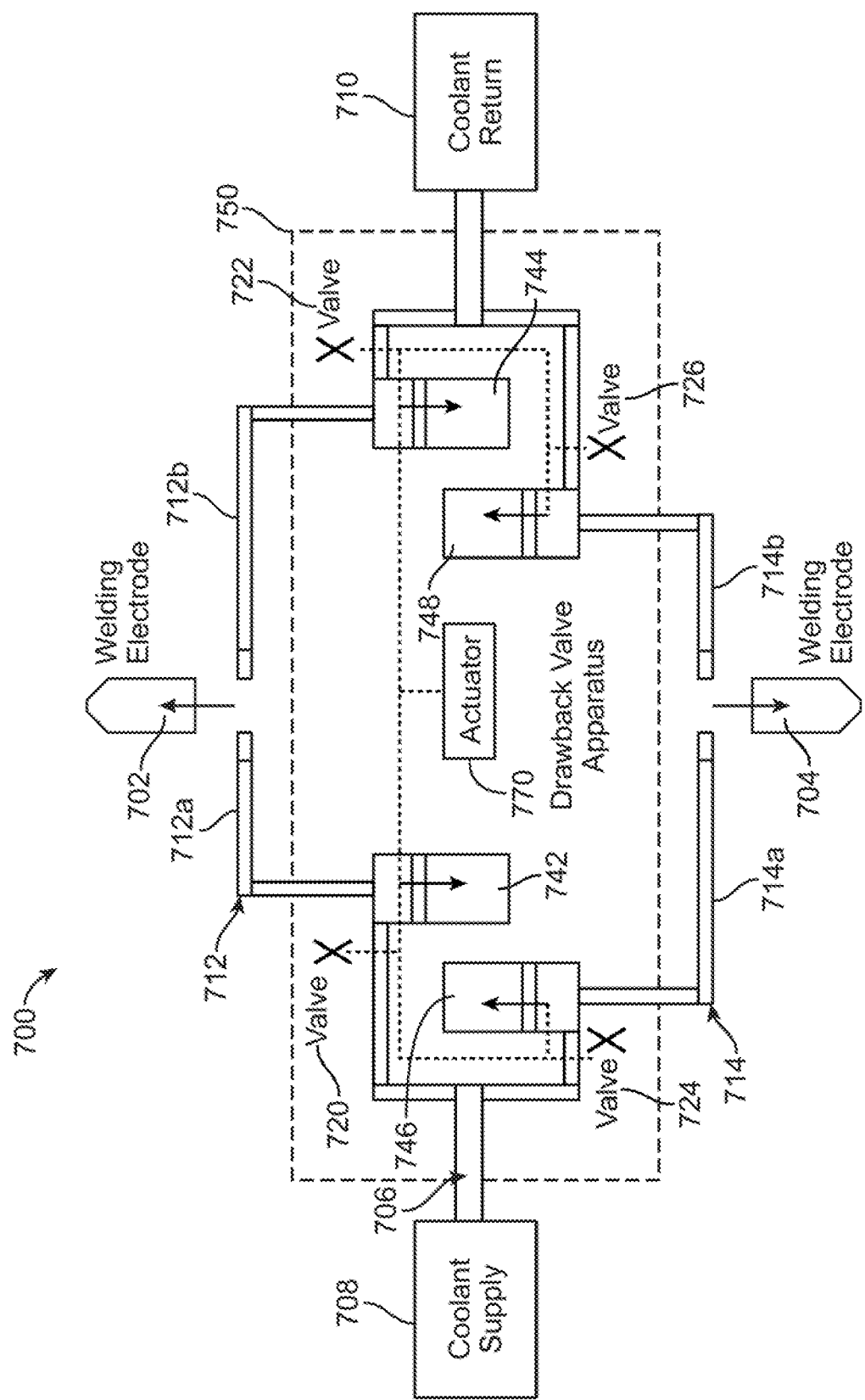
FIG. 7B is a diagram illustrating a drawback valve apparatus operated by a single actuator according to some embodiments.

FIG. 7B is a diagram illustrating a drawback valve apparatus 740 operated by a single actuator 770 according to some embodiments. More specifically, the drawback valves 720-724 and drawback elements 742-748, and components thereof (e.g., piston, or the like) are operated by the actuator 770. Although actuator 770 is shown here operating four valves 722-724 and drawback elements 742-744, in other embodiments the actuator 770 may operate a greater or lesser number of such valves and/or drawback elements. The actuator 770 may be a pneumatic actuator or may be otherwise (e.g., electric, hydraulic, mechanical, etc.). It will be appreciated that there may be any number of actuators.

In various embodiments, each shutoff valve 720, 722, 724, and/or 726 may share one or more actuators (or may each be associated with a separate actuator). The actuator may be coupled to any number of sensors for detecting breaks or gaps in paths of the system 700. If a break or gap is detected, any number of actuators may control any number of shutoff valves to shut off flow of coolant 706. Alternately, in some embodiments, the actuator(s) are mechanically controlled (e.g., through a worker).

In some embodiments, upon sensing a break, the actuator(s) may control a subset of shutoff valves. For example, if a breach in the path 712 is detected (e.g., from detachment of the electrode 702), the actuator(s) may activate shutoff valves 720 and/or 722 to shut off coolant 706 flow. If a breach in the path 714 is detected (e.g., from detachment of the electrode 704), the actuator(s) may activate shutoff valves 724 and 726) to shut off coolant 706 flow.

In some embodiments, the actuator(s) may control drawback elements (e.g., drawback elements 742-748). For example, after the shutoff valves 720 and 722 shut off flow of coolant 706, the actuator(s) may control the drawback elements 742, 744, 746, and/or 748. The actuator(s) may control a subset of the drawback elements. For example, after detecting a breach in the path 712, the actuator(s) may control the drawback elements 742 and/or 744 to drawback coolant 706 from the paths (e.g., from the breach). Upon detection or a command that the breach has been corrected (e.g., the welding electrode 702 has been replaced), then the actuator(s) may control the drawback elements 742 and/or 744 to push the coolant back to the paths. Similarly, after detecting a breach in the path 714, the actuator(s) may control the drawback elements 746 and/or 748 to drawback coolant 706 from the paths (e.g., from the breach). Upon detection or a command that the breach has been corrected, then the actuator(s) may control the drawback elements 746 and/or 748 to push the coolant back to the paths.

Figure 7C:
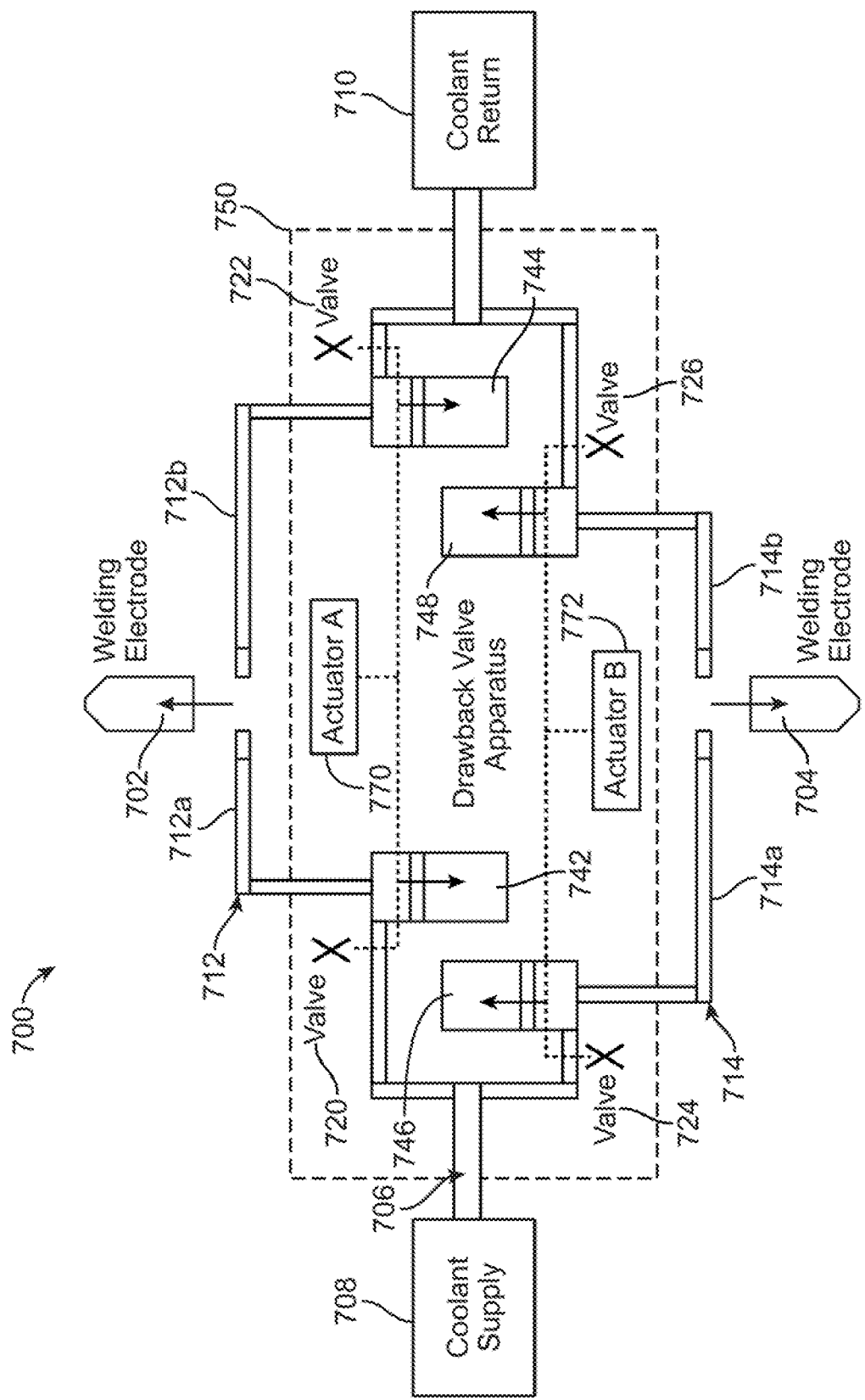
FIG. 7C is a diagram illustrating a drawback valve apparatus operated by multiple actuators according to some embodiments.

FIG. 7C is a diagram illustrating a drawback valve apparatus 750 operated by multiple actuators 770,772 according to some embodiments. Generally, more than one actuator may be employed if independent coolant control is desired for each electrode 702, 704. As shown, actuator 770 may control cooling for the first welding electrode 702, and actuator 772 controls cooling for the second welding electrode 704. In some embodiments, the actuator 770 operates valves 720,722 and drawback elements 742,744, and actuator 772 operates valves 724,726 and drawback elements 746,748. Although each actuator 770,772 is shown here operating two valves and drawback elements, in other embodiments they may each operate a greater or lesser number of such valves and/or drawback elements. Additionally, other embodiments may include a greater number of such actuators. In the illustrated embodiments both actuators 770,772 are pneumatic actuators but in different embodiments it can be otherwise.

Figure 8A:
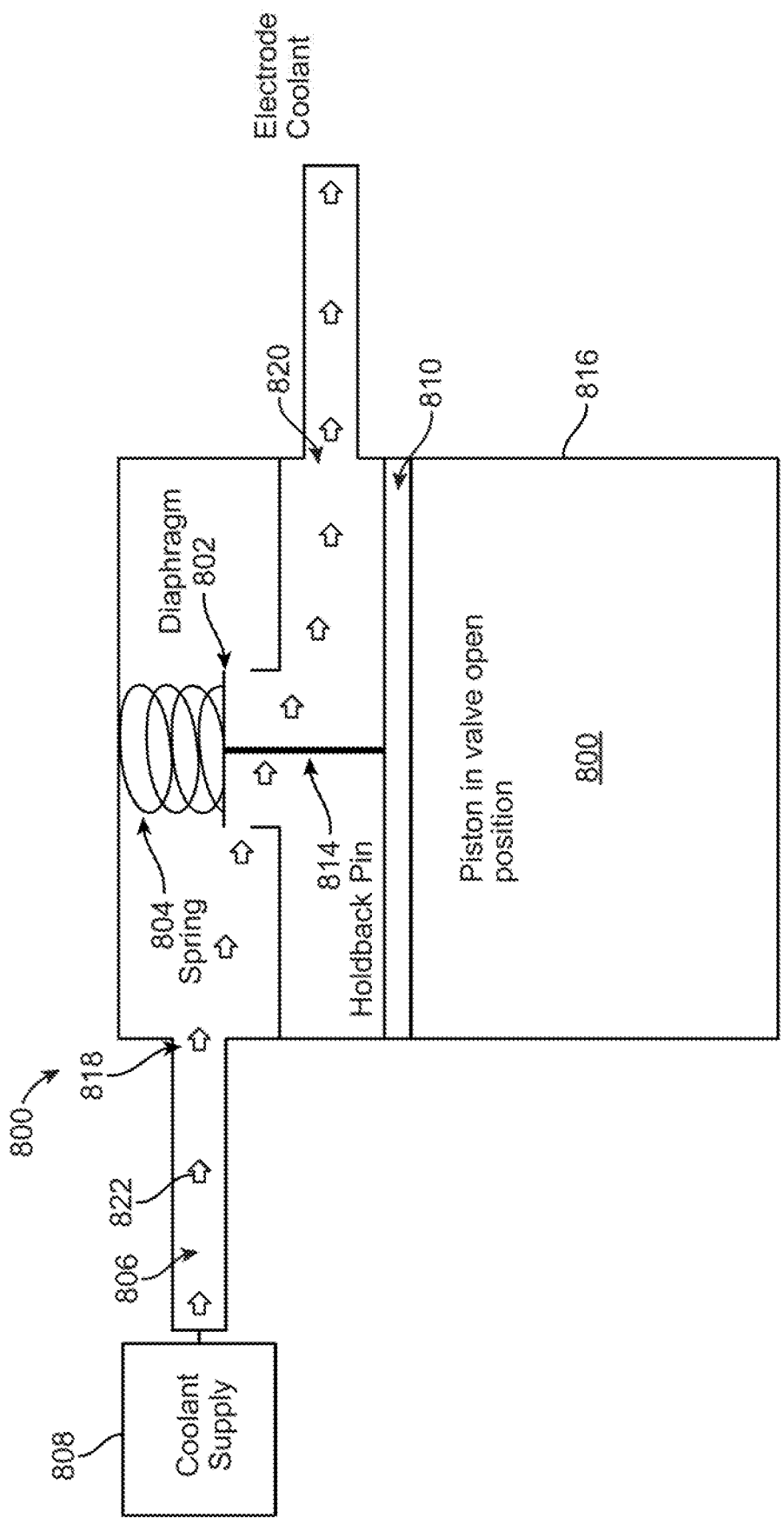
FIG. 8A is a diagram of a drawback valve in a first position (e.g., an "open" position) according to some embodiments.

FIG. 8A is a diagram of a drawback valve 800 shown in a first position (e.g., an "open" position) according to some embodiments. In the illustrated example, the drawback valve 800 includes a valve element 802 (e.g., a diaphragm), a spring 804, a piston 810, and a holdback pin 814, all incorporated into a drawback chamber 816 (e.g., a cylinder). Coolant may be provided by a coolant supply 808.

As shown, the spring 804 can be pressed against, or coupled to, the valve element 802 on one side of the spring, and pressed against, or coupled to, an inside portion of the chamber 816 on an opposite side of the spring 804. Such valve element and spring arrangements can be used in typical non-return check valves, but in this embodiment, the valve element 802 and spring 804 are biased against the normal flow of coolant from supply 808 to the welding electrode (e.g., electrode 702 or 704). In operation, the valve element 802 can be forced open by a feature of the drawback piston 810 (i.e., holdback pin 814), allowing coolant 806 to flow to the electrode through liquid coolant path 812 with chamber opening 818 serving as the coolant inlet, and chamber opening 820 serving as the coolant outlet. Flow of the coolant 806 is shown by directional arrows 822 from inlet to outlet. In some embodiments, the holdback pin 814 may be a feature of the valve element 802, which may likewise be forced open by the piston 810.)

Although the valve element 802 is depicted as flat, the valve element 802 may be any shape to assist and/or control the flow of coolant. For example, the valve element 802 may be angled, concave, or any shape. Similarly, the piston 810 may be any shape.

It will be appreciated that the drawback valve 800 may be configured as a normally biased non-return valve in the outflow path of an electrode to close upon a breach or gap at the electrode. For example, the normal flow of coolant in the opposite direction from that shown in FIG. 8A (e.g., with chamber opening 818 serving as the coolant inlet and chamber opening 820 serving as the coolant outlet) may keep the valve element in the open position. A breach or gap in the inlet path may reduce pressure of the fluid allowing the spring and/or fluid backpressure to push the valve element 802 into the closed position in conjunction with actuation of the piston for drawback of coolant.

Figure 8B:
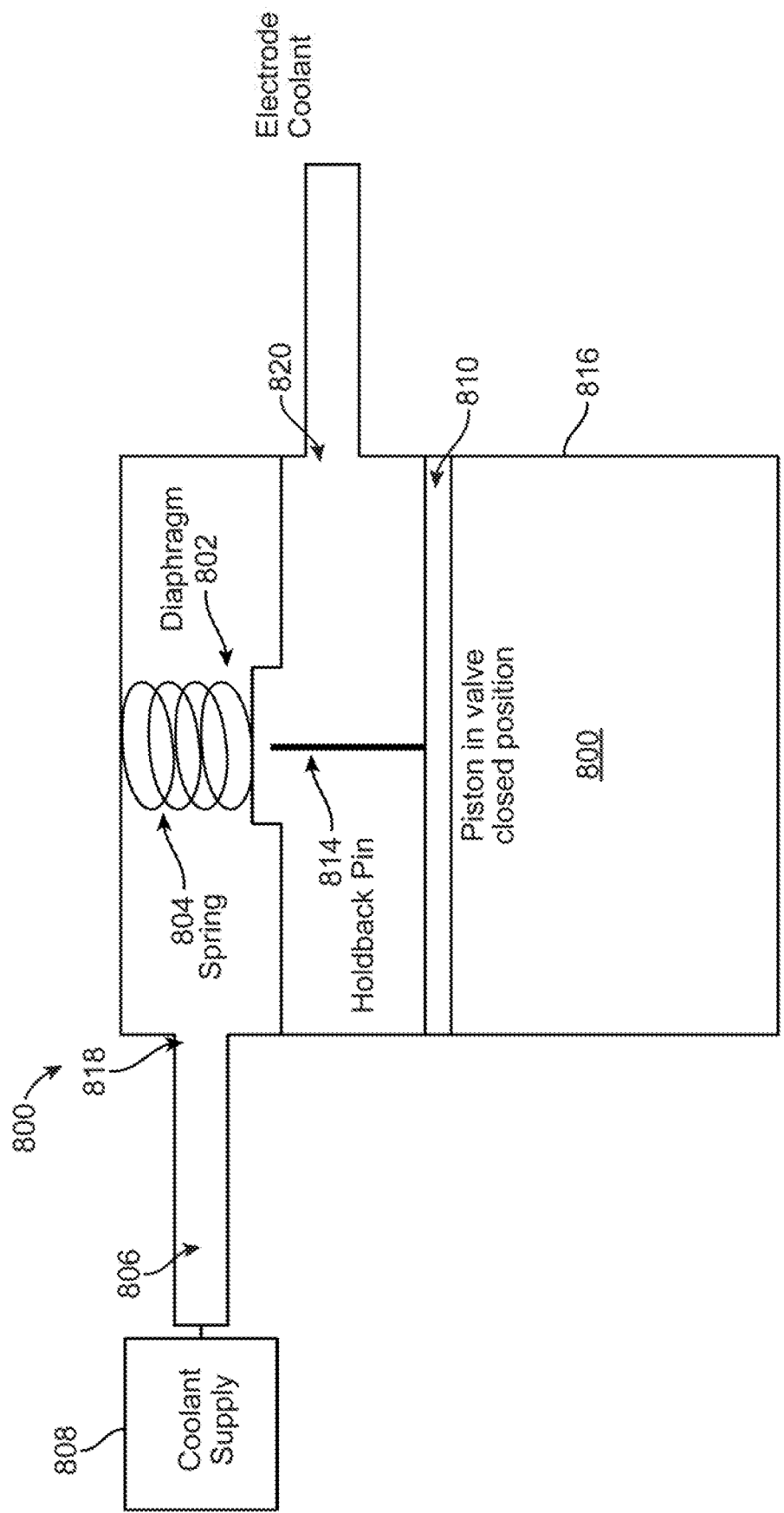
FIG. 8B is a diagram of a drawback valve in a second position (e.g., a "closed" position) according to some embodiments.

FIG. 8B is a diagram of the drawback valve 800 shown in a second position (e.g., a "closed" position) according to some embodiments. When actuated, e.g., by actuator 770 or 772, the initial movement of the piston 810 releases the valve element 802, allowing the spring 804 force and supply 808 pressure to force it closed, thus stopping or reducing the flow of coolant 806 to the electrode. In some embodiments, the drawback valve 800 may mechanically close from the open position (e.g., by coolant pressure, electrical control, or mechanical control).

Figure 8C:
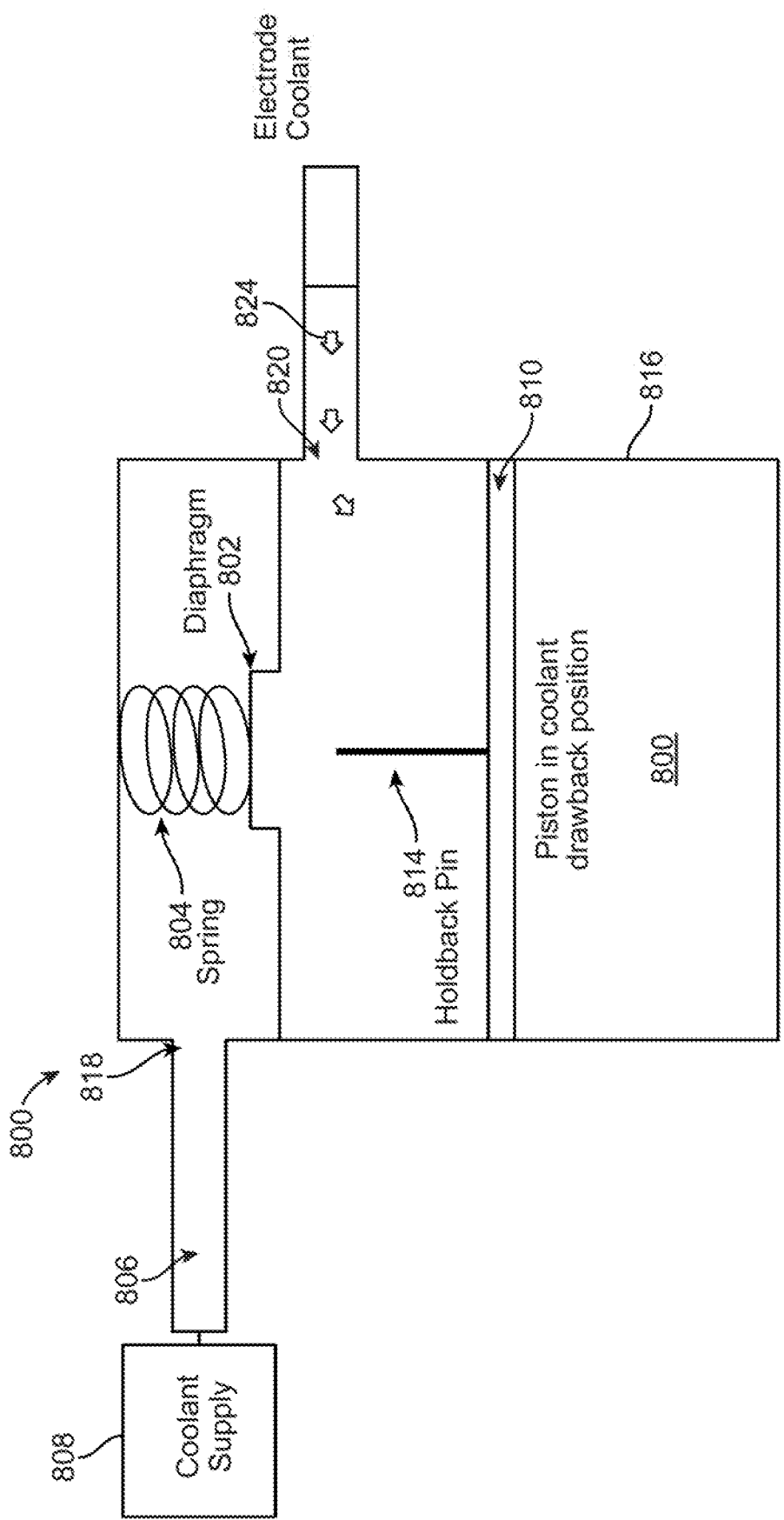
FIG. 8C is a diagram of a drawback valve in a third position (e.g., a "drawback" position) according to some embodiments.

FIG. 8C is a diagram of the drawback valve 800 shown in a third position (e.g., a "drawback" position) according to some embodiments. The remaining stroke of the piston 810 draws coolant 806 back from the electrode through opening 820 and into the chamber 816 with coolant flow through opening 818 blocked by the closure of valve element 802. For example, in some embodiments, the piston 810 may draw coolant 806 from opening 820 serving as the coolant outlet of the valve 800 (e.g., as indicated by directional arrows 824), with the valve element 802 closed to block the supply of coolant from opening 818. In some embodiments, the direction of flow may be reversed and the piston 810 may draw coolant 806 from opening 820 serving as the coolant inlet of the valve 800, with the valve element 802 acting as a normally biased non-return check valve that is closed by spring and/or fluid backpressure to block the backflow of coolant from opening 818.

Figure 8D:
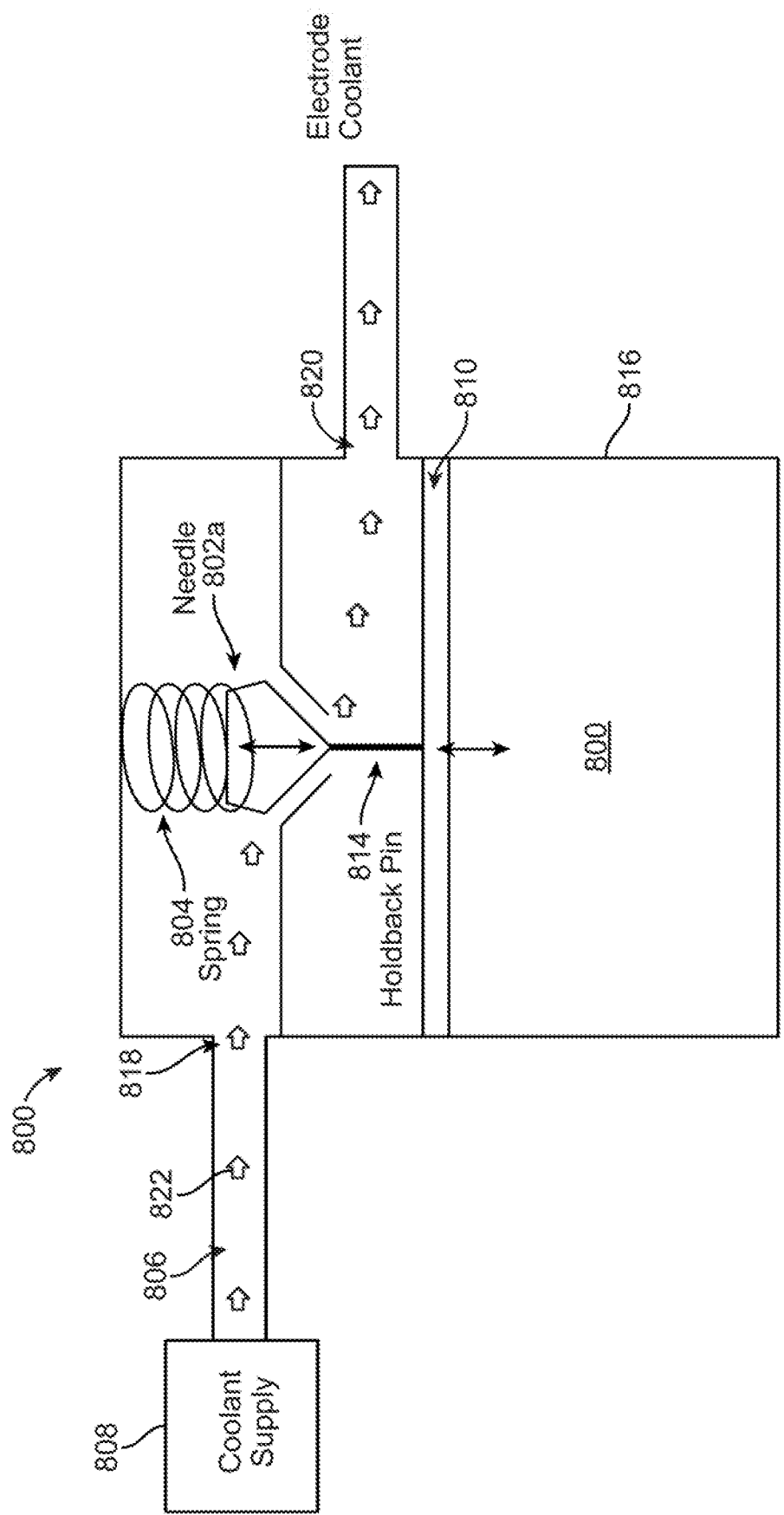
FIG. 8D is a diagram of a drawback valve according to some embodiments.

FIG. 8D is a diagram of a drawback valve 800 having a different configuration. In some embodiments, instead of, or in addition to, the diaphragm 802, the drawback valve 800 may include a drawback valve element 802a. For example, as shown, the drawback valve element 802a may comprise a needle-shaped drawback valve element. It will be appreciated that other types and configurations of the drawback apparatus 800 may be implemented with the methods described herein.

It will be appreciated that the diagram of the drawback valve 800, as shown in FIGS. 8A-D, is shown in an example position relative to the welding electrode. More specifically, the valve 800 is depicted in a "left" (or, upstream) position relative to the welding electrode. For example, drawback element 742 is shown in a left position relative to the electrode 702. Accordingly, as described above, liquid coolant 806 is drawn back into the drawback valve 800 through opening 820. In some embodiments, the valve 800 may also be placed in different positions relative to the electrode, e.g., in a "right" (or, downstream) position relative to the welding electrode. For example, drawback element 744 is shown in a right position relative to the electrode 702. In such a configuration, the valve 800 would be flipped in order to have the opening 820 on the left side of the diagram of the valve 800 (i.e., as opposed to the right side, as currently shown) in order to draw back liquid coolant 806 from the electrode through that opening 820.

Figure 9:
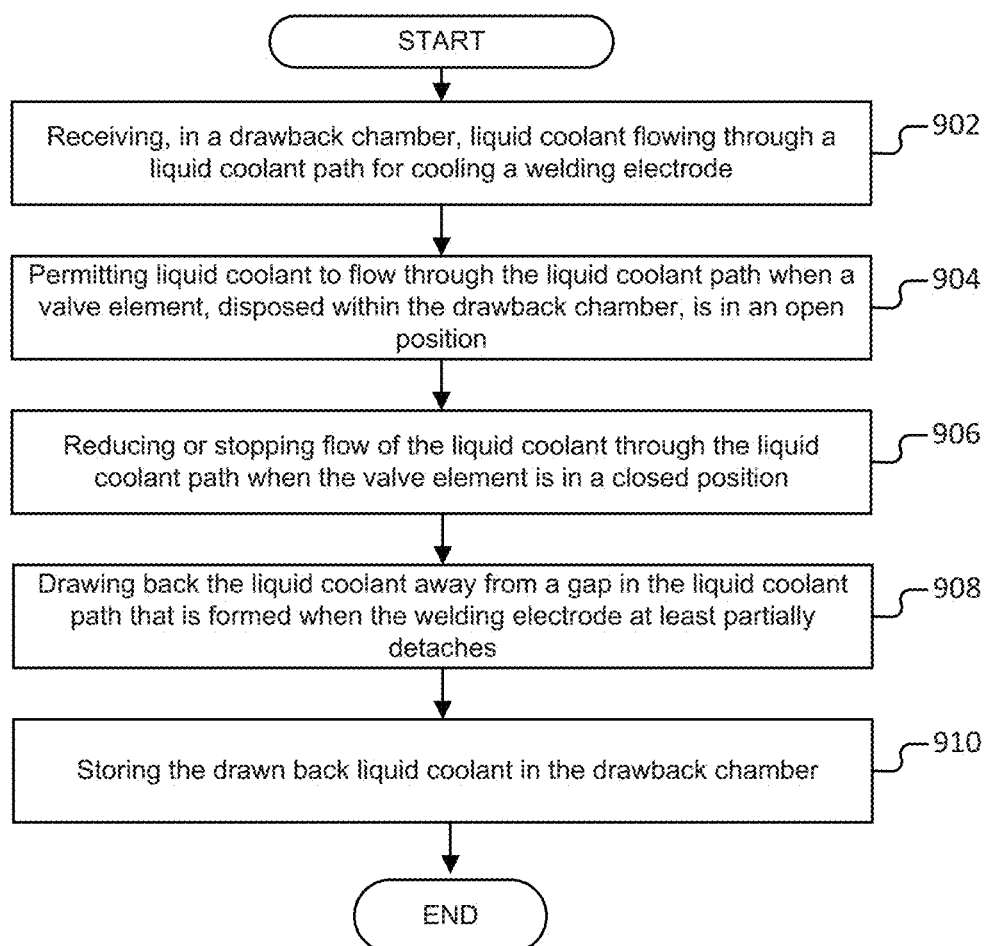
FIG. 9 is a flowchart illustrating an operation of a drawback valve (e.g., as shown in FIGS. 8A-C) according to some embodiments.

FIG. 9 is a flowchart illustrating an operation of a drawback valve (e.g., valve 800) according to some embodiments. It will be appreciated that although the steps 902-916 below are described in a specific order, the steps 902-916 may also be performed in a different order. Each of the steps 902-916 may also be performed sequentially, or serially, and/or in parallel with one or more of the other steps. In some embodiments, operation of the drawback apparatus may include a greater or lesser number of such steps.

In step 902, liquid coolant (e.g., coolant 806) flowing through a liquid coolant path (e.g., path 812) for cooling a welding electrode (e.g., electrode 702) is received in a drawback chamber (e.g., chamber 816). For example, the liquid coolant is received in the chamber one or more chamber openings (e.g., chamber opening 818).

In step 904, the coolant is permitted to flow through the liquid coolant path when a valve element (e.g., valve element 802), disposed within the drawback chamber, is in an open position, thereby cooling the welding electrode. For example, the valve element can be in the open position when the valve element is forced open by a feature of a drawback piston (e.g., piston 814), namely, a holdback pin (e.g., holdback pin 814). In some embodiments, the valve element may be pushed open because the force generated by the piston is greater than the force generated by an opposing spring (e.g., spring 804) and/or fluid pressure.

In step 906, flow of the liquid coolant through the liquid coolant path is reduced or stopped when the valve element is in a closed position. The valve element can move to the closed position in response to a signal from an actuator (e.g., actuator 770) when the welding electrode at least partially detaches.

In step 908, liquid coolant is drawn back away from a gap in the liquid coolant path that is formed when the welding electrode at least partially detaches. For example, movement of the drawback piston can create a suction that draws coolant away from the gap and into the chamber, and stored at least temporarily therein (step 910).

Although operation of a single drawback valve is described here, it will appreciated that embodiments of the present invention can include operation of multiple such valves, operating in parallel with each other or sequentially.

Figure 10A:
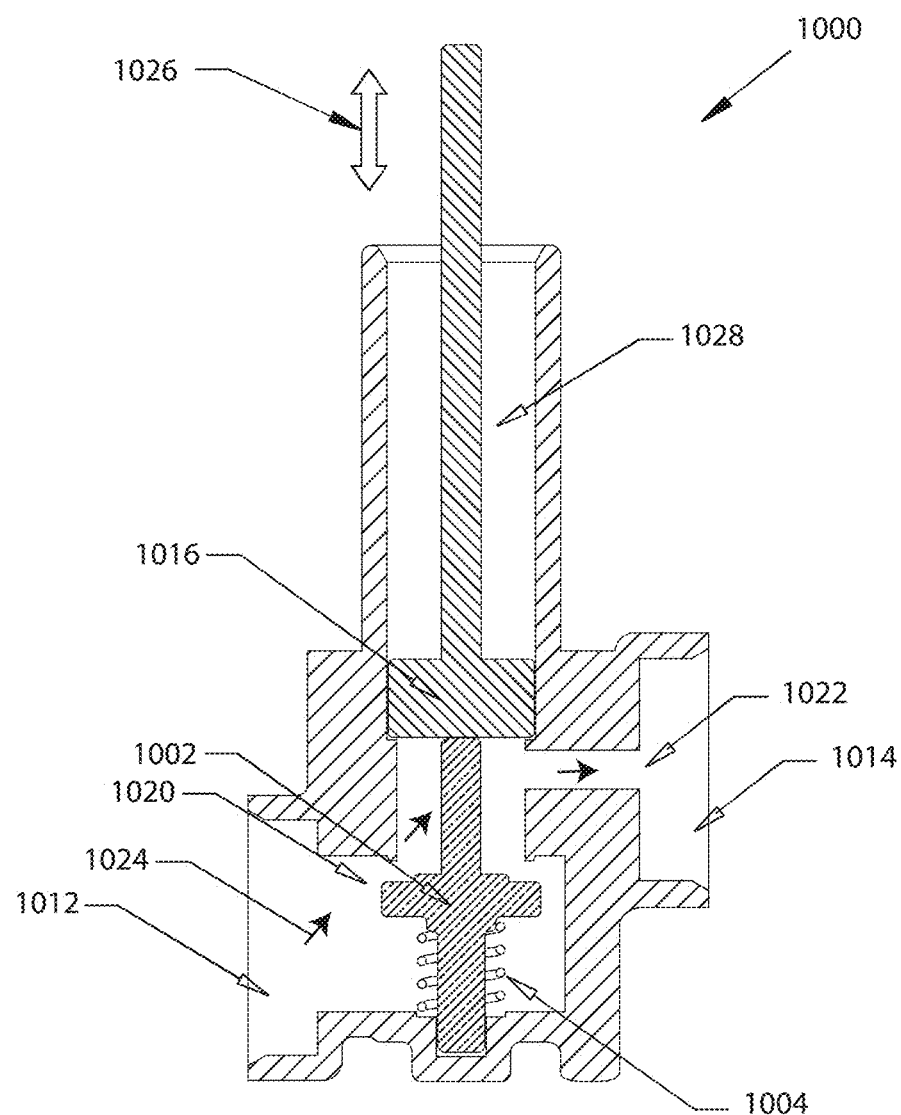
FIG. 10A is a diagram of a drawback valve in a first position (e.g., an "open" position) according to some embodiments.

FIG. 10A is a diagram of a drawback valve 1000 in a first position (e.g., an "open" position) according to some embodiments. In the illustrated example, the drawback valve 1000 includes a valve element 1002 (e.g., a diaphragm), a spring 1004, and a piston 1016 that may travel through a piston chamber 1028.

As shown, the spring 1004 can be pressed against, or coupled to, the valve element 1002 on one side of the spring, and pressed against, or coupled to, an inside portion of the drawback valve 1000 on an opposite side of the spring 1004. In some embodiments, this valve element and spring arrangements may be used as in typical non-return check valves. In some embodiments, the valve element 1002 and spring 1004 are biased against the normal flow of coolant from a coolant supply (e.g., supply 708) to the welding electrode (e.g., electrode 702 or 704).

In operation, the valve element 1002 may be forced open by the piston 1016. In some embodiments, the piston 1016 may push on a valve element actuator member 1018 coupled to the valve element 1002, thereby allowing coolant (e.g., coolant 706) to flow to the electrode through liquid coolant paths 1012, 1014 and drawback valve openings 1020, 1022, e.g., as indicated by directional arrows 1024. In various embodiments, the piston 1016 may push directly on the valve element 1002 to allow coolant flow through the paths 1012, 1014 and openings 1020, 1022. In some embodiments, coolant may also flow in the opposite direction with the valve element acting as a normally biased non-return check valve.

In some embodiments, movement of the piston 1016 (e.g., as indicated by directional arrows 1026) may be effected by one or more actuators (e.g., actuator 770) controlling a piston support member 1028 (e.g., piston rod, piston shaft, etc.) coupled to the piston 1016. In other embodiments, one or more actuators may directly control the piston 1016 itself, i.e., without a piston support member 1028, e.g. direct hydraulic or pneumatic actuation of the piston, electromagnetic control of the piston, etc.

Although the valve element 1002 is depicted as flat, the valve element 1002 may be any shape to assist and/or control the flow of coolant. For example, the valve element 1002 may be angled, concave, or any shape. Similarly, the piston 1016 may be any shape.

Figure 10B:
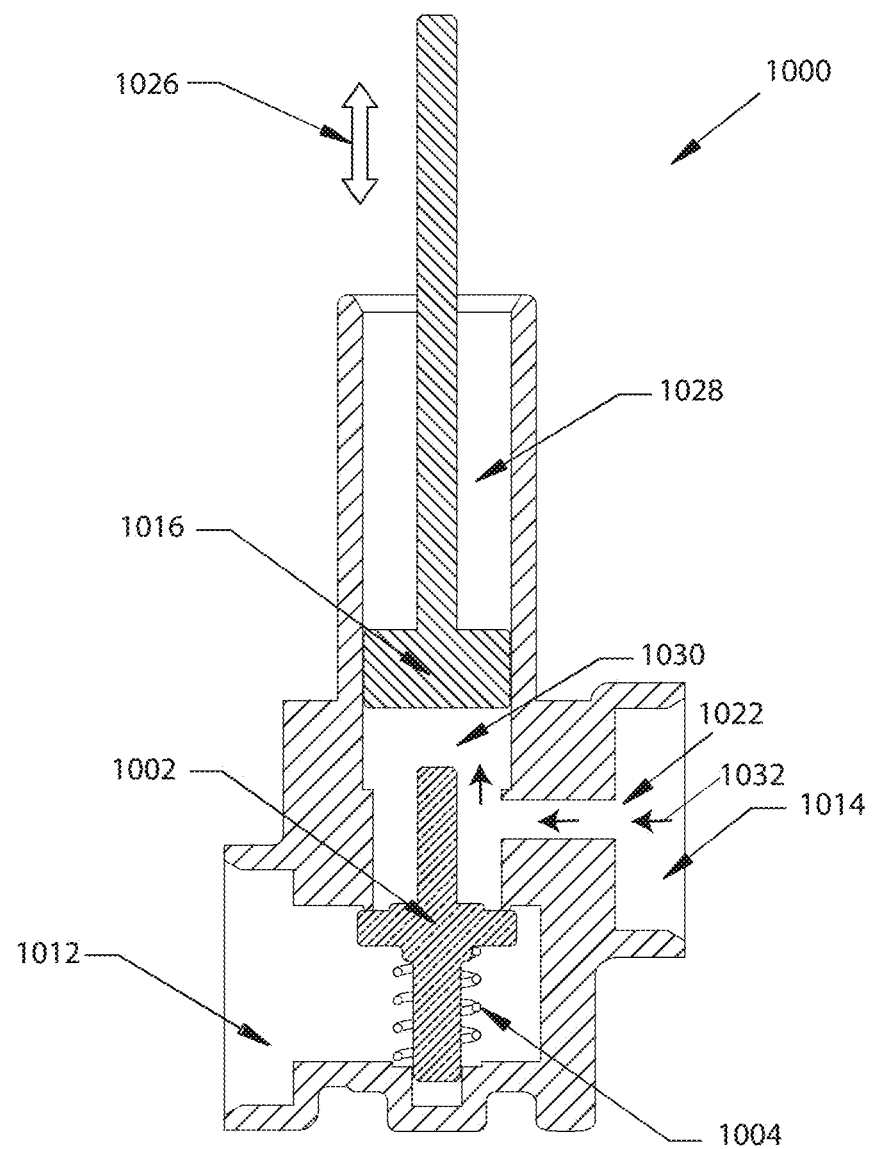
FIG. 10B is a diagram of a drawback valve in a second position (e.g., a "closed" or "drawback" position) according to some embodiments.

FIG. 10B is a diagram of a drawback valve 1000 in a second position (e.g., a "closed" and/or "drawback" position) according to some embodiments. When actuated, e.g., by actuator 770 or 772, initial movement of the piston 1016 releases the valve element 802, and the spring 804 and/or fluid pressure pushes it closed, thus stopping or reducing the flow of coolant to the electrode. For example, the actuator could automatically trigger in response to a break or gap detected by one or more sensors, e.g., in the event of a failure. Alternatively, the actuator may be manually or mechanically controlled, e.g., by an operator in order to perform scheduled maintenance.

In some embodiments, the stroke of the piston 1016, e.g., as indicated by arrows 1018, may also draw coolant back from the electrode, or gap in the event of a breach, through opening 1022 and into a reservoir 1030, e.g., as indicated by directional arrows 1032. For example, the reservoir 1024 can have a liquid volume capacity sufficient to evacuate all of the coolant from the passageways(s), or a capacity sufficient to ensure evacuation of only the electrode. In some embodiments, liquid from the reservoir 1030 may be pushed back into the passageways by movement of the piston 1016, e.g., once the breach has been repaired or scheduled maintenance completed.

It will be appreciated that the drawback valve 1000 may be configured as a normally biased non-return valve in the outflow path of an electrode to close upon a breach or gap at the electrode. In this case, for example, the flow of coolant may keep the valve element in the open position. A breach or gap in the path may reduce pressure of the fluid allowing the spring and/or fluid backpressure to push the valve element 1002 into the closed position in conjunction with actuation of the piston for drawback of coolant.

Figure 11:
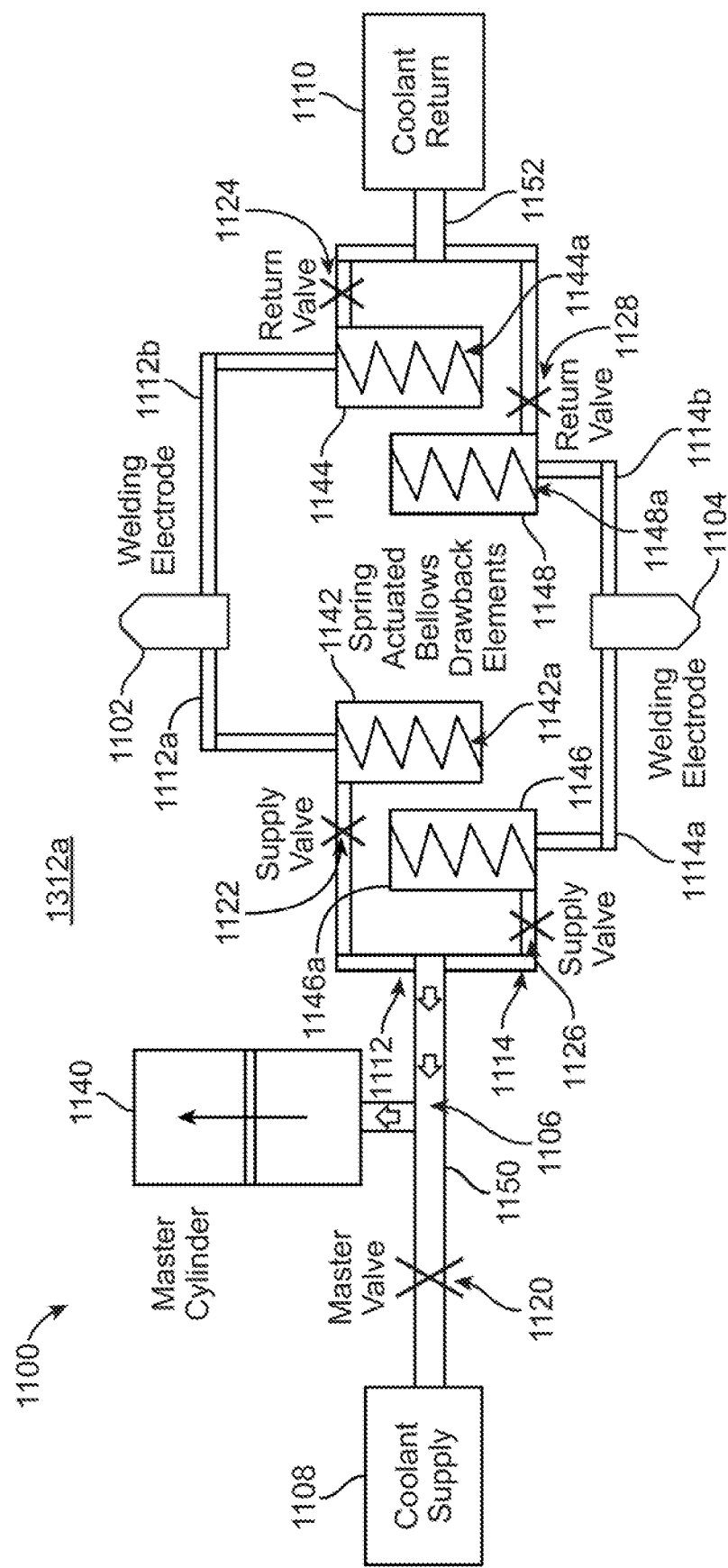
FIG. 11 is a diagram of a fluid flow system for cooling welding electrodes including independent fluid shutoff and drawback for preventing or reducing liquid loss according to some embodiments.

FIG. 11 is a diagram of a fluid flow system 1100 for cooling welding electrodes 1102, 1104 including independent fluid shutoff and drawback for preventing or reducing liquid loss, e.g., during system 1100 maintenance.

It will be appreciated that some of the features of system 1100 may be the same or different from the corresponding features discussed above (e.g., welding electrodes 202, 204, shutoff valves 220, 222, or the like). Accordingly, drawback apparatus (or "drawback master") 1140 may have the same or similar configuration as drawback apparatus 340, and/or the valves 1120-1128 may have a same or similar configuration and/or operation as the valves 520-524 described above, although in other embodiments, the valves 1120-1128 may be included within respective drawback apparatus 1140 and/or drawback elements (or "drawback slaves") 1142-1148.

In FIG. 11, a coolant supply 1108 provides liquid coolant 1106 to paths 1112 and 1114, via supply path 1150, to cool welding electrodes 1102 and 1104, respectively. The coolant 1106 may then be received by a coolant return 1110 (where the coolant 1106, in some embodiments, may be recirculated) via a return path 1152. The system 1100 may include a "master" valve 1120 that may shut off flow of the coolant 1106 to the paths 1112, 1114 (e.g., if a gap or a break occurs in the path 1112 and/or 1114, or preceding the scheduled removal of an electrode 1102 and/or 1104). Similarly, some embodiments may include shutoff valves 1122 and 1124 that may shut off flow of the coolant 1106 along the path 1112 (e.g., if a gap or a break occurs in the path 1112, or preceding the planned removal of an electrode 1102). In some embodiments, the system 1100 may also include shutoff valves 1126 and 1128 that may shut off flow of the coolant 1106 along the path 1114. The drawback elements 1142 and 1144 may draw coolant 1106 into the drawback elements 1142 and 1144, respectively, if a gap or break forms in the path 1112. Similarly, the drawback elements 1146 and 1148 may draw coolant 1106 into the drawback elements 1146 and 1148, respectively, if there is a gap or break in the path 1114.

In some embodiments, shutoff valves 1122 and 1124 may isolate fluid path segments 1112a-b from the rest of the system 1100. The shutoff valves 1122 and/or 1124 may be controlled (e.g., electrically) or be mechanical. The shutoff valves 1122 and/or 1124 may be actuated or triggered to shut off fluid flow to and/or from the segment 1112a-b when the electrode 1102 is removed and/or in anticipation of electrode 1102 removal (e.g., for scheduled system 100 maintenance).

Similarly, in some embodiments, shutoff valves 1126 and 1128 may isolate fluid path segments 1114a-b from the rest of the system 1100. The shutoff valves 1126 and/or 1128 may be controlled (e.g., electrically) or be mechanical. The shutoff valves 1126 and/or 1128 may be actuated or triggered to shut off fluid flow to and/or from the segment 1114a-b when the electrode 1104 is removed and/or in anticipation of electrode 1102 removal (e.g., for scheduled system 100 maintenance).

In various embodiments, the drawback element 1142 may be disposed between a shutoff valve (e.g., shutoff valve 1122) and the electrode 1102. Similarly, the drawback element 1144 may be disposed between a shutoff valve (e.g., shutoff valve 1124) and the electrode 1102. The drawback element 1146 may be disposed between a shutoff valve (e.g., shutoff valve 1126) and the electrode 1104. The drawback element 1148 may be disposed between a shutoff valve (e.g., shutoff valve 1128) and electrode 1104.

In some embodiments, the drawback elements 1142-1148 may each comprise a suction force storage element (e.g., a spring-loaded bellows). For example, the drawback elements 1142-1148 may include a spring 1142a-1148a disposed within a chamber (or "housing"), and each drawback element 1142-1148 may be biased to draw coolant 1106 from a respective fluid path segment. For example, the drawback element 1142 may be biased to draw back liquid coolant 1106 from fluid path segment 1112a; the drawback element 1144 may be biased to draw back liquid coolant 1106 from fluid path segment 1112b; the drawback element 1146 may be biased to draw back liquid coolant 1106 from fluid path segment 1114a; and the drawback element 1148 may be biased to draw back liquid coolant 1106 from fluid path segment 1114b.

In some embodiments, the drawback apparatus 1140, which may be biased to empty liquid coolant 1106 from within the apparatus 1140 to the supply path 1150, may generate a suction force (e.g., by movement of a piston) which may be transferred to the drawback elements 1142-1148, e.g., via the liquid coolant 1106, thereby compressing the springs 1142a-1148a. Upon electrode 1102 and/or 1104 removal, the springs 1142a-1148a may expand, thereby generating a suction which may draw the liquid coolant 1106 away from a gap formed in the path 1112 and/or a gap formed in the path 1114, and into the chamber of the respective drawback elements 1142-1148.

Since the drawback elements 1142-1148 may be lighter and smaller than the drawback apparatus' described above (e.g., FIGS. 5 and 7), such a configuration may reduce an overall size and/or weight of the system elements that may be located directly on the welding apparatus relative to those described above (e.g., system 500 or system 700). Also, the master cylinder 1140 and associated system actuating element may be remotely located from the welding apparatus to further reduce size and/or weight on the welding apparatus In various embodiments, such as preceding a scheduled maintenance of the system 1100, the shutoff valve 1120 and the shutoff valves 1124 and 1128 may activate to block flow of coolant 1106 from the coolant supply 1108 and block flow and/or backflow of coolant 1106 to and/or from the coolant return 1110, respectively.

In some embodiments, the drawback apparatus 1140 and/or drawback elements 1142-1148 may not activate until the shutoff valve 1120, 1124 and 1128 have shut off flow of the coolant 1106. In some embodiments, the shutoff valves 1122 and 1126 may be closed after drawback elements 1142-1148 have been activated. Once active, the drawback elements 1142-1148 may draw fluid away from a gap or break in the liquid coolant paths 1112, 1114 by pulling coolant 1106 into a reservoir (e.g., a chamber within the drawback elements 1142-1148).

Once the gap or break is corrected, e.g., upon completion of maintenance, one or more of the shutoff valves 1120-1128 may be opened to allow flow of coolant 1106. In some embodiments, the drawback elements 1142-1148 may push the coolant 1106 from their respective reservoirs back into the paths 1112 and/or 1114.

It will be appreciated that although five valves 1120-1128, one drawback apparatus 1140, and four drawback elements 1142-1148 are shown here, other embodiments may include a greater or lesser number of such components. For example, fewer valves and/or draw back elements may be used if only one electrode is removed per maintenance cycle (i.e., only one electrode is detached at a given time). By way of a further example, using a master drawback apparatus for each liquid coolant path may allow the system 1100 to function without the master valve 1120.

It will further be appreciated that one or more actuators (e.g., as described herein) may be used to control operation of the drawback apparatus 1140, drawback elements 1142-1148, and/or valves 1120-1128. For example, as described above, one or more actuators may trigger operation of such components in preparation for a scheduled maintenance of the system 1100. In some embodiments, such one or more actuators may be remote actuators (e.g., located off of the welding apparatus).

Figure 12:
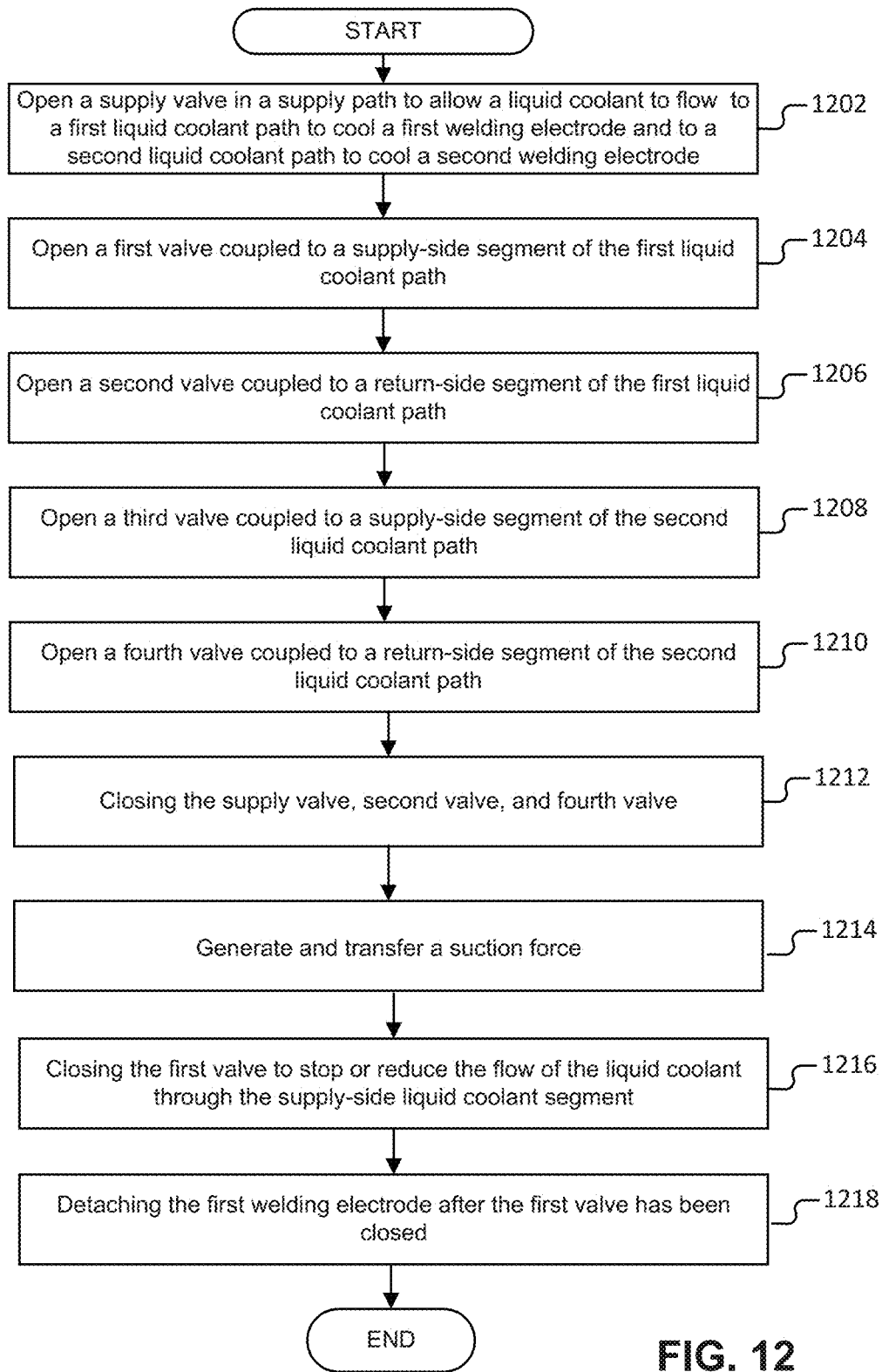
FIG. 12 is a flowchart illustrating an operation of a liquid cooling system (e.g., system 1100) according to some embodiments.

FIG. 12 is a flowchart illustrating an operation of a liquid cooling system (e.g., system 1100) according to some embodiments. It will be appreciated that although the steps 1202-1218 below are described in a specific order, the steps 1202-1218, in some embodiments, may also be performed in a different order. Each of the steps 1202-1218, in some embodiments, may also be performed sequentially, or serially, and/or in parallel with one or more of the other steps. In some embodiments, operation of the liquid cooling system may include a greater or lesser number of such steps.

In step 1202, a supply valve (e.g., supply valve 1120) is opened in a supply path (e.g., supply path 1150) to allow a liquid coolant (e.g., liquid coolant 1106) to flow through the supply path to a first electrode coolant path (e.g., electrode coolant path 1112) to cool a first welding electrode (e.g., electrode 1102) and to a second electrode coolant path (e.g., electrode coolant path 1114) to cool a second welding electrode (e.g., electrode 1104). In some embodiments, the first electrode coolant path has a first supply-side electrode coolant segment (e.g., segment 1112a) between the supply path and the first welding electrode, and a first return-side electrode coolant segment (e.g., segment 1112b) between the first welding electrode and a return path (e.g., return path 1152). Similarly, the second electrode coolant path may have a second supply-side electrode coolant segment (e.g., segment 1114a) between the supply path and the second welding electrode, and a second return-side electrode coolant segment (e.g., segment 1114b) between the second welding electrode and the return path. A drawback master (e.g., drawback apparatus 1140) may be coupled to the supply path between the supply valve and the first electrode coolant path, the drawback master being biased to empty the liquid coolant from the drawback master into the supply path.

In step 1204, a first valve (e.g., valve 1122) coupled in the first supply-side electrode coolant segment may be opened to allow the liquid coolant to flow from the supply path through the first supply-side electrode coolant segment to the first welding electrode. In some embodiments, the first supply-side electrode coolant segment may have a first drawback slave (e.g., drawback element 1142) between the first valve and the first welding electrode. The first drawback slave may be biased to draw the liquid coolant from the first supply-side electrode coolant segment.

In step 1206, a second valve (e.g., valve 1124) coupled in the first return-side electrode coolant segment may be opened to allow the liquid coolant to flow from the first welding electrode through the first return-side liquid coolant segment to the return path. In some embodiments, the first return-side liquid coolant segment may have a second drawback slave (e.g., drawback element 1144) between the first welding electrode and the second valve. The second drawback slave may be biased to draw the liquid coolant from the first return-side liquid coolant segment.

In step 1208, a third valve (e.g., valve 1126) coupled in the second supply-side liquid coolant segment may be opened to allow the liquid coolant to flow from the supply path through the second supply-side liquid coolant segment to the second welding electrode. In step 1210, a fourth valve (e.g., valve 11216) may be coupled in the second supply-side liquid coolant segment to allow the liquid coolant to flow from the second welding electrode to the return path.

In step 1212, the supply valve may be closed in order to stop or reduce the flow of the liquid coolant through the supply path. Similarly, the second valve may also be closed to stop or reduce the flow or backflow of the liquid coolant through the first return-side liquid coolant segment, and the fourth valve may be closed to stop or reduce the flow or backflow of the liquid coolant through the second return-side liquid coolant segment.

In step 1214, after the supply valve, second valve and fourth valve have been closed, the drawback master may exert a suction force sufficient to drawback the liquid coolant from the supply path, thereby transferring the suction force to each of the first drawback slave and the second drawback slave. For example, movement of a piston disposed within the master drawback may exert the suction force. Movement of the piston may be triggered, for example, immediately prior to the planned removal of the first electrode. In some embodiments, the transferred suction force causes the first drawback slave to discharge the liquid coolant therein into first supply-side liquid coolant segment, and the second drawback slave to discharge the liquid coolant therein into the first return-side liquid coolant segment.

In step 1216, after the drawback master has exerted the suction force, the first valve may be closed in order to stop or reduce flow of liquid coolant through the first supply-side liquid coolant segment. In some embodiments, a portion of the first supply-side liquid coolant segment between the first valve and the first welding electrode, and a portion of the first return-side liquid coolant segment between the first welding electrode and the second valve may be isolated from the supply path and the return path.

In step 1220, after the first valve has been closed, the first welding electrode may be at least partially detached, thereby causing the first drawback slave and the second drawback slave to exert the suction force transferred from the drawback master to draw the liquid coolant away from a gap formed when the first welding electrode is at least partially detached. For example, at least partially detaching the electrode may cause springs (e.g., spring 1142*a*, 1144*a*), compressed by the suction force exerted by the drawback master, disposed within the drawback elements to expand, thereby drawing the liquid coolant away from the gap.

Figure 13:
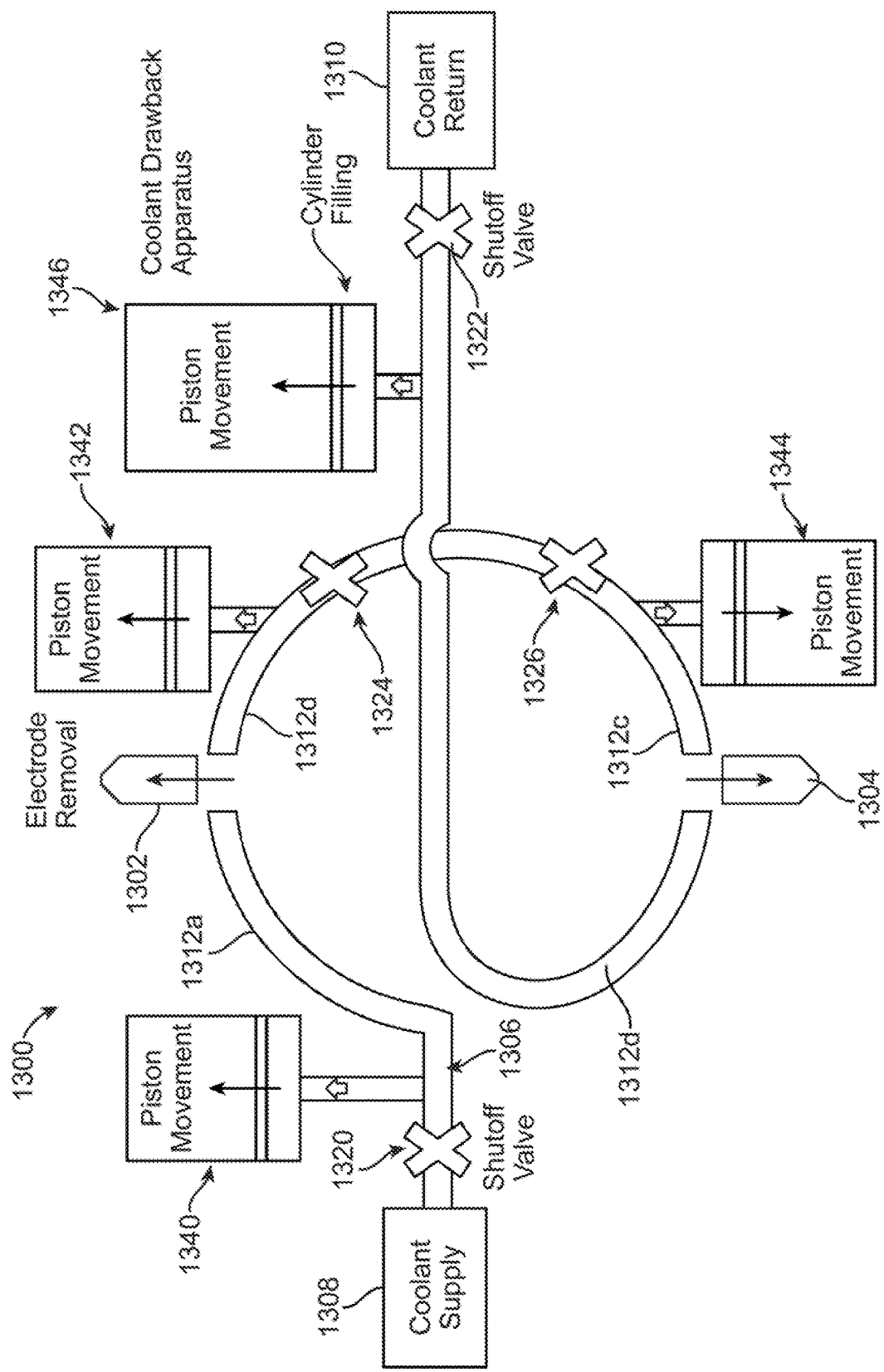
FIG. 13 is a diagram of a fluid flow system for cooling welding electrodes including independent fluid shutoff and drawback for individual fluid path segments of a single fluid path 1312 according to some embodiments.

FIG. 13 is a diagram of a fluid flow system 1300 for cooling welding electrodes 1302, 1304 including independent fluid shutoff and drawback for individual fluid path segments 1312*a-d* of a single fluid path 1312 according to some embodiments. In the illustrated embodiment, the valves 1320-1326 can each be a solenoid or pneumatically actuated valves, a no-return check valve, or otherwise. In some embodiments, coolant 1306 is provided to fluid path 1312 via coolant supply 1308, and coolant 1306 is returned from path 1312 via coolant return 1308. In some embodiments, coolant 1306 is provided to the path 1312 from the coolant supply 1308 via a supply line, and that the coolant 1306 may be returned to the coolant return 1308 via a return line.

It will be appreciated that the features of system 1300 may be the same or different from the corresponding features discussed herein (e.g., welding electrodes 202, 204, shutoff valves 220, 222, welding electrodes 702, 704, or the like).

In some embodiments, shutoff valves 1320-1326 may isolate segments 1312*a-d* from the rest of the system 1300 thereby shutting off fluid flow through the path 1312. The shutoff valves 1320-1326 may be controlled (e.g., electrically) or be mechanical. The shutoff valves 1320-1326 may be actuated or triggered to shut off fluid flow to and/or from the segments 1312*a-d* when the electrodes 1302, 1304 are removed or at least partially detached (e.g., for a scheduled maintenance or in response to a failure).

As mentioned above, system 1300 provides, in some embodiments, independent fluid 1306 removal (or "drawback") for each of the path segments 1312*a-d*. As shown, the drawback apparatus' 1340-1346 may each be positioned on a segment of the fluid path 1312.

More specifically, drawback apparatus 1340 is positioned on segment 1312*a*; drawback apparatus 1342 is positioned on segment 1312*b*; drawback apparatus 1344 is positioned on portion 1312*c*; and drawback apparatus 1346 is positioned on portion 1312*d*.

In the illustrated embodiment, each of the drawback apparatus' 1340-1346 may have the same configuration and/or operation as the drawback apparatus 340 discussed above. Thus, for example, each of the drawback apparatus' 1340-1346 may include a piston disposed within a chamber. In other embodiments, they can each have a different configuration and/or operation, e.g., such as the configuration and/or operation of drawback valve 800 or 1000, discussed herein.

In some embodiments, when one or both electrodes are detached and gaps are formed along path 1312, the shutoff valves 1320-1326 may engage to stop flow of coolant along the segments 1312*a-d*. One or more of the drawback apparatus' 1340-1346 may drawback fluid from the segments 1312*a-d*. Since the shutoff valves 1320-1326 do not allow for coolant to be brought to segments 1312*a-d*, the coolant may be drawn away from the gaps, e.g., drawback element 1340 may draw coolant back from the gap along segment 1312*a* and drawback element 1344 may draw coolant back from the gap along segment 1312*b*, and so forth.

It will be appreciated that although four shutoff valves 1320-1326 and four drawback apparatus' 1340-1346 are shown here, in other embodiments a greater or lesser number of such valves and/or drawback apparatus' may be used. Similarly, such valves and drawback apparatus may positioned elsewhere on the fluid path.

Figure 14A:
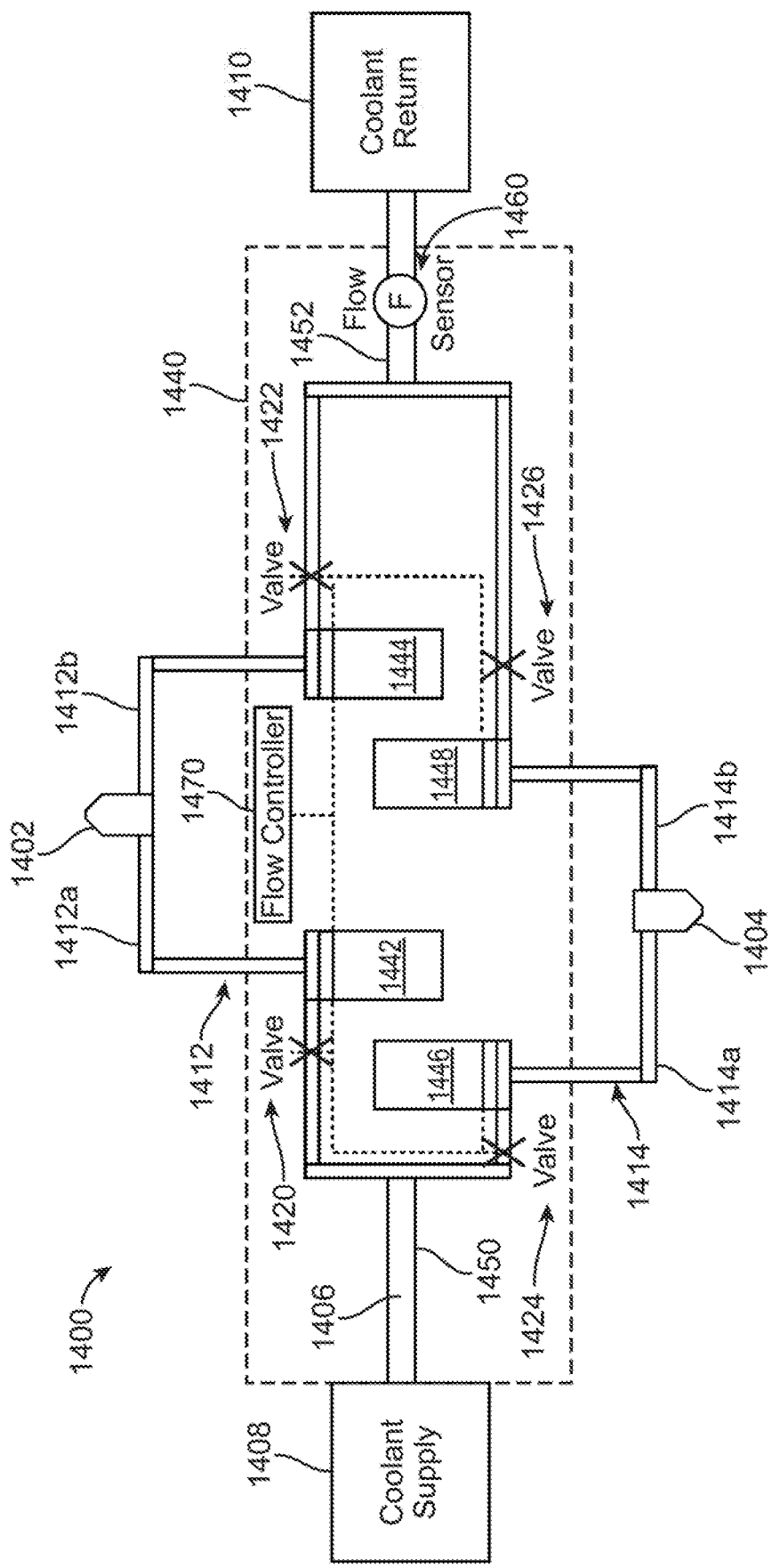
FIG. 14A is a diagram of a fluid flow system for cooling welding electrodes including a drawback valve apparatus and a return flow sensor according to some embodiments.

FIG. 14A is a diagram of a fluid flow system 1400 for cooling welding electrodes 1402, 1404 including a drawback valve apparatus 1440 and a flow sensor 1460 according to some embodiments. It will be appreciated that some of the features of system 1400 may be the same or different from the corresponding features discussed above (e.g., welding electrodes 202, 204, drawback elements 742-748, or the like). Accordingly, the drawback elements 1442-1448 may have a same or similar configuration and/or operation as the drawback elements 742-748 described above. Likewise, the valves 1420-1424 may also have a same or similar configuration and/or operation as the valves 720-724 described above, although in other embodiments, the valves 1420-1424 may be included within the drawback elements 1442-1448 (e.g., as described in drawback valve 800).

In FIG. 14A, coolant supply 1408 provides coolant 1406 along paths 1412 and 1414 to cool welding electrodes 1402 and 1404, respectively. The coolant 1406 may then be received by coolant return 1410 (where the coolant 1406, in some embodiments, may be recirculated). The system 1400 may include valves 1420 and 1422 that may adjust flow of the coolant 1406 along the path 1412 (e.g., if a gap or a break is detected in the path 1412, or preceding the planned removal of an electrode 1402). Similarly, the system 1400 may include valves 1424 and 1426 that may adjust flow of the coolant 1406 along the path 1414. Drawback elements 1442 and 1444 may draw coolant 1406 into the drawback elements 1442 and 1444, respectively, e.g., if a gap or break is detected in the path 712, or preceding a scheduled maintenance. Similarly, drawback elements 746 and 748 may draw coolant 1406 into the drawback elements 1446 and 1448, respectively, if there is a gap or break is detected in the path 714, or preceding a scheduled maintenance.

In the example depicted in FIG. 14A, both paths 1412 and 1414 receive coolant 1406 from the coolant supply 1408 along, at least partially, the same path (i.e., supply path 1450). Similarly, both paths 1412 and 1414 provide coolant 1406 to the coolant return 1410 along, at least partially, the same path (i.e., return path 1452).

In various embodiments, the drawback element 1442 may be disposed between a valve (e.g., valve 1420) and the electrode 1402. Similarly, the drawback element 1444 may be disposed between a valve (e.g., valve 1422) and the electrode 1402. The drawback element 1446 may be disposed between a valve (e.g., valve 1424) and the electrode 1404. The drawback element 1448 may be disposed between a valve (e.g., valve 1426) and electrode 1404.

In some embodiments, the valves 1420-1424 and drawback elements 1442-1448, and components thereof (e.g., piston, or the like) may be operated, or controlled, by a flow controller (or, "flow processor") 1470. Although the flow controller 1470 is shown here operating four valves 1422-1424 and drawback elements 1442-1444, in other embodiments the flow controller 1470 may operate a greater or lesser number of such valves and/or drawback elements. It will be appreciated that there may be any number of flow controllers and/or actuators. In some embodiments, the flow controller 1470 may be remote from the system 1400.

In the illustrated embodiment, the system 1400 may include one or more flow sensors 1460. As shown, the flow sensor 1460 may be positioned in the return path 1452, although other embodiments may include one or more other flow sensors, in addition to or instead of the flow sensor 1460. For example, other embodiments may include flow sensor(s) in the supply path 1450, first electrode path 1412, and/or second electrode path 1414. In the illustrated embodiment, the flow sensor 1460 may detect one or more flow rates of the liquid coolant 1406 flowing through the return path 1452 (e.g., 12 liters per minute). The flow sensor 1460 may detect, for example, low flow conditions in the return path 1452, which may indicate a malfunction in the system 1400, such as an inadequate supply of coolant, blockages in one or more of the paths, malfunctioning valves, lost electrodes, and so forth.

In some embodiments, the flow controller 1470 may detect malfunctions based on the sensor data (e.g., from sensor 1460) and one or more flow conditions. For example, the flow controller 1470, or other associated device (e.g., a server or other processor), may compare sensor 1460 data (e.g., flow rates) to previously collected sensor data in order to detect changes in flow rate, which may indicate a malfunction. Similarly, the flow controller may compare the sensor 1460 data to a threshold value. For example, if a detected flow rate falls below a predetermined rate, then it may indicate a malfunction. Example flow conditions may include:

Inadequate coolant supply: If a detected flow rate is lower than a predetermined supply threshold rate, then it may indicate an inadequate coolant supply. Similarly, if a flow rate is reduced by at least a predetermined amount, e.g., as indicated by one or more current flow sensor measurements and one or more previous flow sensor measurements, then it may indicate an inadequate coolant supply.

Blockage in a path (e.g., electrode path, supply path, return path, and so forth): If a detected flow rate is lower than a predetermined blockage threshold rate, then it may indicate that one or more of paths are blocked (or, "clogged"). Similarly, if a flow rate is reduced by at least a predetermined amount, e.g., as indicated by one or more current flow sensor measurements and one or more previous flow sensor measurements, then it may indicate that one or more of paths are blocked.

Valve and drawback element malfunction: If a detected flow rate is lower than a predetermined valve threshold rate, then it may indicate one or more malfunctioning valves and/or drawback elements. Similarly, if a flow rate is reduced by at least a predetermined amount, e.g., as indicated by one or more current flow sensor measurements and one or more previous flow sensor measurements, then it may indicate one or more malfunctioning valves.

Lost electrode: If a detected flow rate is lower than a predetermined electrode threshold rate, then it may indicate that one or more welding electrodes have at least partially detached. Similarly, if a flow rate is reduced by at least a predetermined amount, e.g., as indicated by one or more current flow sensor measurements and one or more previous flow sensor measurements, then it may indicate that one or more welding electrodes have at least partially detached.

In some embodiments, the flow controller 1470 may trigger one or more action responses based on the sensor data (e.g., detected by sensor 1460) and one or more flow conditions. Example action response may include:

Stop coolant flow: Close one or more valves to stop coolant flow through one or more of the paths. For example, the coolant flow may be stopped, or substantially stopped, in the event of a lost electrode.

Drawback liquid coolant: drawback liquid coolant from one or more of the paths with one or more associated drawback elements.

It will be appreciated that although a flow controller may detect malfunctions, in other embodiments another device may perform such functionality (e.g., a server or other processor) in addition to, or instead of, the flow controller 1470. In various embodiments, each valve 1420, 1422, 1424, and/or 1426 may share one or more flow controllers (or may each be associated with a separate flow controller). The flow controller 1470 may be coupled to any number of sensors (e.g., flow sensors, temperature sensors, discussed below, and so forth), e.g., for detecting and/or responding to malfunctions.

In some embodiments, upon detecting a malfunction, the flow controller 1470 may control a subset of valves and/or drawback elements. For example, if a malfunction in the path 1412 is detected (e.g., based on sensor data from sensor 1460), the flow controller 1470 may activate valves 1420 and/or 1422 to shut off coolant 1406 flow. If a malfunction in the path 1414 is detected (e.g., based on sensor data from sensor 1460), the flow controller 1470 may activate valves 1424 and 1426 to shut off coolant 1406 flow.

Figure 14B:
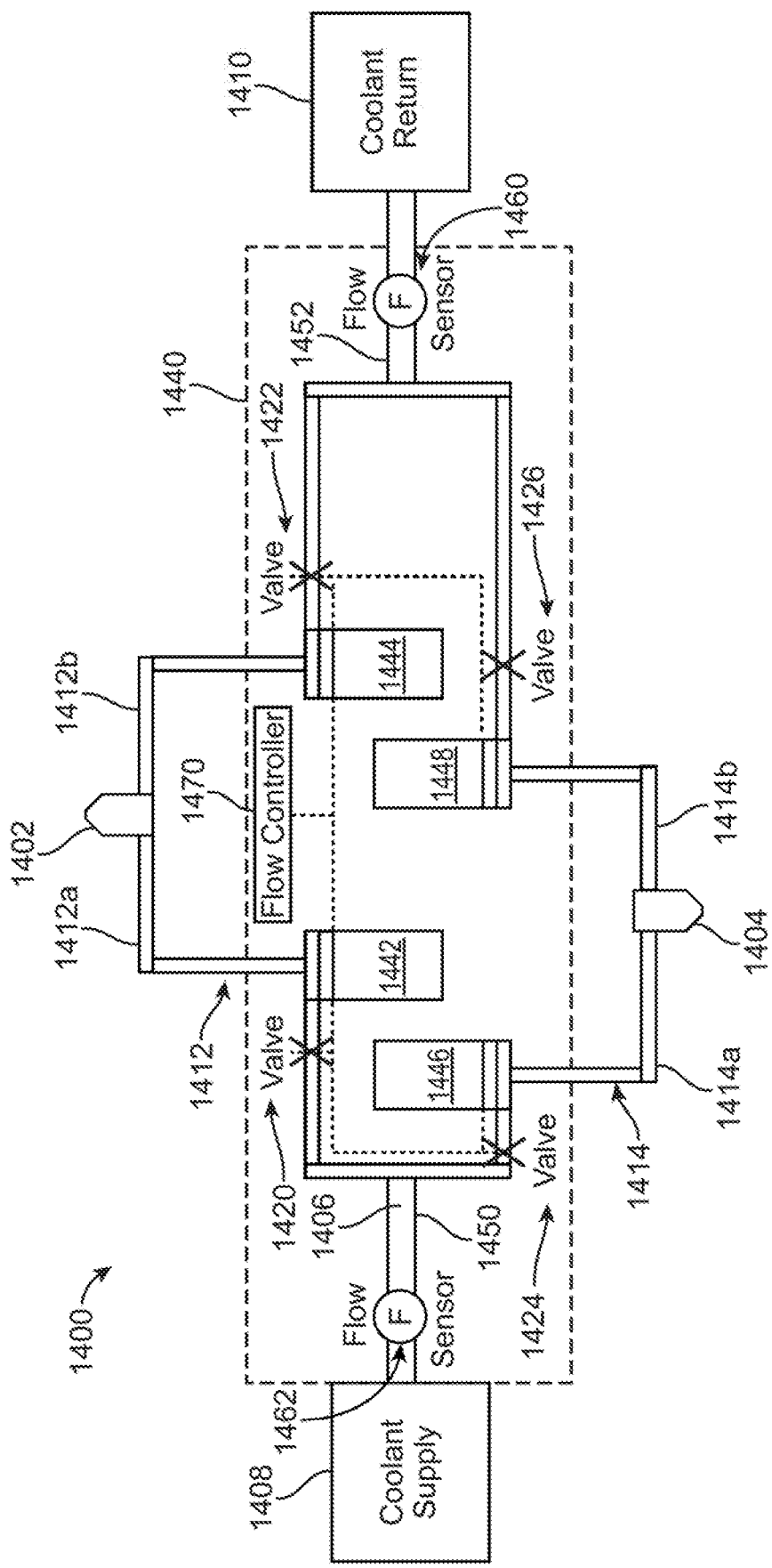
FIG. 14B is a diagram of a fluid flow system for cooling the welding electrodes including a drawback valve apparatus, a supply flow sensor and a return flow sensor according to some embodiments.

FIG. 14B is a diagram of the fluid flow system 1400 for cooling the welding electrodes 1402, 1404 including the drawback valve apparatus 1440, the flow sensor 1462 and flow sensor 1462 according to some embodiments.

Similar to flow sensor 1460, sensor 1462 may detect a flow rate of the liquid coolant 1406 in the supply path 1450. The sensor 1462, in combination with the sensor 1460, may provide more accurate detection of various malfunctions. For example, data from senor 1460 that may indicate a malfunction may be confirmed by corresponding data from sensor 1462.

In some embodiments, the flow controller 1470 may detect malfunctions based on sensor data from one or both of the flow sensors 1460 and 1462, and one or more flow conditions. Similar to the flow conditions discussed above, example flow conditions in various embodiments may include:

Inadequate coolant supply: If a detected flow rate in both the supply path (e.g., by sensor 1462) and the return path (e.g., by sensor 1460) is lower than a predetermined threshold rate, then it may indicate an inadequate coolant supply. Similarly, if a flow rate both in the supply path and return path is reduced by at least a predetermined amount, e.g., as indicated by one or more current flow sensor measurements (e.g., by sensors 1462 and/or 1460) and one or more previous flow sensor measurements (e.g., by sensor 1462 and/or 1460), then it may indicate an inadequate coolant supply.

Blockage in a path (e.g., electrode path, supply path, return path, and so forth): If a detected flow rate in both the supply path (e.g., by sensor 1462) and the return path (e.g., by sensor 1460) is lower a predetermined blockage threshold rate, then it may indicate that one or more of paths are blocked (or, "clogged"). Similarly, if a flow rate is reduced by at least a predetermined amount, e.g., as indicated by one or more current flow sensor measurements and one or more previous flow sensor measurements, then it may indicate that one or more of the paths are blocked.

Valve and/or drawback element malfunction: If a detected flow rate both in the supply path (e.g., by sensor 1462) and the return path (e.g., by sensor 1460) is lower than a predetermined valve threshold rate, then it may indicate one or more malfunctioning valves (e.g., valves 1420-1424) and/or drawback elements (e.g., drawback elements 1442-1448). Similarly, if a flow rate is reduced by at least a predetermined amount, e.g., as indicated by one or more current flow sensor measurements and one or more previous flow sensor measurements, then it may indicate one or more malfunctioning valves.

Lost electrode: If a detected flow rate in the return path (e.g., by sensor 1460) is lower than a detected flow rate in the supply path (e.g., by sensor 1462) by more than a predetermined blockage threshold rate, then it may indicate that one or more welding electrodes have at least partially detached. Similarly, if a difference in flow rates is increased by at least a predetermined amount, e.g., as indicated by one or more current flow sensor measurements and one or more previous flow sensor measurements, then it may indicate that one or more welding electrodes have at least partially detached.

In some embodiments, the flow controller 1470 may trigger one or more action responses (e.g., as described above) based on the sensor data (e.g., detected by sensor 1460) and one or more flow conditions.

Figure 14C:
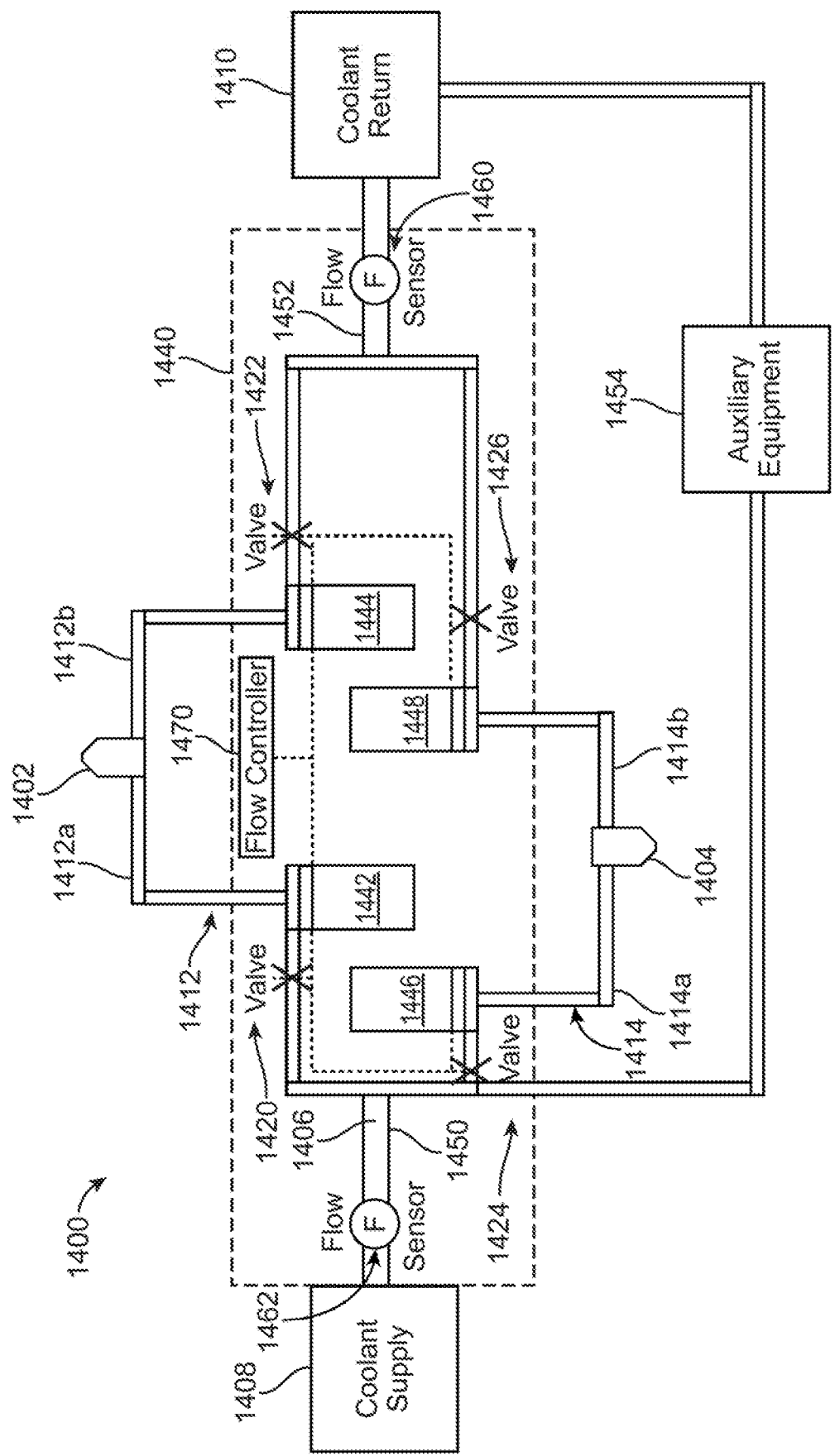
FIG. 14C is a diagram of a fluid flow system for cooling the welding electrodes 1402, 1404 including a drawback valve apparatus, supply and return flow sensors, and additional auxiliary equipment (e.g., a transformer) according to some embodiments.

FIG. 14C is a diagram of the fluid flow system 1400 for cooling the welding electrodes 1402, 1404 including the drawback valve apparatus 1440, the flow sensors 1460, 1462, and additional auxiliary equipment 1454 according to some embodiments.

In some embodiments, a flow rate on a plumbing tap for auxiliary equipment 1454 (e.g., a transformer) may be calculated based on a difference between flow rates detected by the sensors 1460 and 1462. This may be helpful, for example, to ensure that the auxiliary equipment 1454, which can often be expensive, is not damaged due to improper flow within the system 1400.

Figure 15:
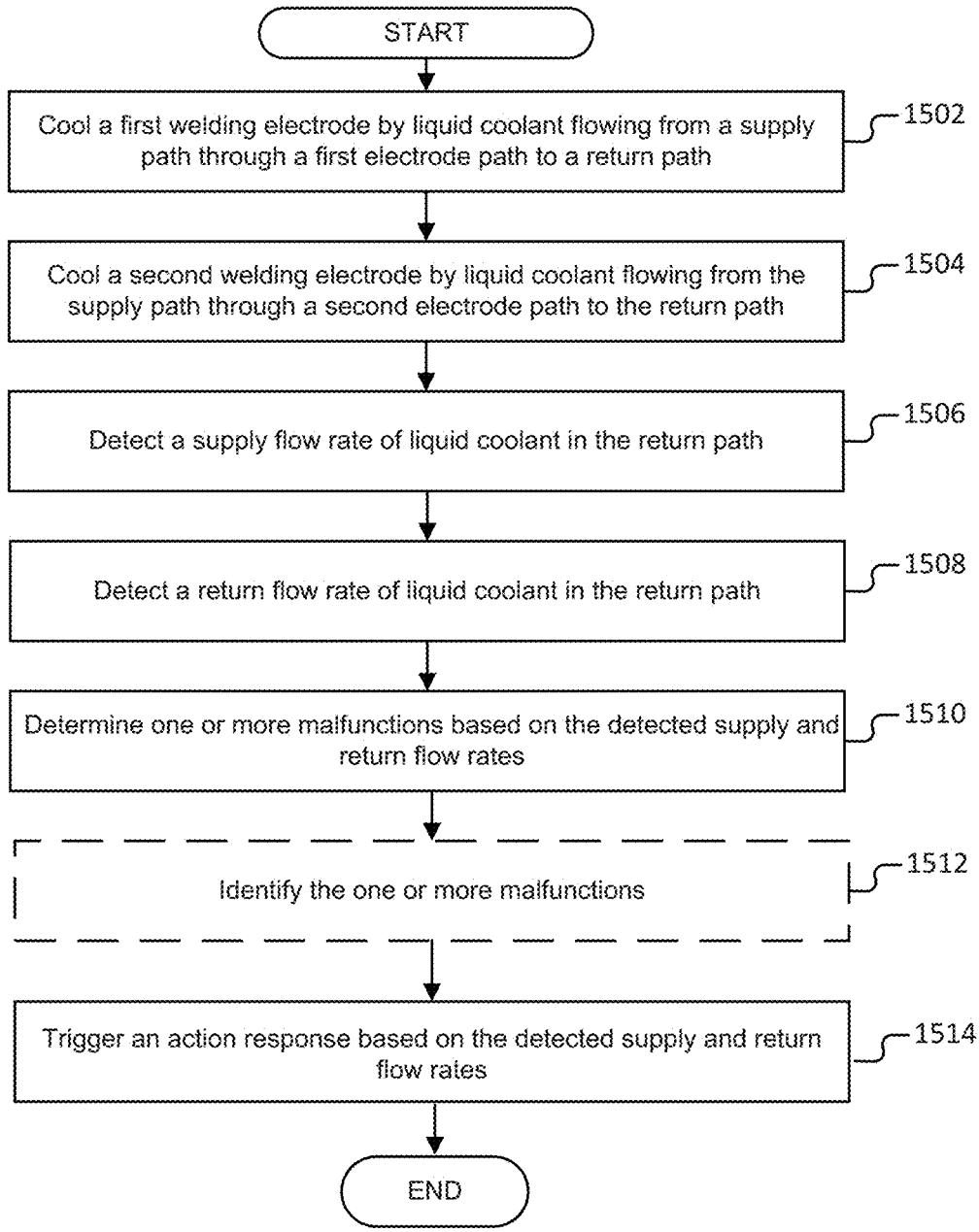
FIG. 15 is a flowchart illustrating an example operation of a liquid cooling system (e.g., as shown in FIGS. 14A-C) configured to detect and respond to malfunctions (e.g., at least one partially detached electrode, clogged paths, and so forth) according to some embodiments.

FIG. 15 is a flowchart illustrating an example operation of a liquid cooling system (e.g., liquid cooling system 1400) configured to detect and respond to malfunctions (e.g., at least one partially detached electrode, clogged paths, and so forth) according to some embodiments.

It will be appreciated that although the steps 1502-1514 below are described in a specific order, the steps 1502-1514 may also be performed in a different order. Each of the steps 1502-1514 may also be performed sequentially, or serially, and/or in parallel with one or more of the other steps 1502-1514. In some embodiments, detection and/or response to malfunctions may include a greater or lesser number of such steps.

In step 1502, a first welding electrode (e.g., welding electrode 1402) is cooled by liquid coolant (e.g., coolant 1406) flowing from a supply path (e.g., supply path 1450) through a first electrode path (e.g., electrode path 1412) to a return path (e.g., return path 1452). More specifically, a coolant supply (e.g., supply 1408) may supply the liquid coolant to the first electrode path via the supply path. Since the first welding electrode is included in the first electrode path, the first electrode is cooled by the flowing liquid coolant.

In step 1504, a second welding electrode (e.g., welding electrode 1404) is cooled by the liquid coolant flowing from the supply path through a second electrode path (e.g., electrode path 1414) to the return path. More specifically, the coolant supply may supply the liquid coolant to the second electrode path via the supply path. Since the second welding electrode is included in the second electrode path, the second electrode is cooled by the flowing liquid coolant.

In step 1506, a supply flow rate of the liquid coolant in the supply path may be detected by a first flow sensor (e.g., flow sensor 1462). In step 1508, a return flow rate of the liquid coolant in the return path may be detected by a second flow sensor (e.g., flow sensor 1460).

In step 1510, one or more malfunctions (e.g., a clogged electrode path, one or more at least partially detached electrodes, and so forth) may be determined based on the detected return flow rate and the detected supply rate. For example, the flow controller may compare the detected return flow rate and the detected supply flow rate, and if the detected return flow rate is less than the detected supply flow rate, then it may indicate a malfunction. Other flow conditions, e.g., as described above, may be used to determine a malfunction in the system.

In optional step 1512, the one or malfunctions may be identified (e.g., by flow controller) based on flow conditions, e.g., as described above. For example, if the detected return flow rate approaches zero positive flow, or a negative flow (i.e., backflow), then the malfunction may be identified as detached, or at least partially detached, welding electrodes.

In step 1514, an action response may be triggered (e.g., by the flow controller 1470) based on the detected supply flow rate and the detected return flow rate. For example, action responses may include, as described above, opening or closing valves (e.g., valves 1420-1420) to stop or reduce liquid coolant flow, drawing back liquid coolant from the electrode paths with one or more drawback elements (e.g., drawback element 1442-1448), and so forth.

Figure 16A:
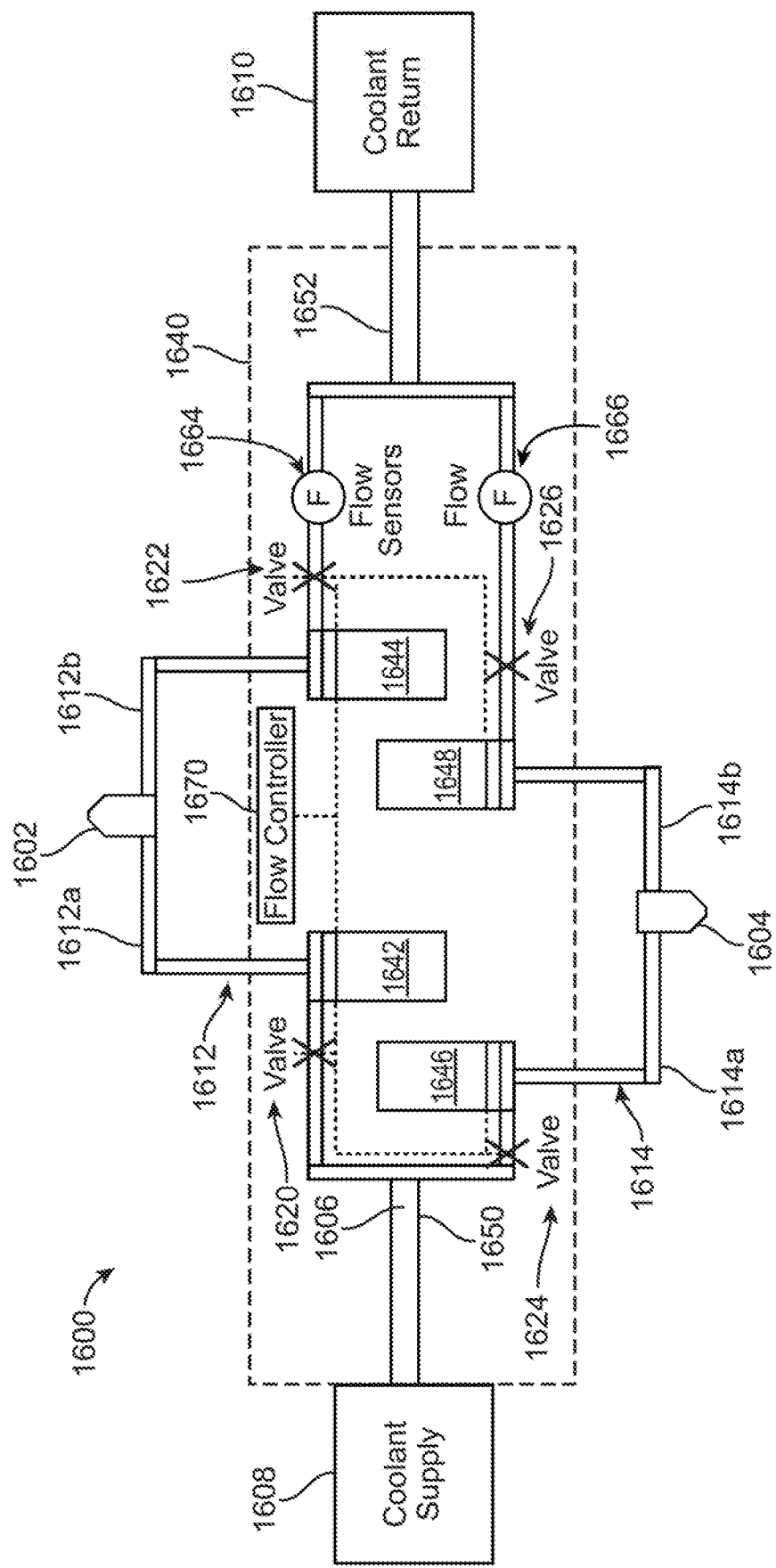
FIGS. 16A-B are diagrams of a fluid flow system for cooling welding electrodes including a drawback valve apparatus and flow sensors according to some embodiments.

FIG. 16A is a diagram of a fluid flow system 1600 for cooling welding electrodes 1602, 1604 including a drawback valve apparatus 1640 and flow sensors 1664, 1666 according to some embodiments. It will be appreciated that some of the features of system 1600 may be the same or different from the corresponding features discussed above (e.g., welding electrodes 1402, 1404, electrode paths 1412, 1414, or the like). Accordingly, for example, the drawback elements 1642-1648 and valves 1620-1626 may have a same or similar configuration and/or operation as the drawback elements 1442-1448 and valves 1420-1426 described above.

In some embodiments, the valves 1620-1624 may comprise proportional control valves which may adjust a flow rate of the liquid coolant flowing through their respective paths. For example, the valves 1620-1464 may stop or reduce the flow of liquid coolant by moving the valve towards a closed position, and/or increase the flow of liquid coolant by moving the valve towards an open position. It will be appreciated that, in some embodiments, the valves 1620-1624 may each independently move between be the closed position, the open position, and partially closed position(s) (or, partly open position(s)), e.g., in response to signaling from one or more flow controllers, actuators, and/or other control device(s).

In the illustrated embodiment, the electrode paths 1612, 1614 include flow sensors 1664 and 1666, respectively. Similar to sensors 1460, 1462, described above, the sensor 1664 may detect flow rates of the liquid coolant 1606 flowing through electrode path 1612 and the sensor 1666 may detect flow rates of the liquid coolant 1606 flowing through the electrode path 1614. Individual flow sensors for each electrode path may, for example, allow for more accurate detection and/or identification of malfunctions, and/or provide indication of the relative position of proportional control valves (e.g., valves 1620-1624) for feedback to a proportional flow controller(s) (e.g., flow controller 1670) to maintain a desired flow rate in each electrode path. For example, a sudden shift in flow rate on only sensor 1664 may indicate that the welding electrode 1602 may have detached, or at least partially detached. Similarly, a sudden shift in flow rate on only sensor 1666 may indicate that the welding electrode 1604 may have detached, or at least partially detached.

In some embodiments, more specifically, flow controller 1670 may detect malfunctions based on sensor data from one or both of the flow sensors 1664 and 1666, and one or more flow conditions. Similar to the flow conditions discussed above, example flow conditions in various embodiments may include:

Inadequate coolant supply: If a detected flow rate in both electrode paths (e.g., as detected by sensors 1664, 1666) are lower than a predetermined supply threshold rate, then it may indicate an inadequate coolant supply. Similarly, if a flow rate in both electrode paths is reduced by at least a predetermined amount, e.g., as indicated by one or more current flow sensor measurements and one or more previous flow sensor measurements, then it may indicate an inadequate coolant supply.

Blockage in a path (e.g., electrode path, supply path, return path, and so forth): If a detected flow rate in an electrode path (e.g., by sensor 1664 or 1666) is lower than a predetermined blockage threshold rate, then it may indicate a blockage in that path. Similarly, if a flow rate in an electrode path is reduced by at least a predetermined amount, e.g., as indicated by one or more current flow sensor measurements and one or more previous flow sensor measurements, then it may indicate a blockage in that path.

Valve and/or drawback element malfunction: If a detected flow rate in an electrode path (e.g., by sensor 1664 or 1666) is lower than a predetermined valve threshold rate, then it may indicate one or more malfunctioning valves (e.g., valves 1420-1424) and/or drawback elements (e.g., drawback elements 1442-1448) in that path. Similarly, if a flow rate in an electrode path is reduced by at least a predetermined amount, e.g., as indicated by one or more current flow sensor measurements and one or more previous flow sensor measurements, then it may indicate one or more malfunctioning valves and/or drawback elements in that path.

Lost electrode: If a detected flow rate in an electrode path (e.g., detected by sensor 1664 or 1666) is lower than a predetermined electrode threshold rate, then it may indicate that the welding electrode in that path has detached, or at least partially detached. Similarly, if a flow rate is reduced by at least a predetermined amount, e.g., as indicated by one or more current flow sensor measurements and one or more previous flow sensor measurements, then it may indicate that the welding electrode in that path has detached, or at least partially detached.

In some embodiments, the flow controller 1670 may trigger one or more action responses based on the sensor data (e.g., detected by sensor 1666 and/or 1666) and one or more flow conditions. Example action responses may include:

Stop coolant flow: Close one or more valves to stop coolant flow through one or more of the paths. For example, the coolant flow may be stopped, or substantially stopped, in the event of a lost electrode, or preceding a scheduled maintenance. (The decision to remove an electrode for maintenance probably won't be in response to data from a single sensor on the return. In the current state of the art it would even be an advanced concept for systems with the capability to measure both flow rate and temperature for individual electrodes.)

Reduce coolant flow: Adjust (e.g., partially close) one or more valves to reduce coolant flow through one or more of the paths.

Increase coolant flow: Adjust (e.g., open or partially open) one or more valves to increase coolant flow through one or more of the paths.

Drawback liquid coolant: drawback liquid coolant from one or more of the paths with one or more associated drawback elements.

In some embodiments, the flow controller 1670 may control drawback elements (e.g., drawback elements 1442-1448). For example, after the valves 1620 and 1622 shut off flow of coolant 1606, the flow controller may control the drawback elements 1642, 1644, 1646, and/or 1648. The flow controller may control a subset of the drawback elements. For example, after detecting a malfunction in the path 1612, the flow controller 1670 may control the drawback elements 1642 and/or 1644 to drawback coolant 1606 from the paths. Upon detection or a command that the malfunction has been corrected (e.g., the welding electrode 1602 has been replaced), then the flow controller 1670 may control the drawback elements 1642 and/or 1644 to push the coolant back to the paths. Similarly, after detecting a malfunction in the path 1614, the flow controller may control the drawback elements 1646 and/or 1648 to drawback coolant 1606 from the paths. Upon detection or a command that the malfunction has been corrected, then the flow controller 1670 may control the drawback elements 1446 and/or 1448 to push the coolant back to the paths.

Figure 16B:
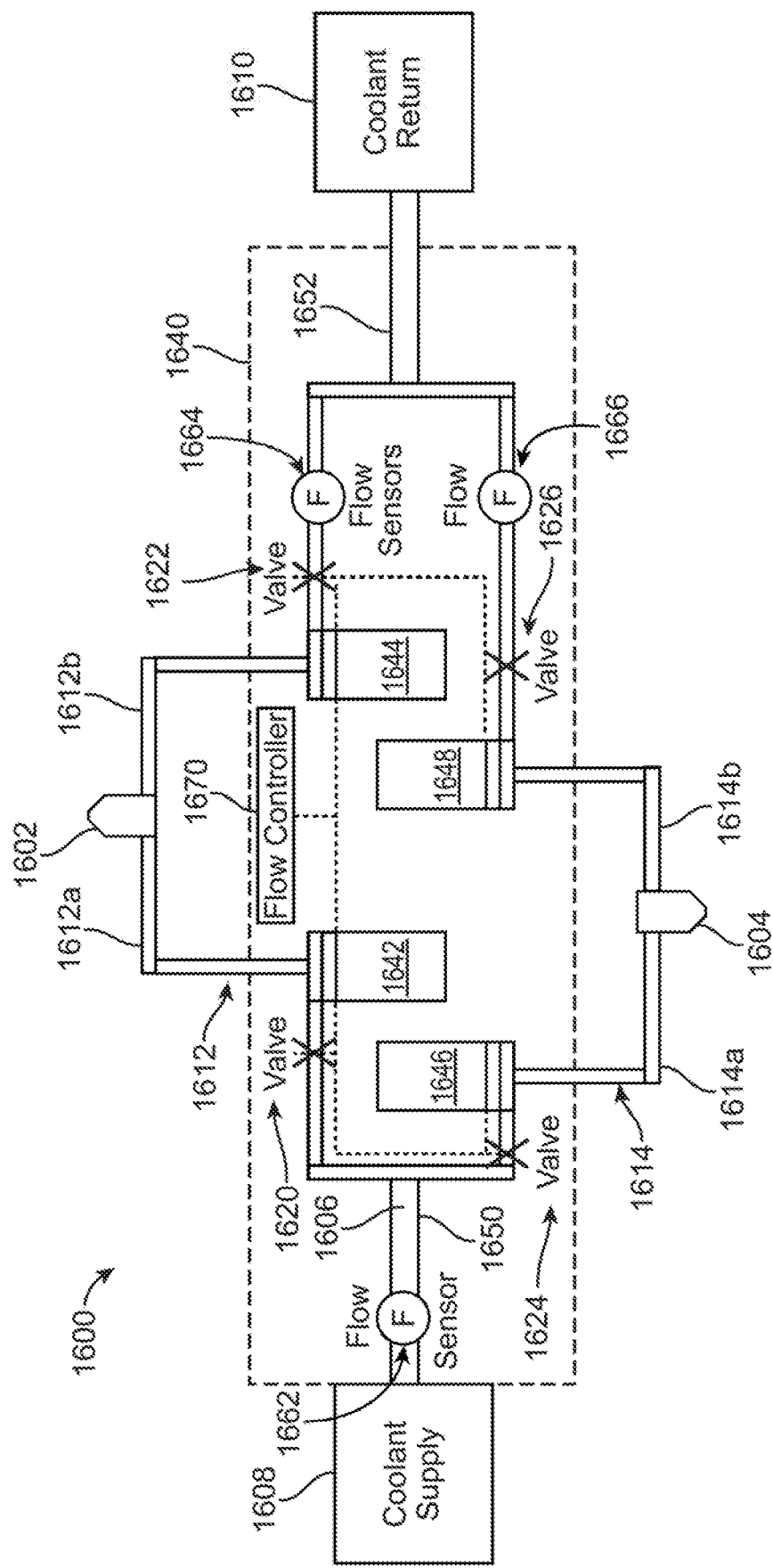

FIG. 16B is a diagram of the fluid flow system 1600 for cooling the welding electrodes 1602, 1604 including the drawback valve apparatus 1640 and flow sensor 1662-1666 according to some embodiments.

In some embodiments, the supply path 1650 may include flow sensor 1662. The additional sensor 1662 may provide, for example, more accurate detection and/or identification of system malfunctions. Similar to sensors 1664, 1666, the flow sensor 1662 may detect flow rates of the liquid coolant 1606 in the supply path 1650.

In some embodiments, more specifically, the flow controller 1670 may detect and/or identify malfunctions based on sensor data from some or all of the flow sensors 1662-1666, and one or more flow conditions. For example, if the flow rate detected by a sensor in either electrode path decreases in conjunction with an increase in flow rate detected by the sensor in the supply path, then it may indicate a malfunction, e.g., the welding electrode in that path has detached, or least partially detached. Other example flow conditions are described herein.

In some embodiments, the flow controller 1670 may trigger one or more action responses (e.g., as described above) based on the sensor data and/or one or more flow conditions.

Figure 17:
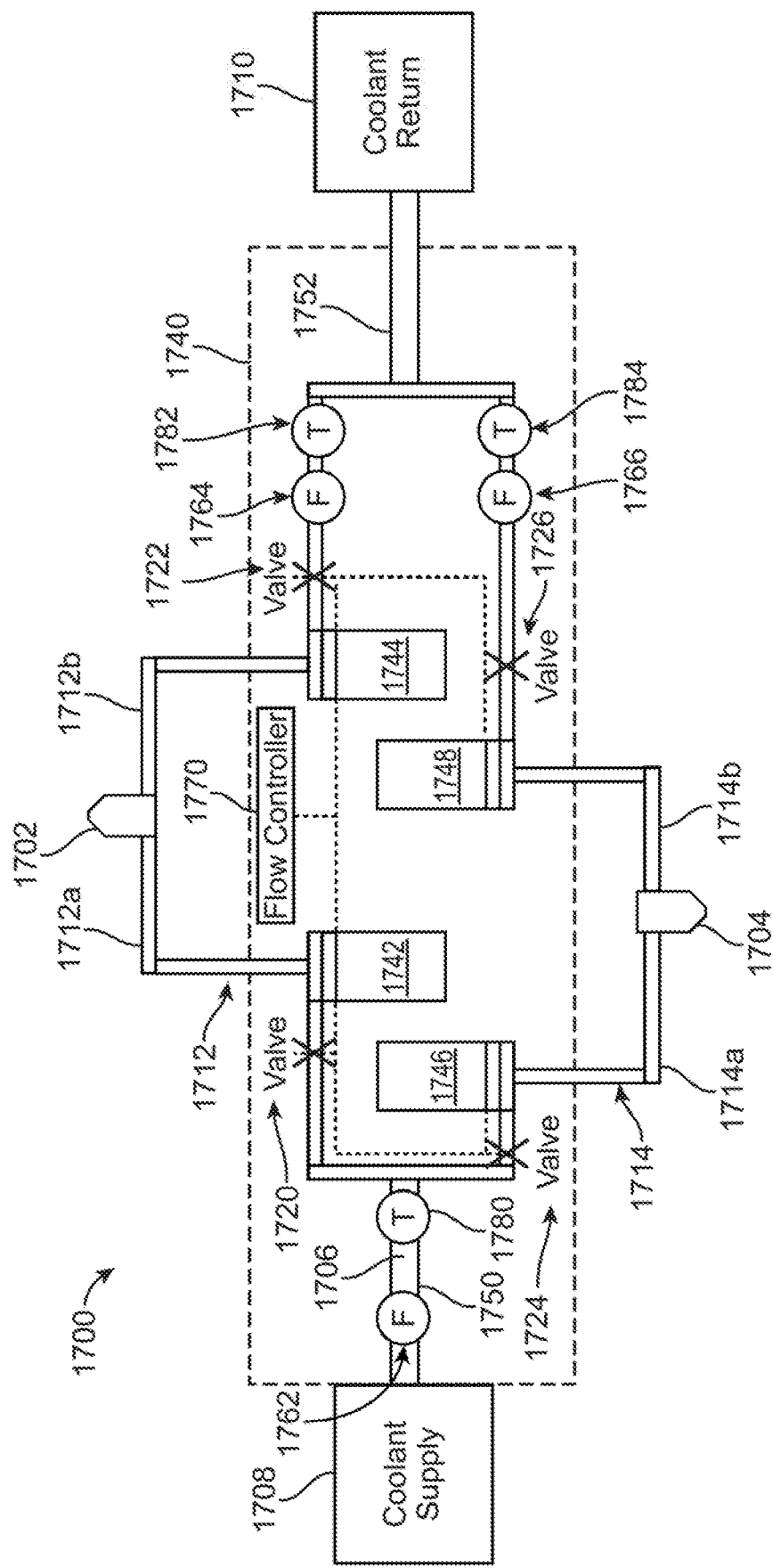
FIG. 17 is a diagram of a fluid flow system for cooling welding electrodes including a drawback valve apparatus, flow sensors, and temperature sensors according to some embodiments.

FIG. 17 is a diagram of a fluid flow system 1700 for cooling welding electrodes 1702, 1704 including a drawback valve apparatus 1740, flow sensors 1762-1766, and temperature sensors 1780-1784 according to some embodiments. It will be appreciated that some of the features of system 1700 may be the same or different from the corresponding features discussed above (e.g., welding electrodes 1402, 1404, electrode paths 1412, 1414, flow sensors 1462-1466, or the like). Accordingly, for example, the flow sensors 1762-1766, drawback elements 1742-1748 and valves 1720-1726 may have a same or similar configuration and/or operation as the flow sensors 1462-1466, drawback elements 1442-1448 and valves 1420-1426 described above.

In some embodiments, the supply path 1750 may include flow sensor 1762 and temperature sensor 1780. Similarly, the electrode paths 1712, 1714 may include flow sensors 1764, 1766, respectively, and temperature sensors 1782, 1784, respectively. Although three flow sensors and three temperature sensors are shown here, it will be appreciated that this is for illustrative purposes only, and other embodiments may have a greater or lesser number of such flow and/or temperature sensors.

In some embodiments, the temperature sensors 1780-1784 may detect a temperature of the liquid coolant 1706 flowing through their respective path. This may help, for example, to maintain a predetermined temperature of the liquid coolant 1706, e.g., an optimal differential temperature for coolant entering and exiting the electrodes 1702, 1704, and/or preventing damage to system 1700 components by detection differential temperatures above a predetermined threshold. In various embodiments, by combining the flow sensors 1762 1766 with the temperature sensors 1780-1784, the flow controller 1770 may be able to determine a thermal transfer rate based on the detected temperature(s) and flow rate(s), which may, for example, help predict system failures (e.g., an electrode failure) or optimize welding conditions, i.e., adjusting welding electrode current and/or cycle time.

In various embodiments, the flow controller 1770 may trigger one or more action responses based on the measured temperature and/or flow sensor data, and one or more flow conditions. Example flow conditions may include:

Thermal transfer rate: If the thermal transfer rate exceeds a thermal transfer threshold value, then it may indicate either an existing malfunction in the system, or a predicted malfunction (e.g., a welding electrode failure because the welding electrode may be operating at excessive temperatures). Similarly, if a thermal transfer rate changes (e.g., increased) by at least a predetermined amount, e.g., as indicated by one or more current thermal transfer rates and one or more previous thermal transfer rates, then it may indicate either an existing malfunction in the system, or a predicted malfunction.

Liquid Coolant Temperature: If a detected temperature (e.g., an absolute temperature or a differential temperature) of liquid coolant flowing through a path exceeds a threshold temperature, then it may indicate an existing malfunction, or a predicted malfunction. Similarly, if a detected temperature increases or decreases by at least a predetermined amount, e.g., as indicated by one or more current temperatures and one or more previous temperatures, then it may indicate either an existing malfunction in the system, or a predicted malfunction.

In some embodiments, the flow controller 1770 may trigger an action response based on the detected sensor data and/or flow condition(s). Example action responses may include adjusting the temperature to a predetermined threshold, e.g., by lowering a temperature at the supply 1708, adjusting valves 1720-1724 to affect flow rate(s) of the liquid coolant 1706, and so forth. Additional action responses are described above (e.g., drawing back liquid coolant).

Figure 18:
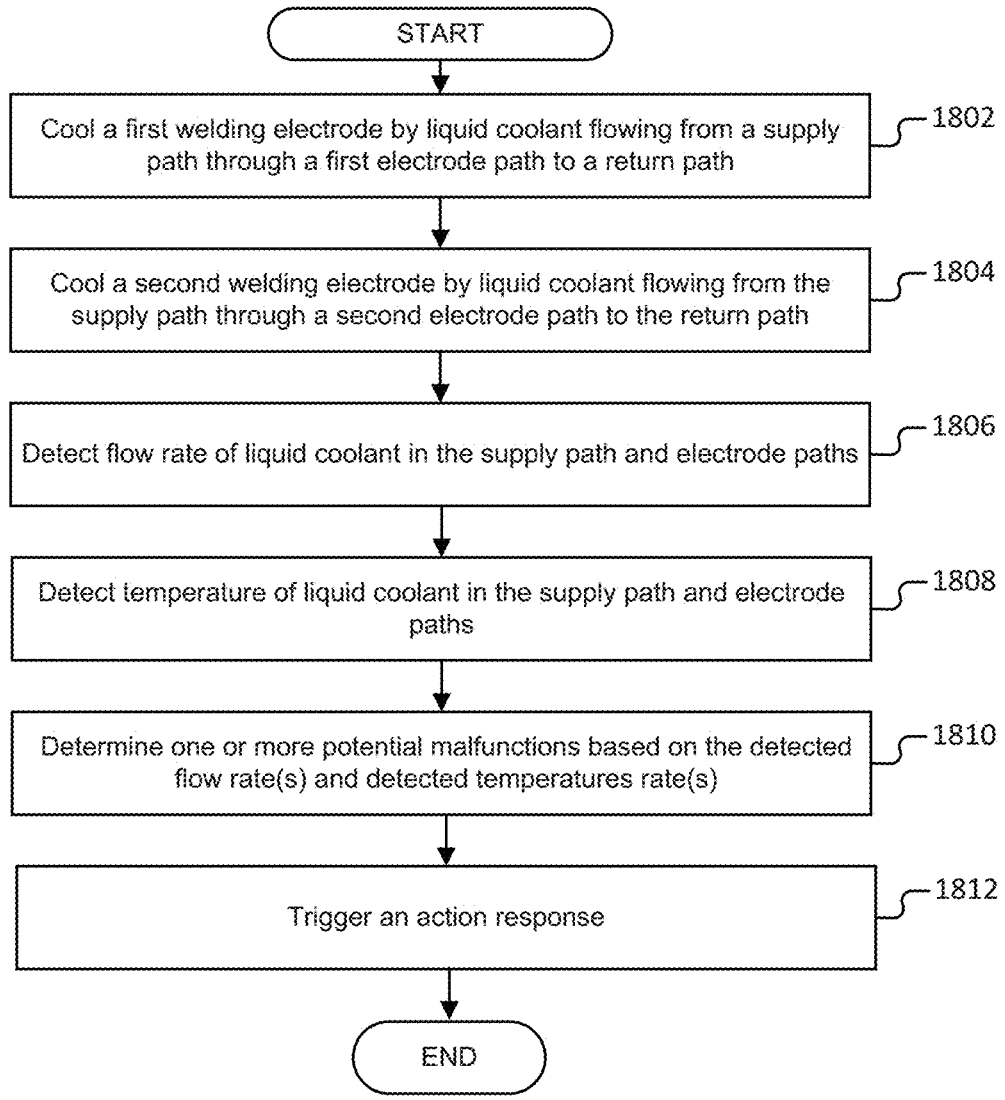
FIG. 18 is a flowchart illustrating an example operation of a liquid cooling system (e.g., as shown in FIG. 17) including flow sensors and temperature sensors according to some embodiments.

FIG. 18 is a flowchart illustrating an example operation of a liquid cooling system (e.g., liquid cooling system 1700) including flow sensors (e.g., flow sensors 1762-1766) and temperature sensors (e.g., temperature sensor 1780-1784) according to some embodiments.

It will be appreciated that although the steps 1802-1812 below are described in a specific order, the steps 1802-1812 may also be performed in a different order. Each of the steps 1802-1812 may also be performed sequentially, or serially, and/or in parallel with one or more of the other steps 1802-1812. In some embodiments, a greater or lesser number of such steps may be included.

In step 1802, a first welding electrode (e.g., welding electrode 1702) is cooled by liquid coolant (e.g., coolant 1706) flowing from a supply path (e.g., supply path 1750) through a first electrode path (e.g., electrode path 1712) to a return path (e.g., return path 1752). More specifically, a coolant supply (e.g., supply 1708) may supply the liquid coolant to the first electrode path via the supply path. Since the first welding electrode is included in the first electrode path, the first electrode is cooled by the flowing liquid coolant.

In step 1804, a second welding electrode (e.g., welding electrode 1704) is cooled by the liquid coolant flowing from the supply path through a second electrode path (e.g., electrode path 1714) to the return path. More specifically, the coolant supply may supply the liquid coolant to the second electrode path via the supply path. Since the second welding electrode is included in the second electrode path, the second electrode is cooled by the flowing liquid coolant.

In step 1806, a first flow rate of the liquid coolant in the supply path may be detected by a first flow sensor (e.g., flow sensor 1762). Similarly, a second flow rate of the liquid coolant in the first electrode path may be detected by a second flow sensor (e.g., flow sensor 1764), and a third flow rate of the liquid coolant in the second electrode path may be detected by a third flow sensor (e.g., flow sensor 1766).

In step 1808, a first temperature of the liquid coolant in the supply path may be detected by a first temperature sensor (e.g., flow sensor 1780). Similarly, a second temperature of the liquid coolant in the first electrode path may be detected by a second temperature sensor (e.g., temperature 1782), and a third temperature of the liquid coolant in the second electrode path may be detected by a third temperature sensor (e.g., temperature sensor 1784).

In step 810, one or more potential malfunctions may be determined (e.g., by flow controller 1770) based on some or all of the detected temperature and/or detected flow rates. For example, the flow controller may calculate a thermal transfer rate based on the detected temperatures and flow rates. The flow controller may then compare the thermal transfer rate to a threshold transfer rate, and if it exceeds the threshold, then the flow controller may predict a malfunction (e.g., an electrode failure). Similarly, the flow controller may compare a current thermal transfer rate with a previous thermal transfer rate, and if the difference exceeds a predetermined amount, the flow controller may predict a malfunction.

In step 1812, one or more action responses may be triggered (e.g., by the flow controller) based on the detected sensor data and/or potential malfunctions. For example, the flow controller may close one or more valves (e.g., valves 1720-1726) in order to stop flow of coolant through the electrode paths, and/or drawback liquid coolant from the electrode paths (e.g., via drawback elements 1742-1748).

It will be appreciated that an example number of flow sensors and temperature sensors are shown and described herein, and other embodiments may include a greater or lesser number of such sensors. For example, one or more flow sensors and/or temperature sensors may be included on each of the supply path, return path, first electrode path and/or second electrode path.

It will further be appreciated, as discussed in the embodiments above, that the electrodes discussed herein may be at least partially detach for a variety reasons. For example, one or more electrodes may be detached in preparation for a scheduled maintenance, or in response to a failure of one or more electrodes.

The present invention(s) are described above with reference to example embodiments. It will be apparent to those skilled in the art that various modifications may be made and other embodiments can be used without departing from the broader scope of the present invention(s). Therefore, these and other variations upon the example embodiments are intended to be covered by the present invention(s).

The invention claimed is:

1. A liquid cooling system for cooling one or more welding electrodes in a welding apparatus, the system comprising:
    a liquid coolant supply path;
    a liquid coolant return path;
    one or more electrode paths between the supply path and the return path, each electrode path configured to cool a corresponding electrode by flow of a coolant through the electrode path;
        the electrode path having an electrode inlet valve between the supply path and the electrode to stop or substantially reduce the flow of the coolant through the electrode path;
        the electrode path having an electrode outlet valve between the electrode and the return path to stop or substantially reduce backflow of the coolant through the electrode path;
        the electrode path having one or more electrode coolant drawback apparatuses coupled between the electrode inlet valve and the electrode outlet valve, the electrode coolant drawback apparatus being actuated by a spring and biased to a coolant-filled state when the spring is relaxed;
    a supply valve in the supply path configured to stop or substantially reduce flow of the coolant through the supply path to the electrode path; and
    a coolant drawback apparatus coupled in the supply path between the supply valve and the electrode path, configured to exert a suction force sufficient to draw the coolant back through the electrode inlet valve from the electrode coolant drawback apparatus after the supply valve and the electrode outlet valve have been closed, to thereby transfer the suction force exerted by the coolant drawback apparatus to the electrode coolant drawback apparatus, whereby the coolant in the electrode coolant drawback apparatus is discharged and the spring is energized to exert a stored suction force, and subsequent closure of the electrode inlet valve isolates the stored suction force in the electrode path.

2. The system of claim 1, wherein the coolant drawback apparatus includes a chamber defining available space for the coolant.

3. The system of claim 2, wherein the coolant drawback apparatus includes a piston or bellows to reduce or increase the available space for the coolant in the chamber.

4. The system of claim 1, wherein the electrode coolant drawback apparatus includes a chamber defining available space for the coolant.

5. The system of claim 4, wherein the electrode coolant drawback apparatus includes a piston or bellows biased to increase the available space for the coolant in the chamber when the spring is relaxed, and is configured to decrease the available space by movement of the piston or bellows caused by the suction force of the coolant drawback apparatus, whereby the coolant is discharged and the spring is energized.

6. The system of claim 1, wherein the energizing the spring comprises closing the electrode inlet valve to stop or substantially reduce the flow of the coolant through the electrode path.

7. The system of claim 6, wherein establishment of a positive coolant pressure in the supply path opens the electrode inlet valve.

8. The system of claim 7, wherein opening the supply valve or discharging the coolant from the coolant drawback apparatus establishes the positive coolant pressure.

9. The system of claim 1, wherein the electrode outlet valve is a non-return check valve.

* * * * *